(12) United States Patent
Ma et al.

(10) Patent No.: US 12,199,102 B2
(45) Date of Patent: Jan. 14, 2025

(54) ISOLATION STRUCTURE FOR SEPARATING DIFFERENT TRANSISTOR REGIONS ON THE SAME SEMICONDUCTOR DIE

(71) Applicant: Infineon Technologies Austria AG, Villach (AT)

(72) Inventors: Ling Ma, Redondo Beach, CA (US); Robert Haase, San Pedro, CA (US); Timothy Henson, Mount Shasta, CA (US)

(73) Assignee: Infineon Technologies Austria AG, Villach (AT)

( * ) Notice: Subject to any disclaimer, the term of this patent is extended or adjusted under 35 U.S.C. 154(b) by 399 days.

(21) Appl. No.: 17/721,397

(22) Filed: Apr. 15, 2022

(65) Prior Publication Data

US 2023/0335560 A1    Oct. 19, 2023

(51) Int. Cl.
*H01L 27/12* (2006.01)
*H01L 21/76* (2006.01)
*H01L 21/762* (2006.01)
*H01L 21/765* (2006.01)
*H01L 21/84* (2006.01)
(Continued)

(52) U.S. Cl.
CPC ...... *H01L 27/1207* (2013.01); *H01L 21/7602* (2013.01); *H01L 21/76267* (2013.01); *H01L 21/765* (2013.01); *H01L 21/84* (2013.01); *H01L 29/1608* (2013.01); *H01L 29/407* (2013.01); *H01L 29/42364* (2013.01); *H01L 29/7813* (2013.01)

(58) Field of Classification Search
CPC .................................................. H01L 27/7602
See application file for complete search history.

(56) References Cited

U.S. PATENT DOCUMENTS 10,510,747 B1    12/2019  Qiao et al.
2005/0167744 A1   8/2005  Yilmaz
(Continued)

OTHER PUBLICATIONS

Ohno, T., et al., "An Intelligent Power IC with Double Buried-Oxide Layers Formed by SIMOX Technology", IEEE Transactions on Electron Devices, vol. 40, No. 11, Nov. 1993, pp. 2074-2079.
(Continued)

*Primary Examiner* — Mounir S Amer
(74) *Attorney, Agent, or Firm* — Murphy, Bilak & Homiller, PLLC

(57) ABSTRACT

A semiconductor device includes: a semiconductor substrate; an epitaxial layer or layer stack on the semiconductor substrate; a plurality of transistor cells of a first type formed in a first region of the epitaxial layer or layer stack and electrically coupled in parallel to form a vertical power transistor; a plurality of transistor cells of a second type different than the first type and formed in a second region of the epitaxial layer or layer stack; and an isolation structure that laterally and vertically delimits the second region of the epitaxial layer or layer stack. Sidewalls and a bottom of the isolation structure include a dielectric material that electrically isolates the plurality of transistor cells of the second type from the plurality of transistor cells of the first type in the epitaxial layer or layer stack. Methods of producing the semiconductor device are also described.

16 Claims, 49 Drawing Sheets

(51) Int. Cl.
*H01L 29/16* (2006.01)
*H01L 29/40* (2006.01)
*H01L 29/423* (2006.01)
*H01L 29/78* (2006.01)

(56) References Cited

U.S. PATENT DOCUMENTS

| | | |
|---|---|---|
| 2014/0084362 A1 | 3/2014 | Schloesser et al. |
| 2014/0264569 A1* | 9/2014 | Yedinak ............ H01L 21/02104 |
| | | 257/330 |
| 2016/0268423 A1 | 9/2016 | Koepp et al. |
| 2017/0250255 A1* | 8/2017 | Siemieniec ........... H01L 29/407 |
| 2017/0271446 A1* | 9/2017 | Joshi ....................... H01L 29/78 |
| 2021/0074669 A1* | 3/2021 | Tu ............................ H01L 24/73 |
| 2021/0074699 A1 | 3/2021 | Qiao et al. |

OTHER PUBLICATIONS

Weyers, J., et al., "A CMOS Compatible Smart Power Process with Complete Dielectric Isolation", Proceedings of the 7th European Conference on Power Electronics and Applications, Trondhem, Norway. vol. 1, Sep. 8, 1997, pp. 1.308-1.313.

* cited by examiner

ISOLATION STRUCTURE FOR SEPARATING DIFFERENT TRANSISTOR REGIONS ON THE SAME SEMICONDUCTOR DIE

BACKGROUND

For many circuit applications that incorporate different device types, efficiency (e.g., power, performance, etc.) could be improved by monolithically integrating the different device types on the same semiconductor die. For example, to further improve the conversion efficiency of a buck converter and support higher switching frequency, gate driver components for the buck converter could be moved closer to the main power transistor. The main power transistor of a buck converter is often a vertical power MOSFET (metal-oxide-semiconductor field-effect transistor). Vertical power MOSFETs are vertically conducting devices which have a significant advantage over lateral power MOSFETs due to the high current capability and ruggedness offered by vertical power MOSFETs. However, the gate driver components for a buck converter are typically implemented using lower power lateral transistors which are difficult to monolithically integrate with vertical power MOSFETs on the same semiconductor die. More generally, it is challenging to monolithically integrate different device types on the same semiconductor die.

Thus, there is a need for an approach that provides for the monolithic integration of different device types on the same semiconductor die.

SUMMARY

According to an embodiment of a semiconductor device, the semiconductor device comprises: a semiconductor substrate; an epitaxial layer or layer stack on the semiconductor substrate; a plurality of transistor cells of a first type formed in a first region of the epitaxial layer or layer stack and electrically coupled in parallel to form a vertical power transistor; a plurality of transistor cells of a second type different than the first type and formed in a second region of the epitaxial layer or layer stack; and an isolation structure that laterally and vertically delimits the second region of the epitaxial layer or layer stack, wherein sidewalls and a bottom of the isolation structure comprise a dielectric material that electrically isolates the plurality of transistor cells of the second type from the plurality of transistor cells of the first type in the epitaxial layer or layer stack.

According to an embodiment of a method of producing a semiconductor device, the method comprises: growing an epitaxial layer or layer stack on a semiconductor substrate; forming a plurality of transistor cells of a first type in a first region of the epitaxial layer or layer stack and electrically coupled in parallel to form a vertical power transistor; forming a plurality of transistor cells of a second type different than the first type in a second region of the epitaxial layer or layer stack; and forming an isolation structure that laterally and vertically delimits the second region of the epitaxial layer or layer stack, wherein side ails and a bottom of the isolation structure comprise a dielectric material that electrically isolates the plurality of transistor cells of the second type from the plurality of transistor cells of the first type in the epitaxial layer or layer stack.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide an isolation structure and methods for monolithically integrating different device types on the same semiconductor die. The term 'different device types' as used herein means that the cells that form one device are different from the cells that form another device monolithically integrated on the same semiconductor die. The difference between cell types may be a structural difference and/or functional difference. In each case, the isolation structure described herein enables the monolithic integration of different device types on the same semiconductor die.

Described next with reference to the figures are embodiments of the isolation structure and methods of producing the isolation structure.

Figure 1:
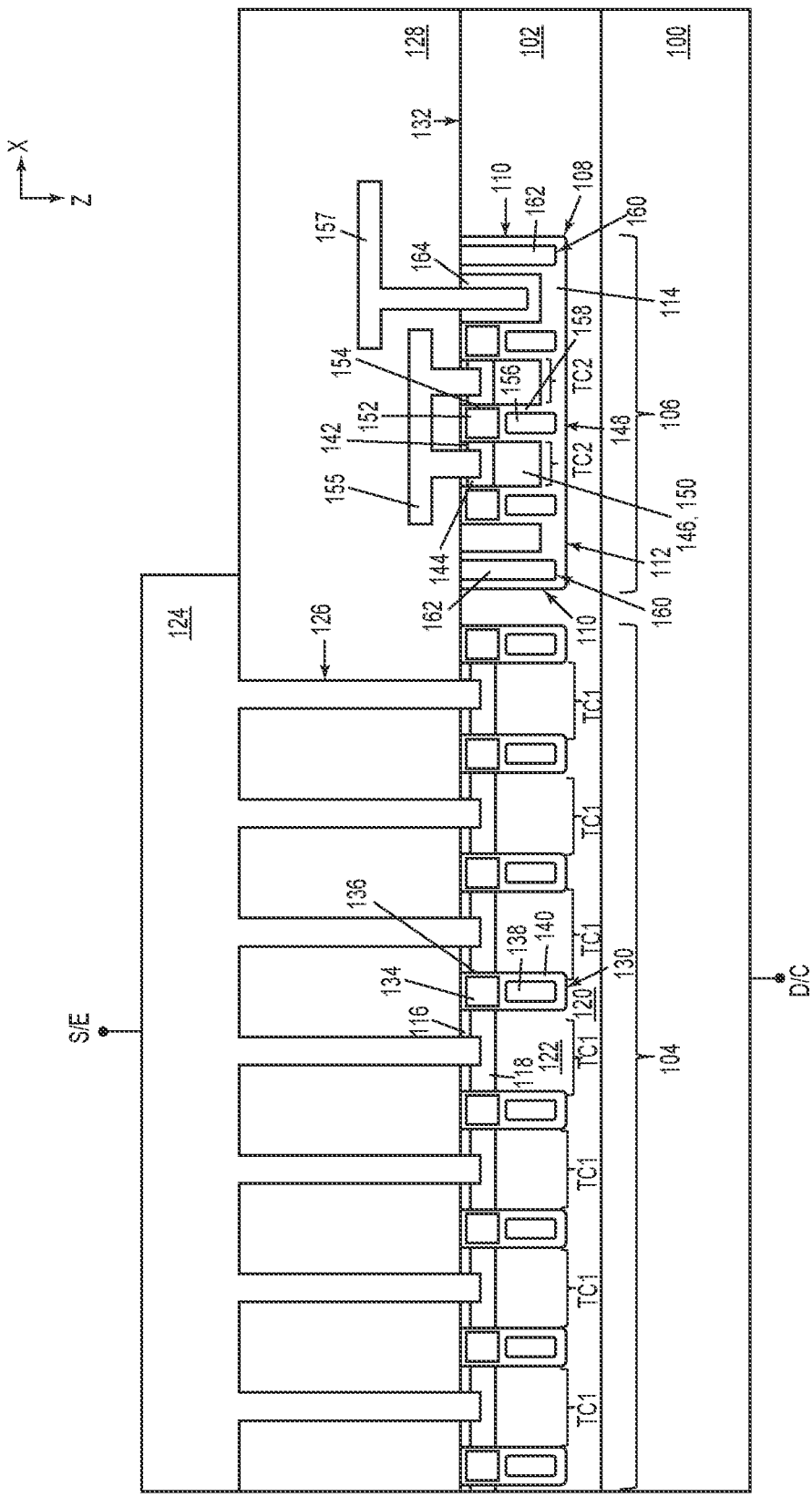
FIG. 1 illustrates a partial cross-sectional view of an embodiment of a semiconductor device having an isolation structure that enables the monolithic integration of different device types on the same semiconductor die.

FIG. 1 illustrates a partial cross-sectional view of an embodiment of a semiconductor device. The semiconductor device includes a semiconductor substrate 100. The semiconductor substrate 100 comprises one or more semiconductor materials that are used to form power semiconductor devices such as, e.g., Si or SiC power MOSFETs. For example, the semiconductor substrate 100 may comprise Si, silicon carbide (SiC), germanium (Ge), silicon germanium (SiGe), gallium nitride (GaN), gallium arsenide (GaAs), and the like. An epitaxial layer or layer stack 102 is formed on the semiconductor substrate 100.

Transistor cells TC1 of a first type formed in a first region 104 of the epitaxial layer or layer stack 102. Transistor cells TC2 of a second type different than the first type and formed in a second region 106 of the epitaxial layer or layer stack 102 different than the first region 104.

The transistor cells TC1 of the first type are different from the transistor cells TC2 of the second type in a structural and/or functional sense. For example, the transistor cells TC1 of the first type may form a vertical power transistor whereas the transistor cells TC2 of the second type may form all or part of a gate driver integrated circuit for the vertical power transistor. In another example, the transistor cells TC1 of the first type may have a different breakdown voltage than the transistor cells TC2 of the second type. In another example, the transistor cells TC1 of the first type may form a vertical power transistor and the transistor cells TC2 of the second type may form a lateral transistor, where the primary current flow path is between opposing main sides 101, 103 of the semiconductor substrate 100 for the vertical transistor and along the same side 101 for the lateral transistor. The transistor cells TC1 of the first type may have a thicker gate oxide, different trench layout, different shielding configuration, etc. compared to the transistor cells TC2 of the second type. The transistor cells TC1 of the first type may be NMOS (n-channel metal-oxide-semiconductor) transistor cells and the transistor cells TC2 of the second type may be PMOS (p-channel metal-oxide-semiconductor) transistor cells. The transistor cells TC1 of the first type may be n-channel transistor cells of a power transistor and the transistor cells TC2 of the second type may be n-channel transistor cells of an isolated pull-down transistor, e.g., of a level shifter.

In the partial cross-sectional view of FIG. 1, the transistor cells TC1 of the first type are electrically coupled in parallel to form a vertical power transistor. For example, in the case of SiC as the semiconductor material of the epitaxial layer or layer stack 102, the vertical power transistor may be a vertical SiC MOSFET. In the case of Si as the semiconductor material of the epitaxial layer or layer stack 102, the vertical power transistor may be a vertical Si power MOSFET. The vertical power transistor instead may be an IGBT (insulated gate bipolar transistor), JFET (junction FET), etc. Seven (7) transistor cells TC1 of the first type and two (2) transistor cells TC2 of the second type are shown in the partial cross-sectional view of FIG. 1. In general, the semiconductor device may have tens, hundreds, thousands, or even more transistors cells TC1, TC2.

An isolation structure 108 laterally and vertically delimits the second region 106 of the epitaxial layer or layer stack 102. The sidewalls 110 and the bottom 112 of the isolation structure 108 comprise a dielectric material 114 that electrically isolates the transistor cells TC2 of the second type from the transistor cells TC1 of the first type in the epitaxial layer or layer stack 102. The dielectric material 114 of the isolation structure 108 may be formed in the epitaxial layer or layer stack 102, the semiconductor substrate 100, or partly in the epitaxial layer or layer stack 102 and partly in the semiconductor substrate 100. In one embodiment, the semiconductor substrate 100 forms a drain or a collector of a vertical power transistor implemented by the transistor cells TC1 of the first type and the dielectric material 114 of the isolation structure 108 electrically isolates the transistor cells TC2 of the second type from the drain or collector of the vertical power transistor.

Each transistor cell TC1 of the first type includes a source/emitter region 116 of a first conductivity type and a body region 118 of a second conductivity type opposite the first conductivity type. The source/emitter region 116 of each transistor cell TC1 of the first type is separated from a drift zone 120 of the first conductivity type by the corresponding body region 118. In the case of a vertical Si or SiC power MOSFET, the substrate 100 may form the drain region of the vertical power transistor.

The first conductivity is n-type and the second conductivity type is p-type for an n-channel device formed by the transistor cells TC1 of the first type, whereas the first conductivity is p-type and the second conductivity type is n-type for a p-channel device formed by the transistor cells TC1 of the first type. For either an n-channel device or a p-channel device, the source/emitter region 116 and the body region 118 included in the same semiconductor mesa 122 form part of a transistor cell TC1 of the first type and the transistor cells TC1 of the first type are electrically connected in parallel between source (S)/emitter (E) and drain (D)/collector (C) terminals of the semiconductor device to form a power transistor.

The body regions 118 of the transistor cells TC1 of the first type may include a body contact region (not shown) of the second conductivity type and having a higher doping concentration than the body regions 118, to provide an ohmic connection with a source/emitter metallization 124 through a contact structure 126 that extends through an interlayer dielectric 128 that separates the source/emitter metallization 124 from the epitaxial layer or layer stack 102. The source emitter regions 116 of the transistor cells TC1 of the first type are also electrically connected to the source emitter metallization 124 through the contact structure 126.

Gate trenches 130 may extend from a front surface 132 of the epitaxial layer or layer stack 102 and into the epitaxial layer or layer stack 102 in the first region 104 of the epitaxial layer or layer stack 102. The gate trenches 130 may be 'stripe-shaped' in that the gate trenches 130 have a longest linear dimension in a direction which runs in and out of the page in FIG. 1 and parallel to the front surface 132 and transverses the depth-wise direction (z direction in FIG. 1) of the epitaxial layer or layer stack 102. In the case of a stripe shape, the gate trenches 130 delimit the semiconductor mesas 122 in the first region 104 of the epitaxial layer or layer stack 102.

Each gate trench 130 in the first region 104 of the epitaxial layer or layer stack 102 includes a gate electrode 134 and a gate dielectric insulating material 136 that separates the gate electrode 134 from the surrounding semiconductor material of the epitaxial layer or layer stack 102. The gate electrodes 130 in the first region 104 of the epitaxial layer or layer stack 102 are electrically connected to a gate terminal through, e.g., metal gate runners and respective contacts/vias that extend through the interlayer dielectric 128 and which are out of view in FIG. 1.

The gate trenches 130 in the first region 104 of the epitaxial layer or layer stack 102 also may include a field plate 138 and a field dielectric insulating material 140 that separates the field plate 138 from the surrounding semiconductor material of the epitaxial layer or layer stack 102 and from the gate electrode 134 in the same gate trench 130. The field plates 138 help optimize the area-specific on-state resistance achievable for a given breakdown voltage, by providing charge carrier compensation. The field plates 138 and the gate electrodes 134 may be made from any suitable electrically conductive material such as but not limited to polysilicon, metal (e.g., tungsten), metal alloy, etc. The field plates 138 and the gate electrodes 134 may comprise the same or different electrically conductive material. The gate dielectric insulating material 136 and the field dielectric insulating material 140 may comprise, e.g., SiOx and may be formed by thermal oxidation and/or deposition, for example. The field dielectric insulating material 140 and the gate dielectric insulating material 136 may comprise the same or different electrically insulative material. The field plates 138 instead may be disposed in separate trenches from the gate electrodes 134 in the first region 104 of the epitaxial layer or layer stack 102. The gate trenches 130 may be replaced with planar gates formed on the front surface 132 of the epitaxial layer or layer stack 102 in the first region 104 of the epitaxial layer or layer stack 102.

Each transistor cell TC2 of the second type similarly includes a source/emitter region 142 and a body region 144 of the opposite conductivity type. The source/emitter region 142 of each transistor cell TC2 of the second type is separated from a drift zone 146 of the same conductivity type as the source/emitter region 142 by the corresponding body region 144. The source/emitter region 142 of the transistor cells TC2 of the second type may be of the first conductivity type and the body region 144 of the transistor cells TC2 of the second type may be of the second conductivity type in case the transistor cells TC1 of the first type and the transistor cells TC2 of the second type both form n-channel transistors. If the transistor cells TC1 of the first type form an n-channel transistor and the transistor cells TC2 of the second type form a p-channel transistor, then the source/emitter region 142 of the transistor cells TC2 of the second type may be of the second conductivity type and the body region 144 of the transistor cells TC2 of the second type may be of the first conductivity type.

Each transistor cell TC2 of the second type may also include a gate trench 148 that extends from the front surface 132 of the epitaxial layer or layer stack 102 and into the epitaxial layer or layer stack 102 in the second region 106 of the epitaxial layer or layer stack 102. The gate trenches 148 in the second region 106 of the epitaxial layer or layer stack 102 may be stripe-shaped and delimit semiconductor mesas 150 in the second region 106 of the epitaxial layer or layer stack 102, for example. Each gate trench 148 in the second region 106 of the epitaxial layer or layer stack 102 includes a gate electrode 152 and a gate dielectric insulating material 154 that separates the gate electrode 152 from the surrounding semiconductor material of the epitaxial layer or layer stack 102. The transistor cells TC2 in the second region 106 of the epitaxial layer or layer stack 102 may be electrically connected to a different gate terminal (out of view), a different source/emitter metallization structure 155, and a different drain/collector metallization structure 157 than the transistor cells TC1 in the first region 104 of the epitaxial layer or layer stack 102, to ensure independent transistor control.

The transistor cells TC1 of the first type may have a first average gate oxide thickness and the transistor cells TC2 of the second type may have a second average gate oxide thickness. The first average gate oxide thickness may be greater than the second average gate oxide thickness. Conversely, the transistor cells TC1, TC2 of the first and second types may have the same average gate oxide thickness.

The gate trenches 148 in the second region 106 of the epitaxial layer or layer stack 102 also may include a field plate 156 and a field dielectric insulating material 158 that separates the field plate 156 from the surrounding semiconductor material of the epitaxial layer or layer stack 102 and from the gate electrode 152 in the same gate trench 148. The field plates 156 and the gate electrodes 152 in the second region 106 of the epitaxial layer or layer stack 102 may be made from any suitable electrically conductive material such as but not limited to polysilicon, metal (e.g., tungsten), metal alloy, etc. The field plates 156 and the gate electrodes 152 in the second region 106 of the epitaxial layer or layer stack 102 may comprise the same or different electrically conductive material. The gate dielectric insulating material 154 and the field dielectric insulating material 158 in the second region 106 of the epitaxial layer or layer stack 102 may comprise, e.g., SiOx and may be formed by thermal oxidation and/or deposition, for example. The field dielectric insulating material 158 and the gate dielectric insulating material 154 in the second region 106 of the epitaxial layer or layer stack 102 may comprise the same or different electrically insulative material. The field plates 156 instead may be disposed in separate trenches from the gate electrodes 152 in the second region 106 of the epitaxial layer or layer stack 102. The gate trenches 148 may be replaced with planar gates formed on the front surface 132 of the epitaxial layer or layer stack 102 in the second region 106 of the epitaxial layer or layer stack 102.

The outermost trench 160 in the second region 106 of the epitaxial layer or layer stack 102 serves as an isolation trench for laterally separating the transistor cells TC2 of the second type from the transistor cells TC1 of the first type. In one embodiment, the outermost trench 160 in the second region 106 of the epitaxial layer or layer stack 102 is completely filled by the dielectric material 114 of the isolation structure 108, e.g., oxide. In another embodiment, an electrode 162 is disposed in a central part of the outermost trench 160 in the second region 106 of the epitaxial layer or layer stack 102 and the electrode 162 is separated from the epitaxial layer or layer stack 102 by the dielectric material 114 of the isolation structure 108.

Figure 2B:
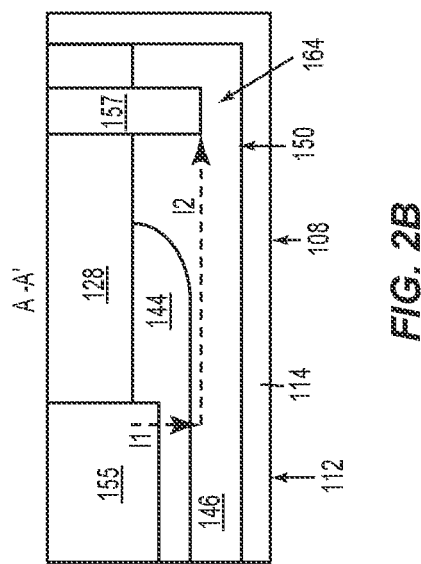
FIG. 2A illustrates a partial top plan view in a second region of the semiconductor die and FIG. 2B illustrates a cross-sectional view along the line labelled A-A' in FIG. 2A.
Figure 2A:
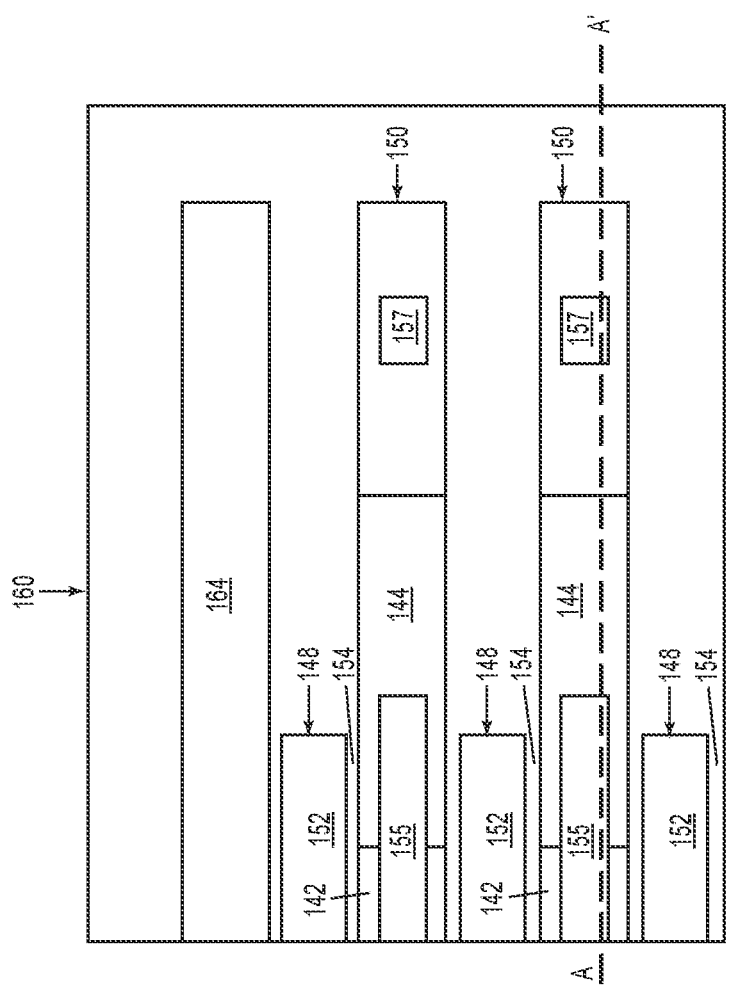

FIG. 2A illustrates a partial top plan view of the second region 106 of the epitaxial layer or layer stack 102 below the interlayer dielectric 128. FIG. 2B illustrates a cross-sectional view along the line labelled A-A' in FIG. 2A. As explained above in connection with FIG. 1, the transistor cells TC1 of the first type may include semiconductor mesas 122 delimited by gate trenches 130 in the first region 104 of the epitaxial layer or layer stack 102 and the transistor cells TC2 of the second type may similarly include semiconductor mesas 150 delimited by gate trenches 148 in the second region 106 of the epitaxial layer or layer stack 102. In one embodiment, a main (primary) current flow path of the transistor cells TC2 of the second type includes a (generally) vertical component I1 along the gate trenches 148 of the transistor cells TC2 of the second type to a drift zone 146 of the semiconductor mesas 150 of the transistor cells TC2 of the second type. The main current flow path of the transistor cells TC2 of the second type includes also includes a lateral component I2 along the drift zone 146 to a drain region 164 in the second region 106 of the epitaxial layer or layer stack 102.

Figure 3B:
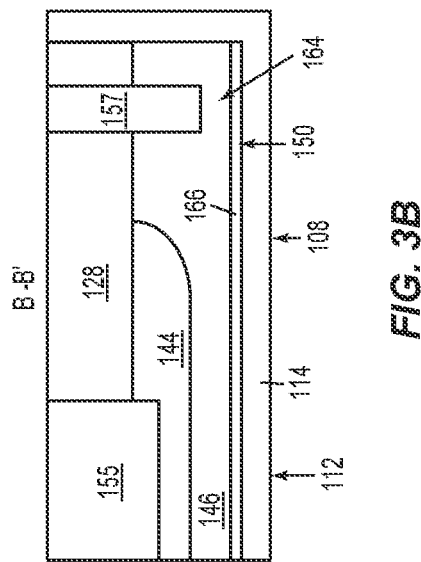
FIG. 3A illustrates a partial top plan view in the second region of the semiconductor die and FIG. 3B illustrates a cross-sectional view along the line labelled B-B' in FIG. 3A, according to another embodiment.
Figure 3A:
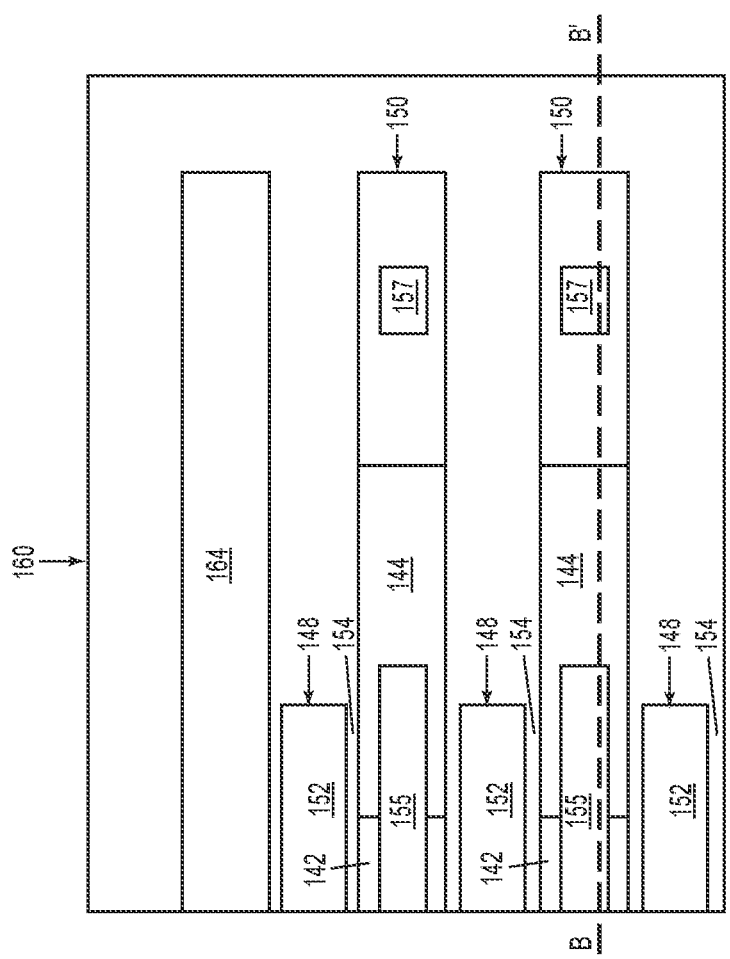

FIG. 3A illustrates a partial top plan view of the second region 106 of the epitaxial layer or layer stack 102 below the interlayer dielectric 128 and FIG. 38 illustrates a cross-sectional view along the line labelled B-B' in FIG. 3A. In FIGS. 3A and 38, a first region 166 of increased doping concentration is formed in the second region 108 of the epitaxial layer or layer stack 102. The first region 166 of increased doping concentration is in a first area of the second region 108 that adjoins the dielectric material 114 at the bottom 112 of the isolation structure 108. The first region 166 of increased doping concentration is of the same conductivity type as the drift zone 146 and enhances current spreading to the drain contact 157.

Figure 4B:
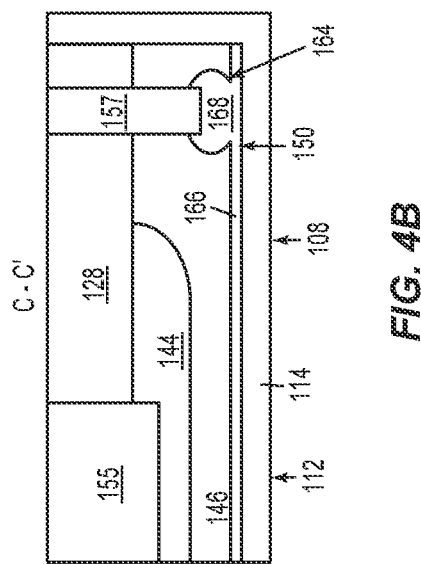
FIG. 4A illustrates a partial top plan view in the second region of the semiconductor die and FIG. 4B illustrates a cross-sectional view along the line labelled C-C' in FIG. 4A, according to another embodiment.
Figure 4A:
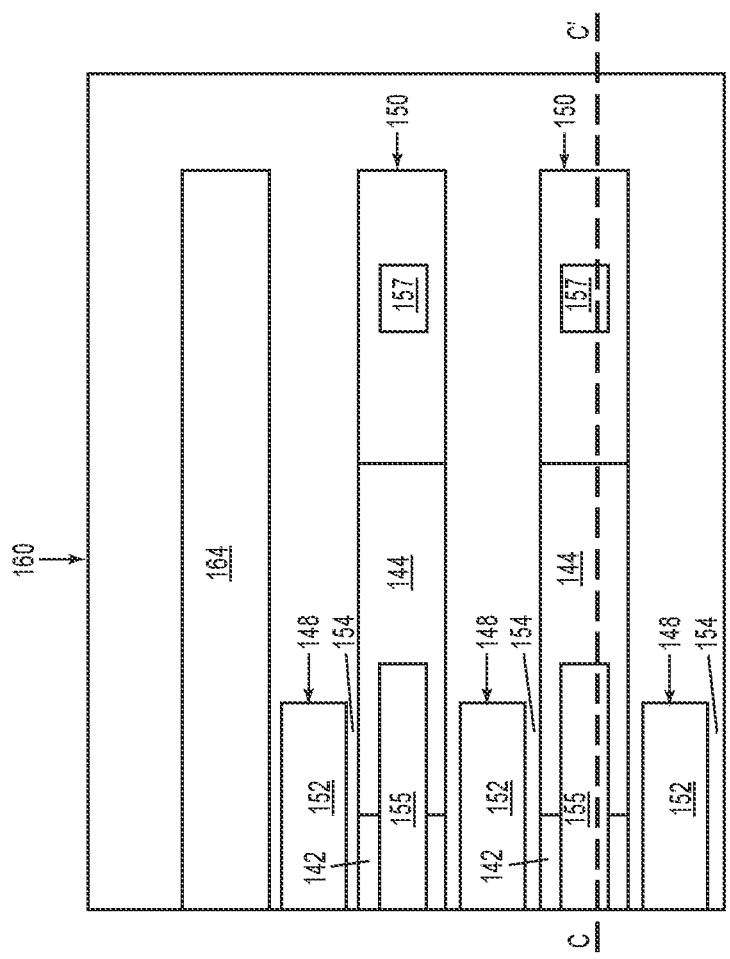
Figure 5B:
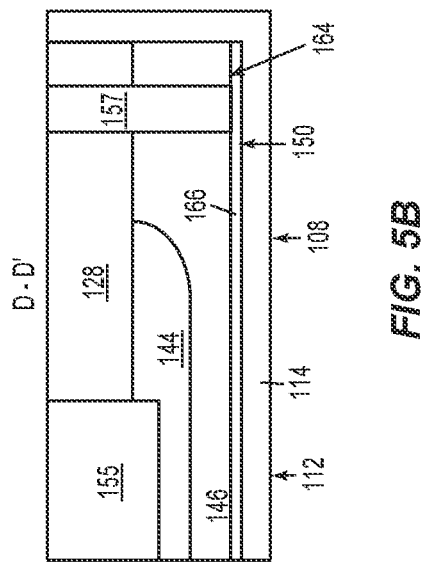
FIG. 5A illustrates a partial top plan view in the second region of the semiconductor die and FIG. 5B illustrates a cross-sectional view along the line labelled D-D' in FIG. 5A, according to another embodiment.
Figure 5A:
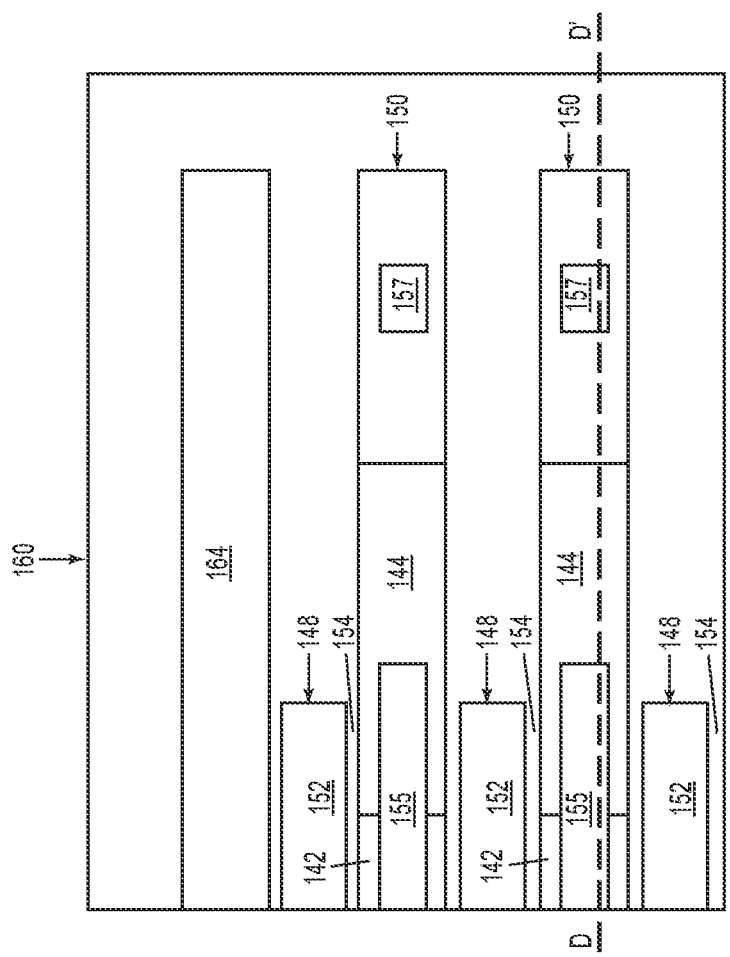

FIG. 4A illustrates a partial top plan view of the second region 106 of the epitaxial layer or layer stack 102 below the interlayer dielectric 128 and FIG. 4B illustrates a cross-sectional view along the line labelled C-C' in FIG. 4A. In FIGS. 4A and 4B, a second region 168 of increased doping concentration is provided in the second region 108 of the epitaxial layer or layer stack 102. The second region 168 of increased doping concentration is in a second area of the second region 108 interposed between the first area of the second region 108 and the drain contact 157. The second region 168 of increased doping concentration is of the same conductivity type as the drift zone 146 and connects the drain contact 157 to the first region 166 of increased doping concentration FIG. 5A illustrates a partial top plan view of the second region 106 of the epitaxial layer or layer stack 102 below the interlayer dielectric 128 and FIG. 5B illustrates a cross-sectional view along the line labelled D-D' in FIG. 5A. In FIGS. 5A and 5B, the second region 168 of increased doping concentration is omitted and the drain contact 157 extends deeper into the epitaxial layer or layer stack 108 so as to contact the first region 166 of increased doping concentration formed along the dielectric material 114 at the bottom 112 of the isolation structure 108.

Figure 6A:
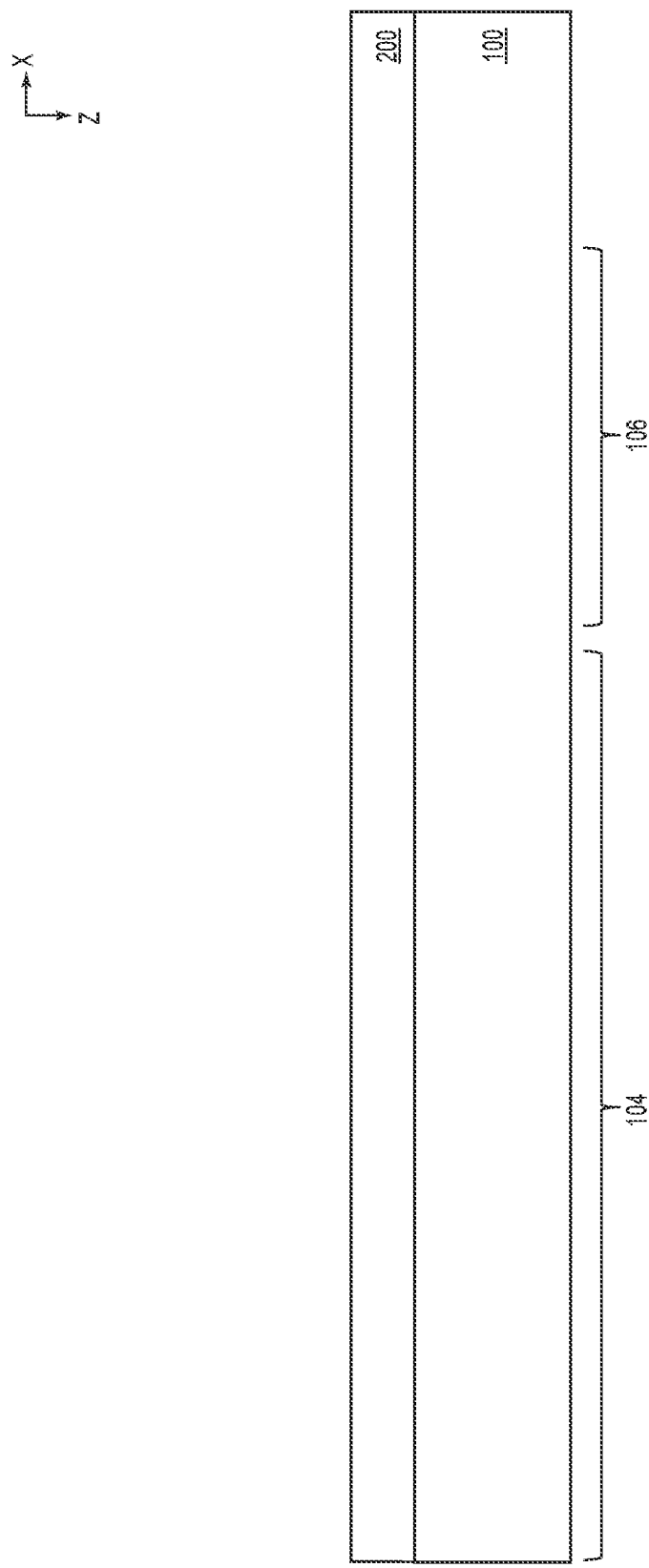
FIGS. 6A through 6P illustrate partial cross-sectional views of an embodiment of a method of producing a semiconductor device that includes the isolation structure.
Figure 6B:
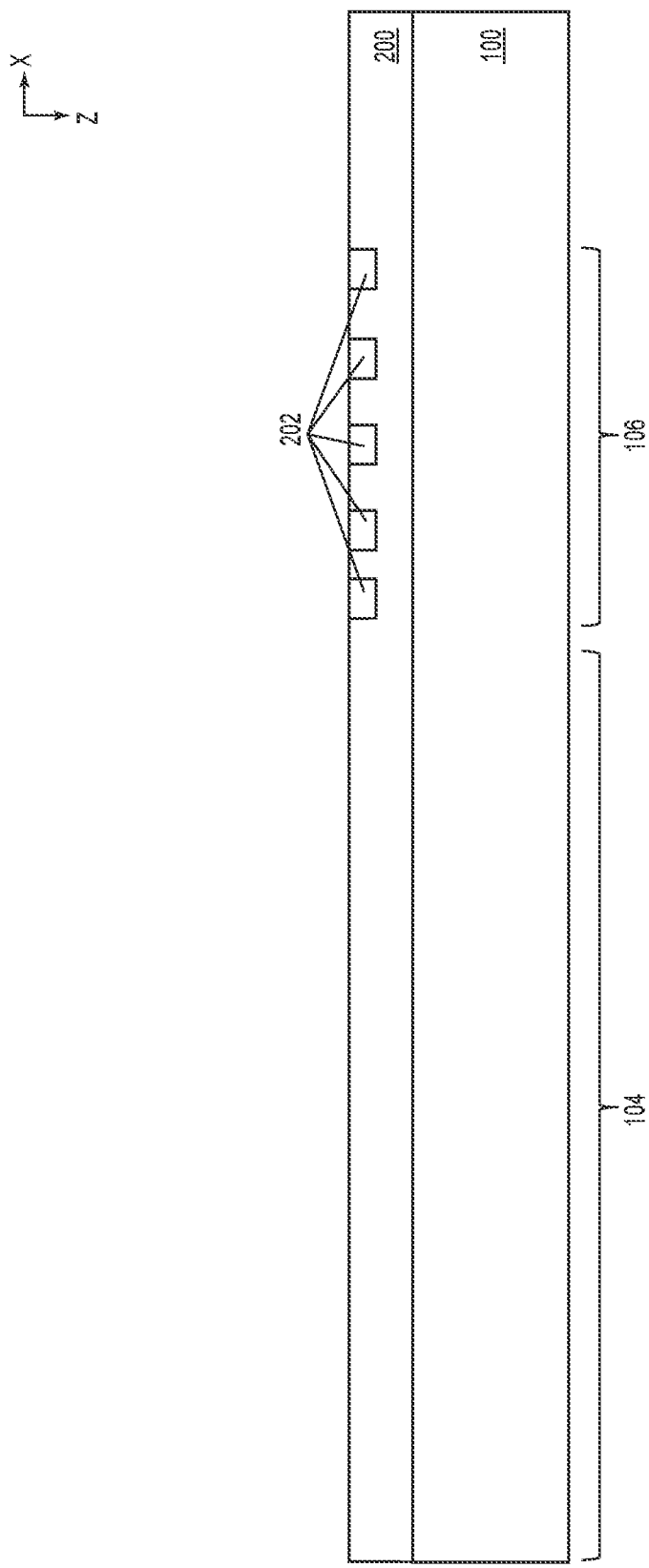
Figure 6C:
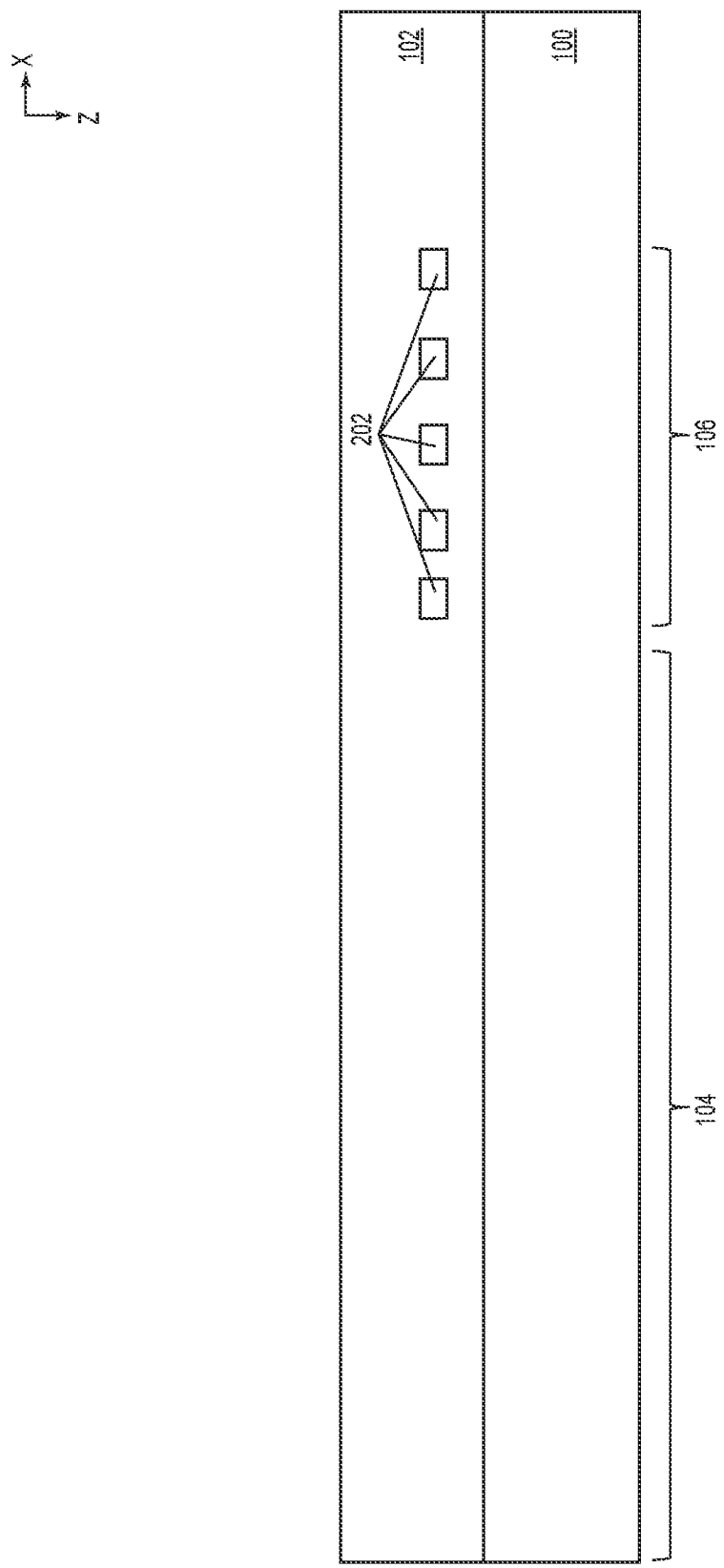
Figure 6D:
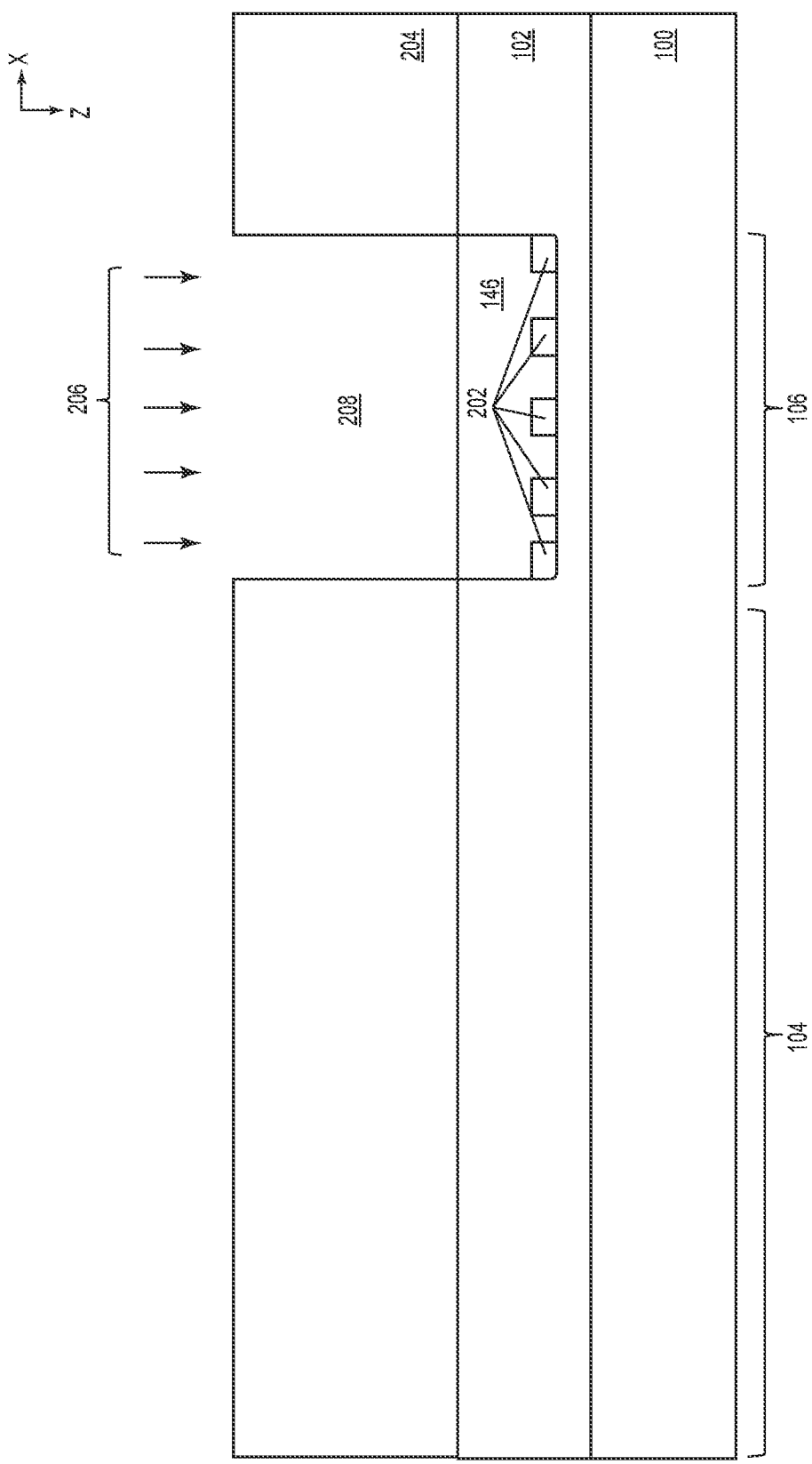
Figure 6E:
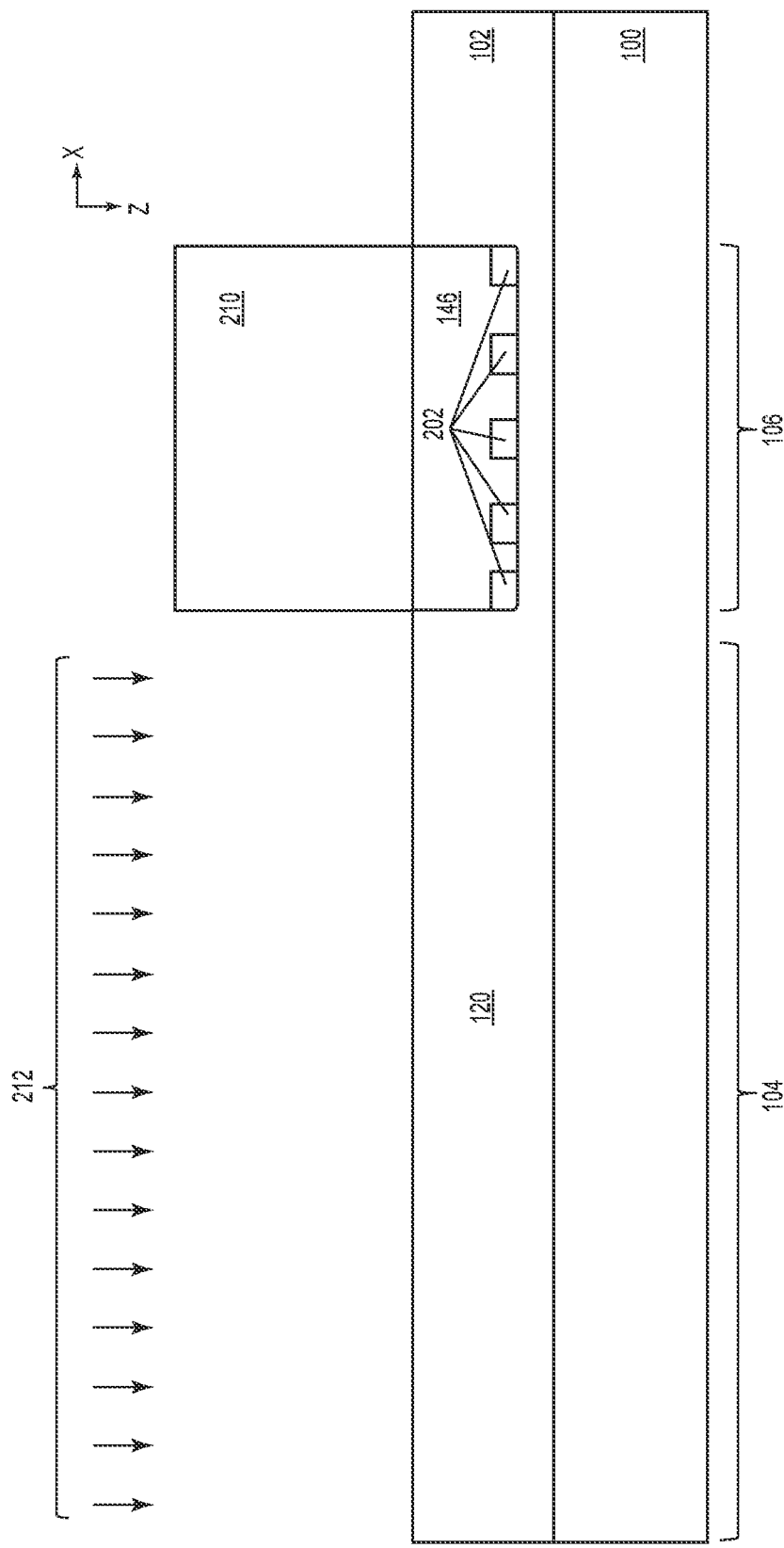
Figure 6F:
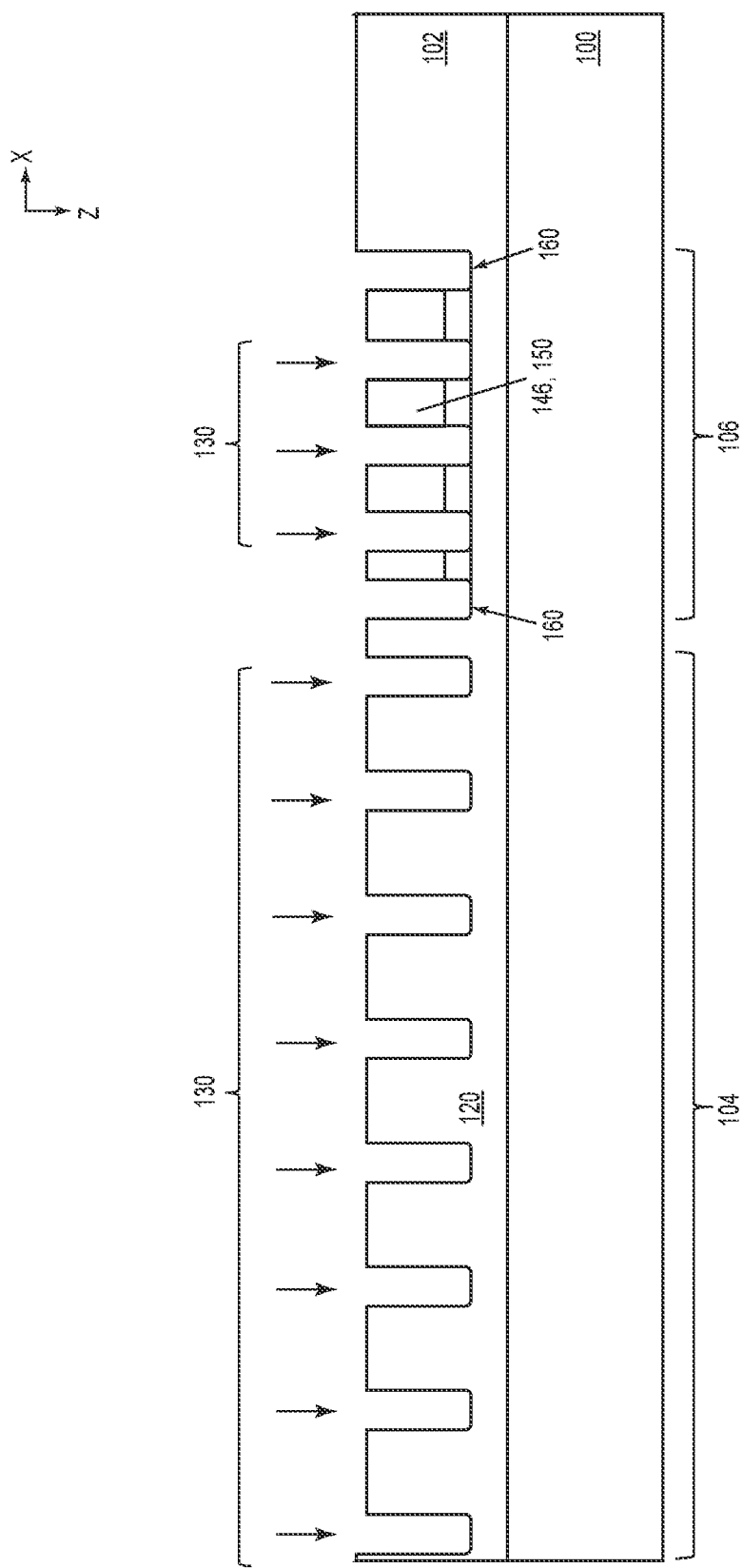
Figure 6G:
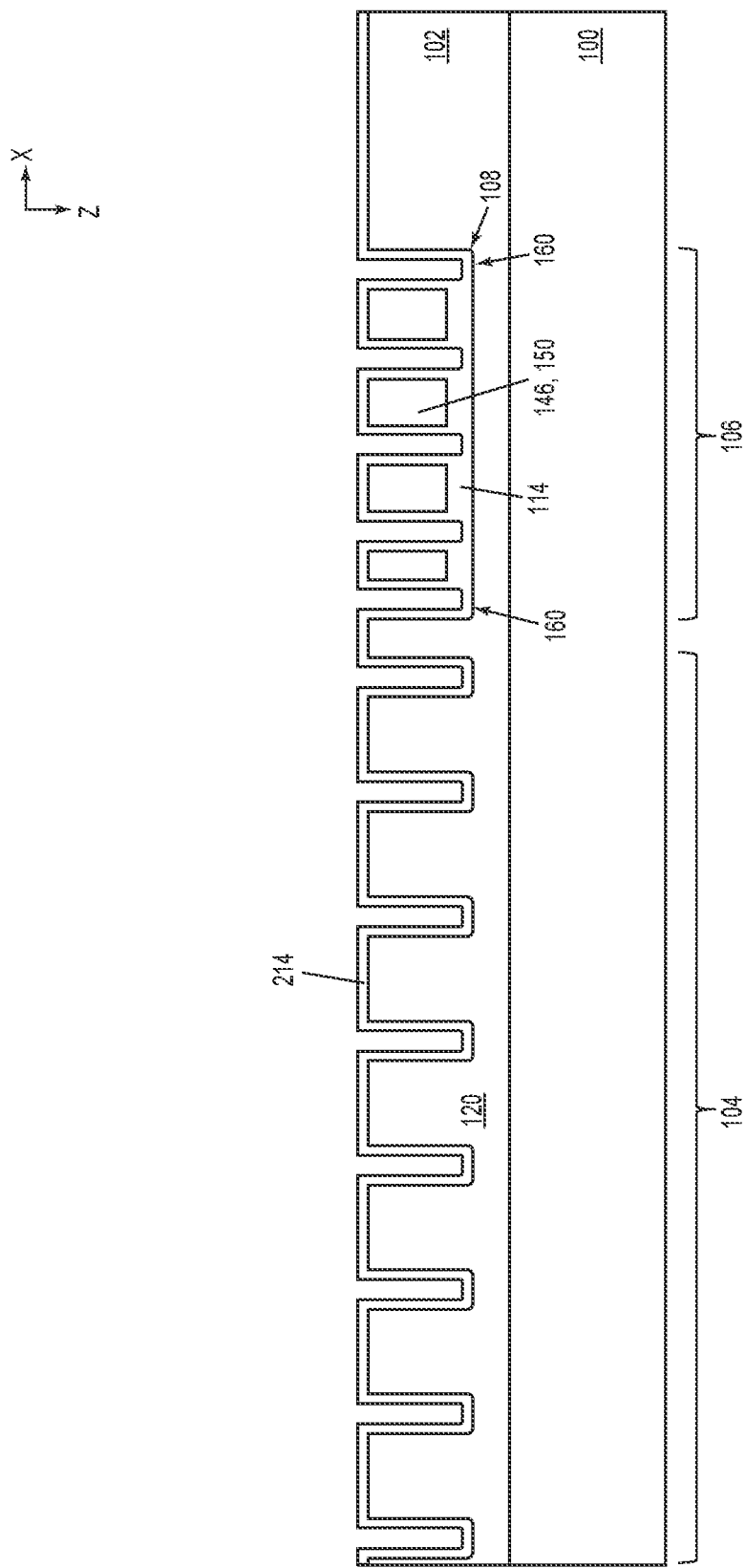
Figure 6H:
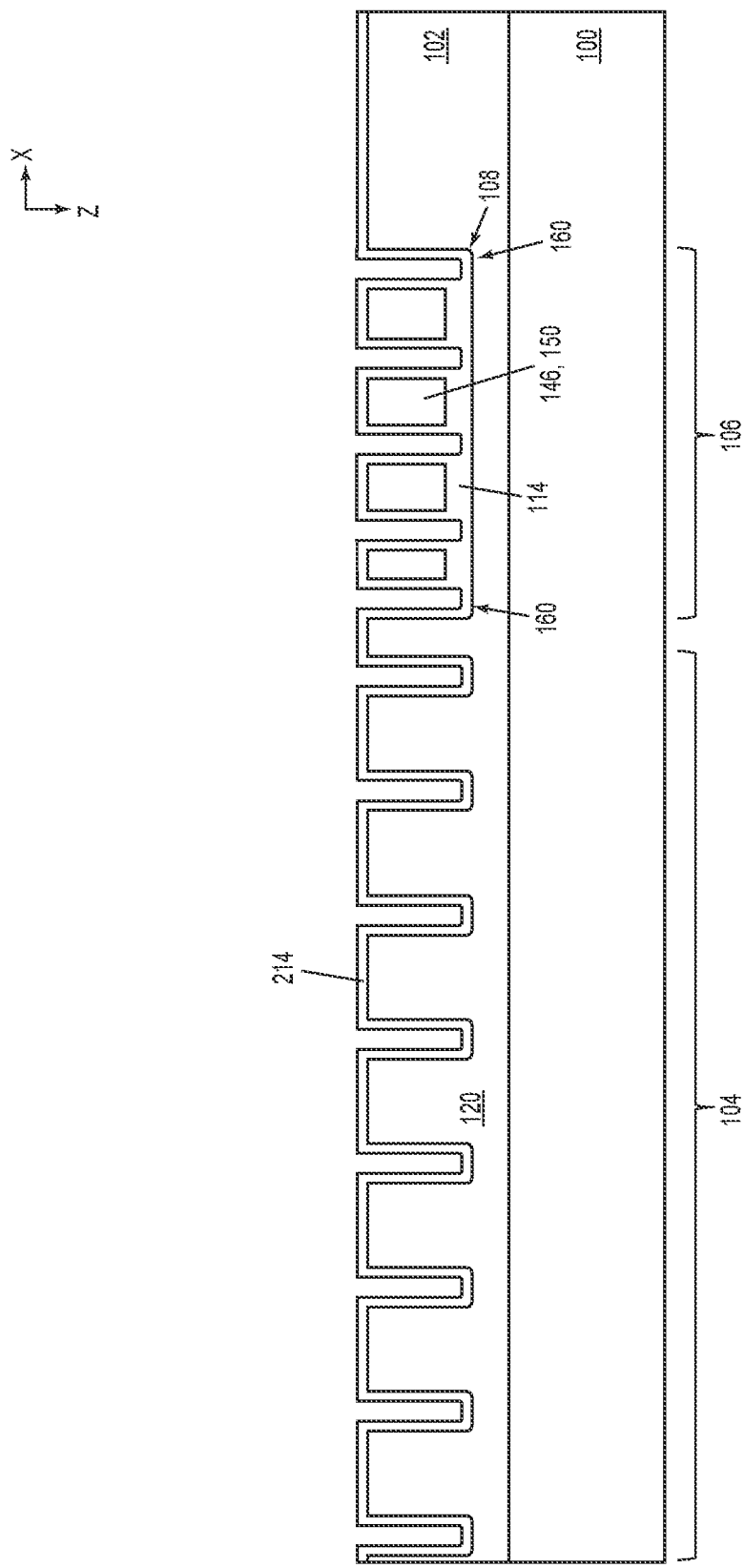
Figure 6I:
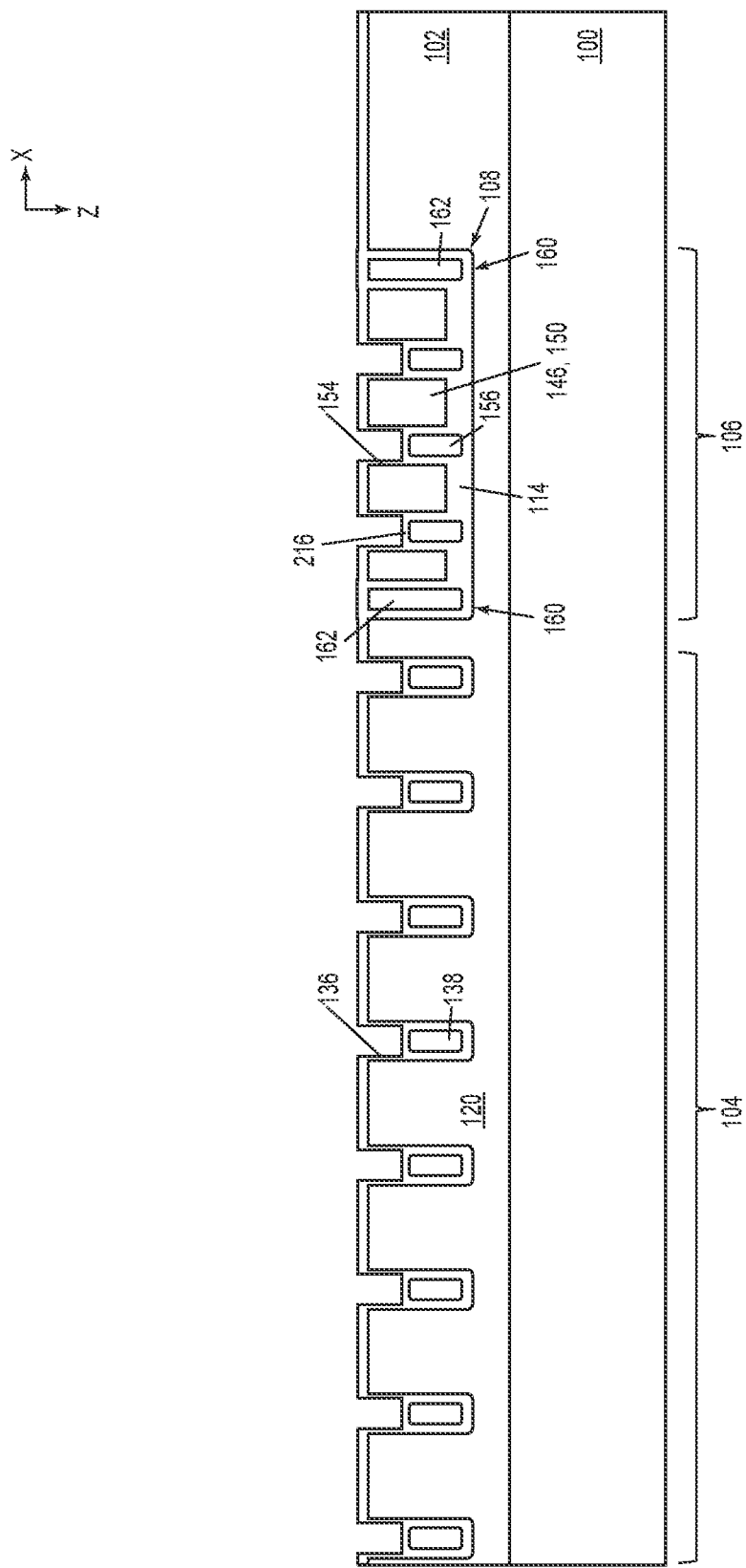
Figure 6J:
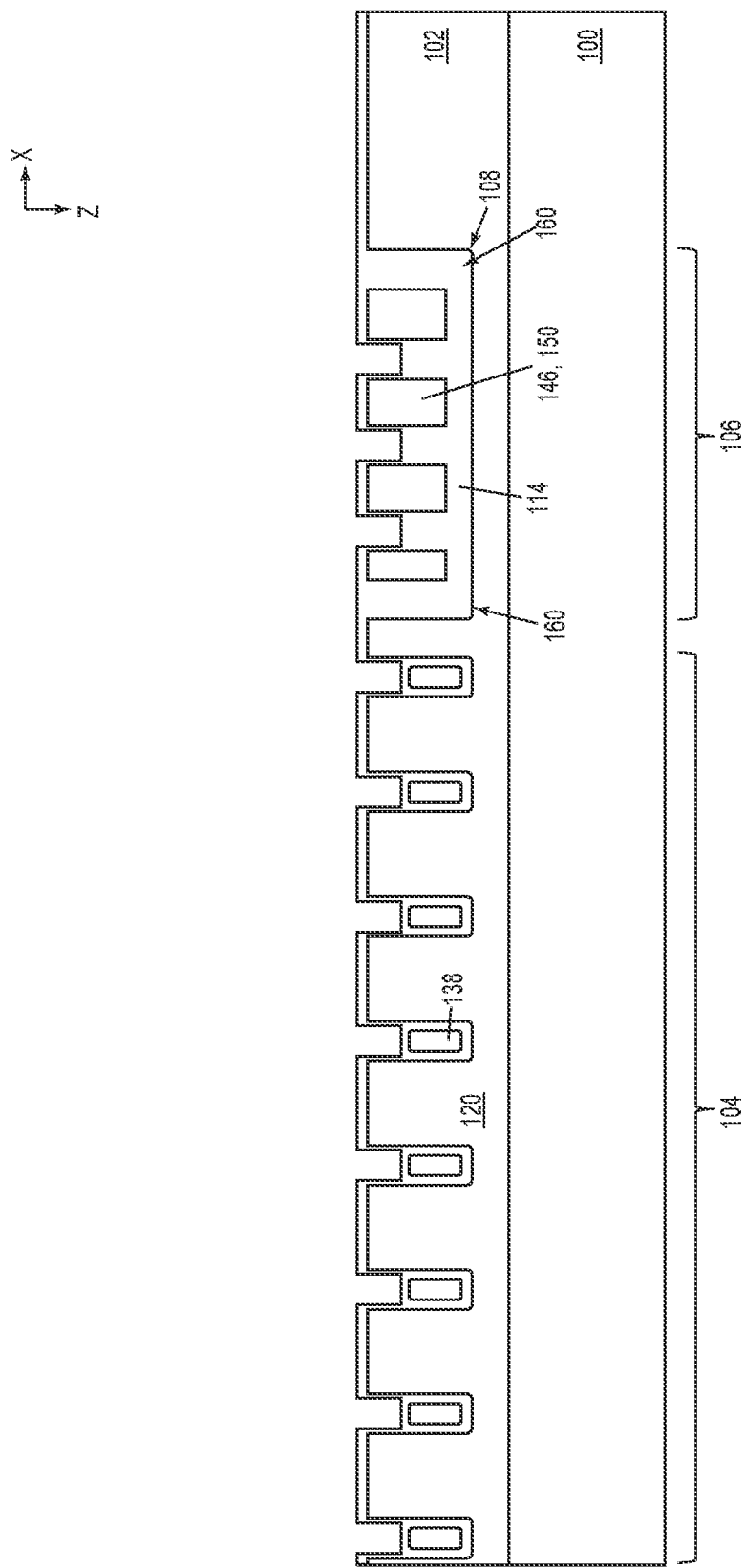
Figure 6K:
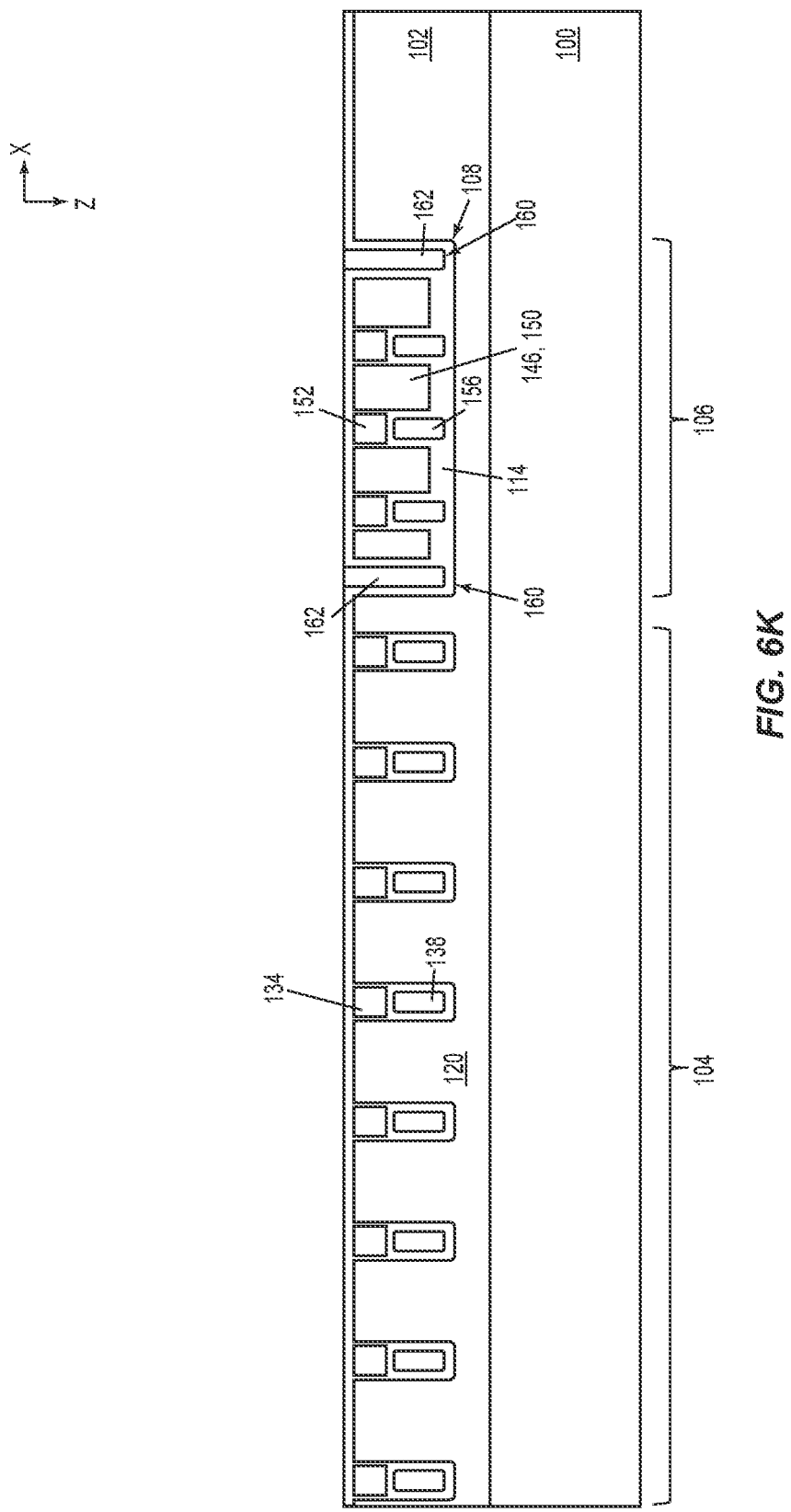
Figure 6L:
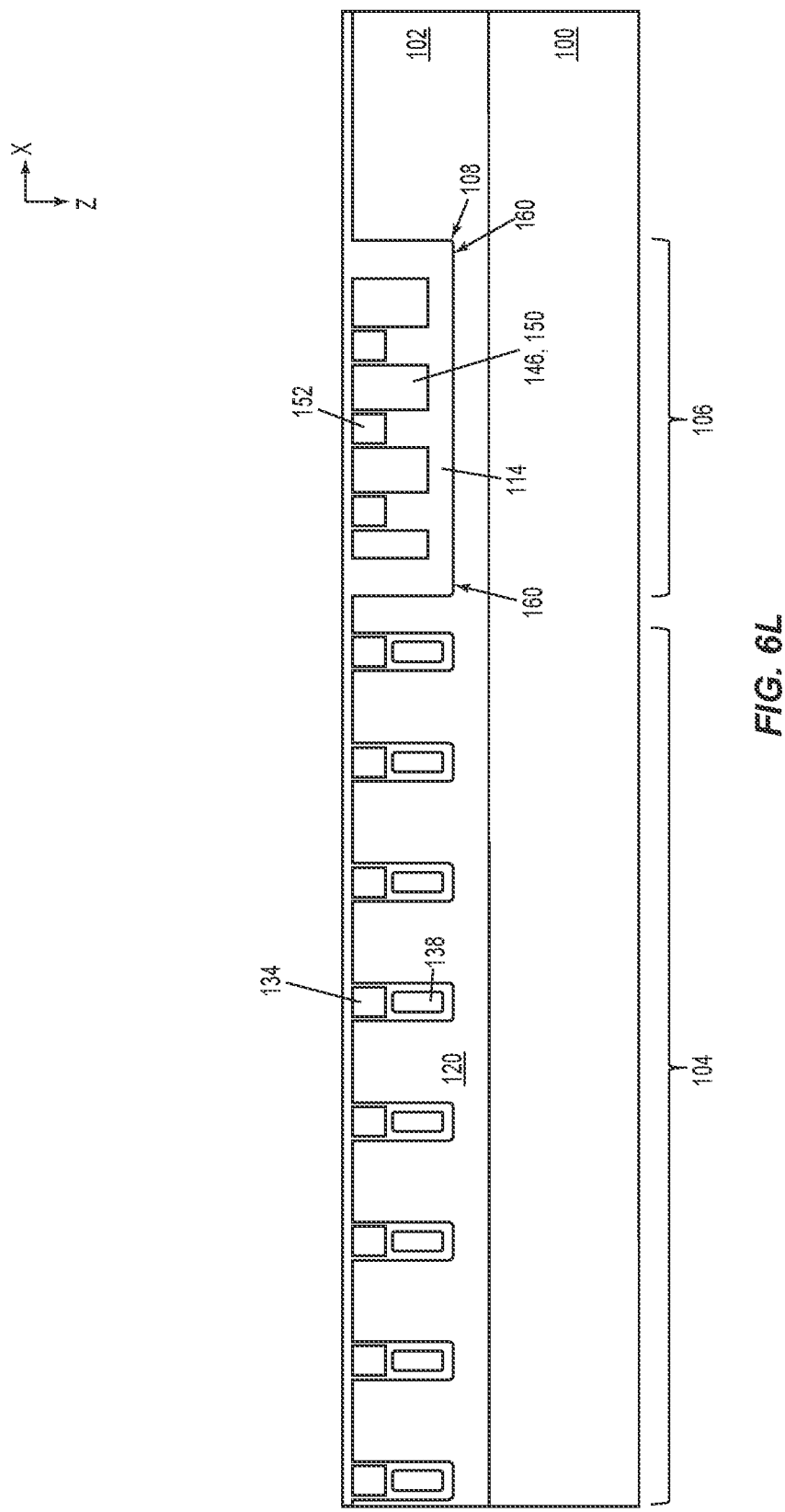
Figure 6M:
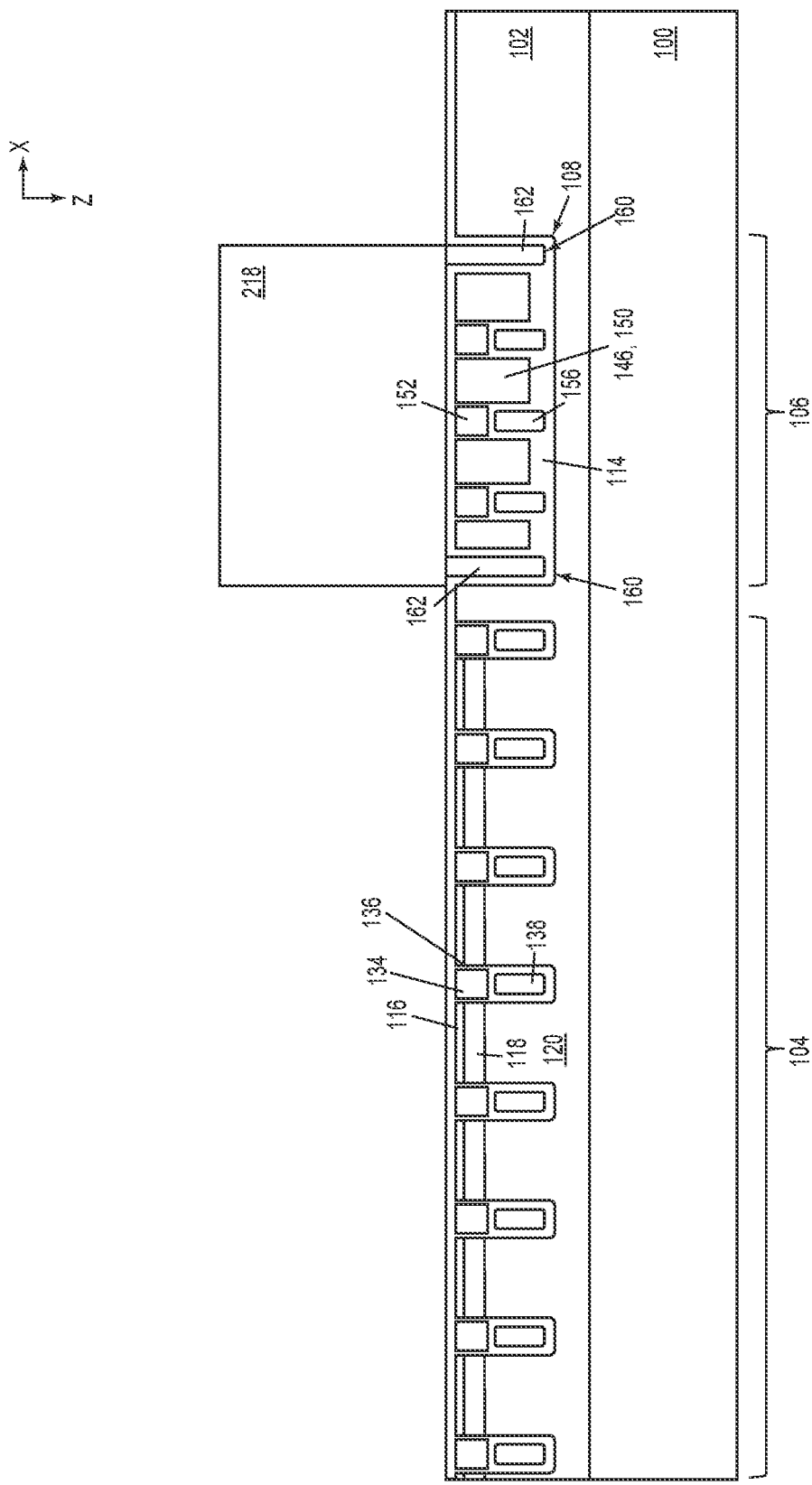
Figure 6N:
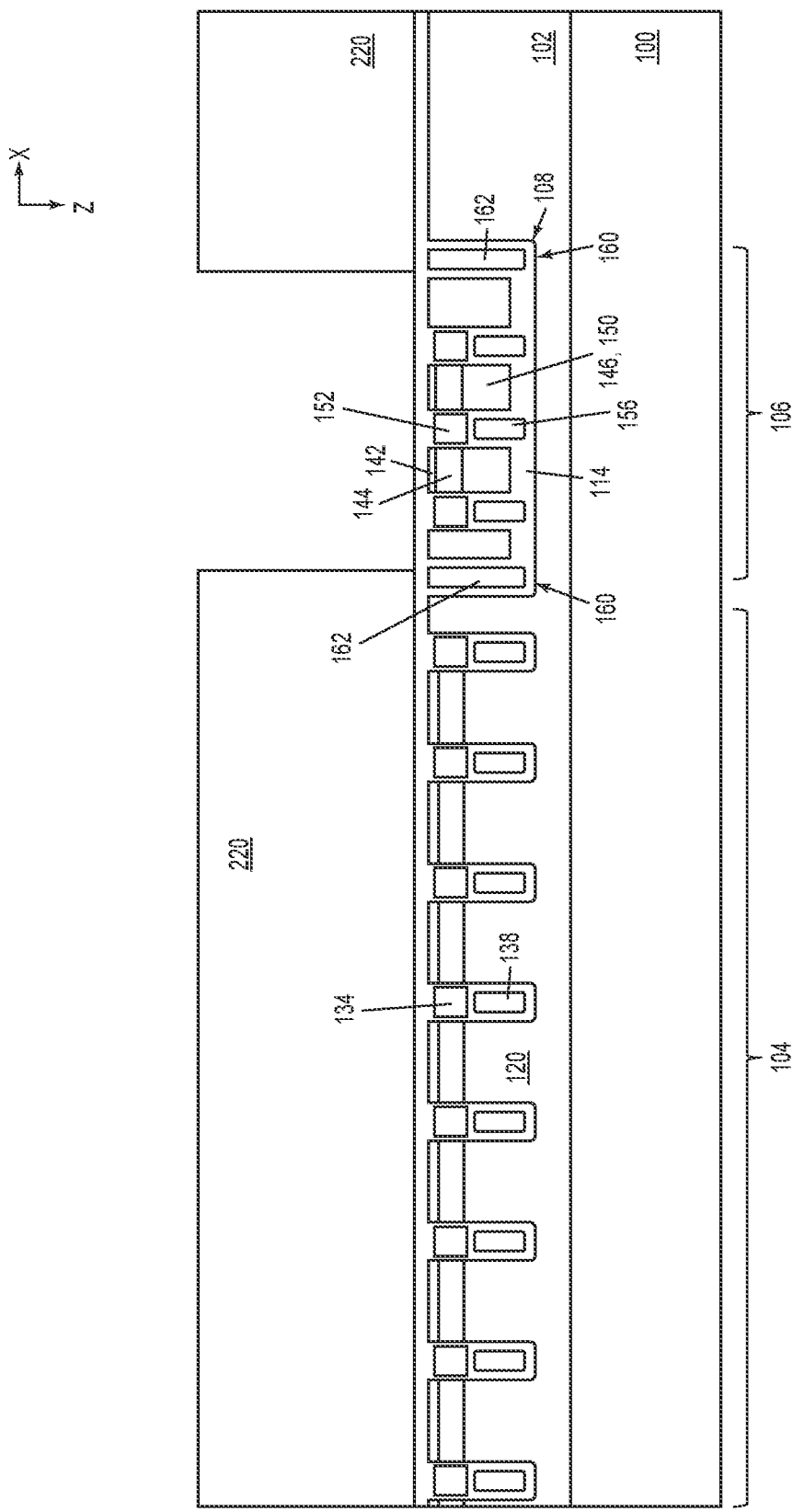
Figure 60:
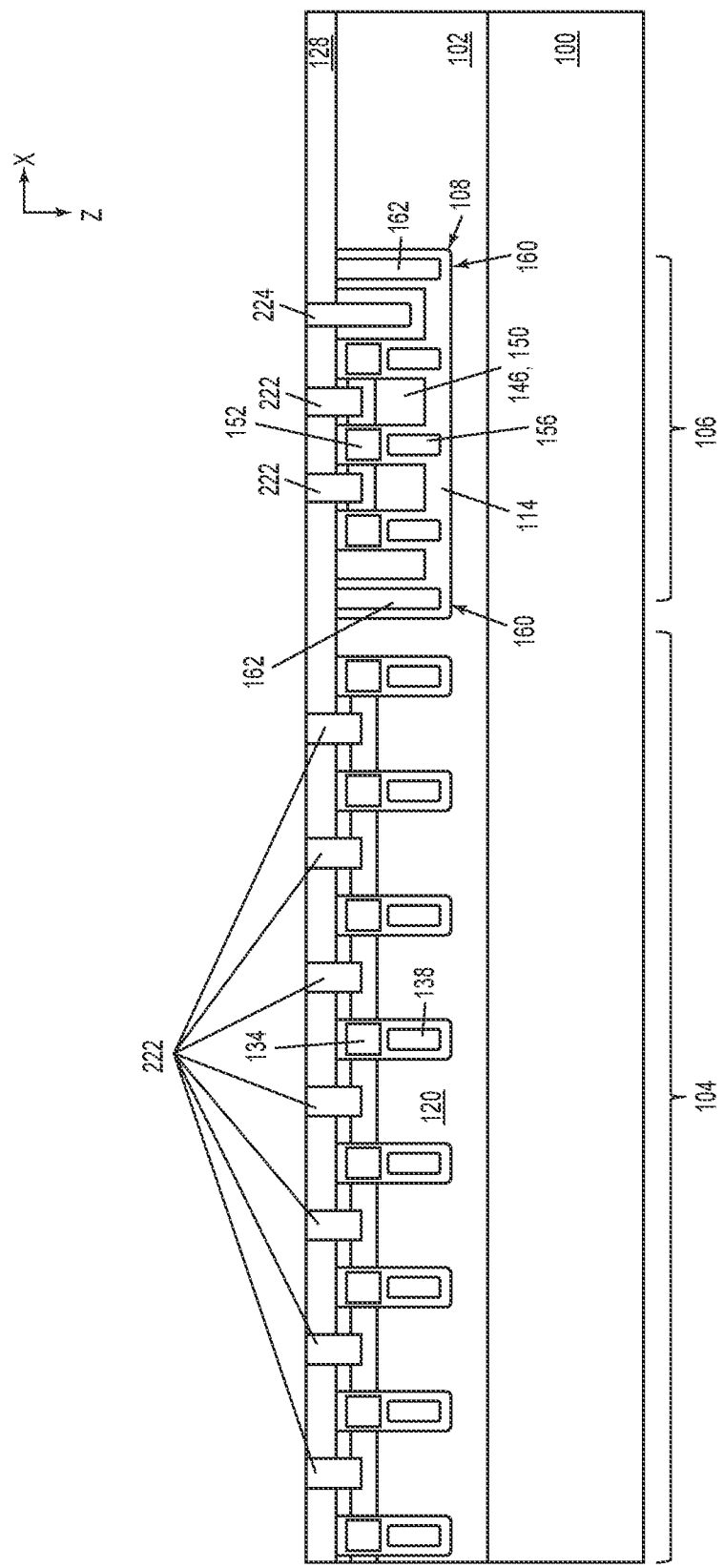
Figure 6P:
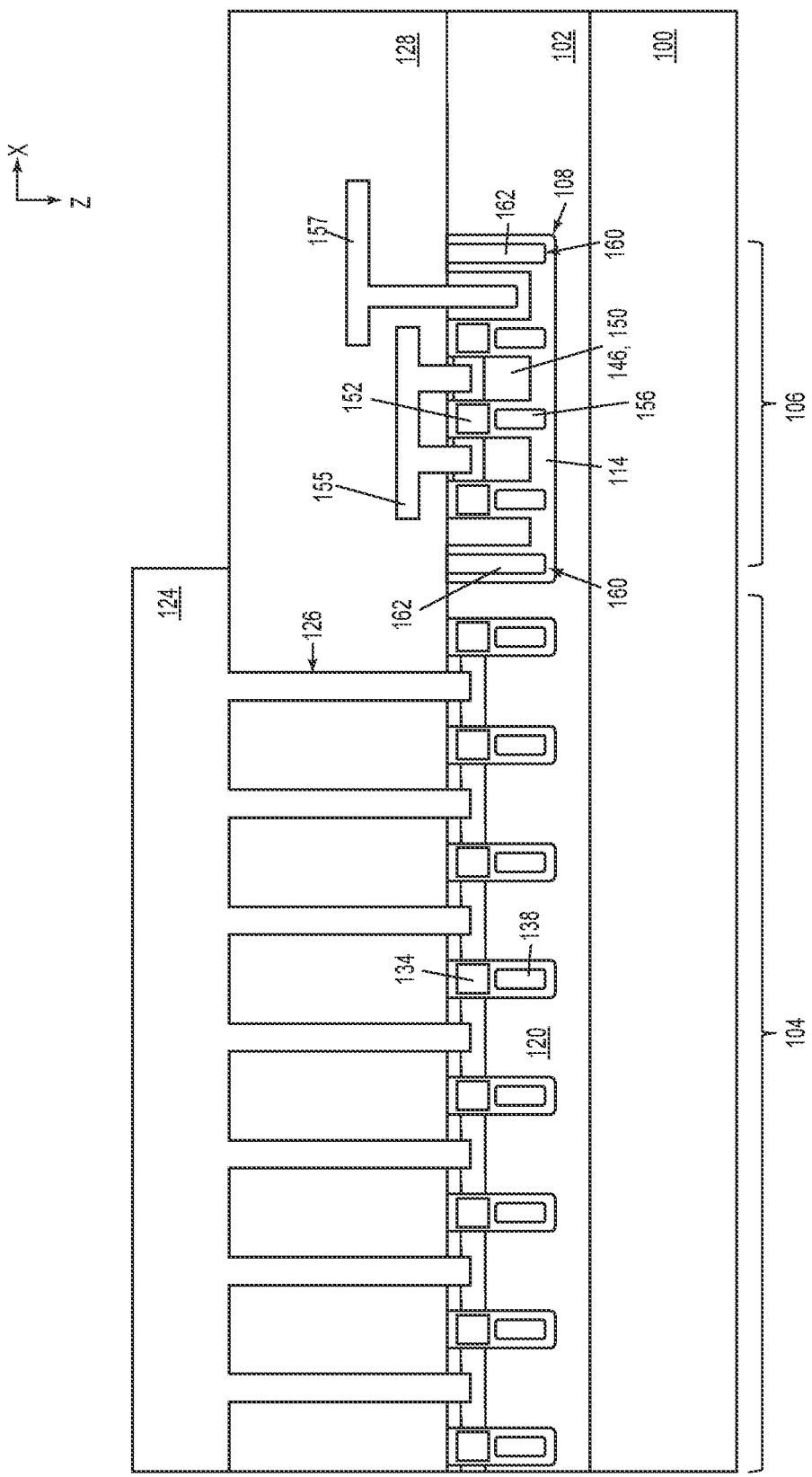

FIGS. 6A through 6P illustrate cross-sectional views of an embodiment of a method of producing a semiconductor device that includes the isolation structure 108.

FIG. 6A shows the semiconductor substrate 100 after growing a first epitaxial layer 200 on the semiconductor substrate 100. The epitaxial layer 200 may be doped or undoped. If doped, the epitaxial layer 200 may be doped in situ or ex situ.

FIG. 6B shows the semiconductor substrate 100 after forming oxide islands 202 in the first epitaxial layer 200. In one embodiment, the oxide islands 202 are formed by etching trenches into the first epitaxial layer 200, filling the trenches with oxide, and planarizing the oxide, e.g., via CMP (chemical mechanical polishing). The resulting oxide islands 202 may be narrow in the x direction and long in the direction that runs in and out of the page in FIG. 6B. The width of the oxide islands 202 may be as narrow as 0.2 to 0.3 µm, for example. More generally, the oxide islands 202 may be formed entirely in the epitaxial layer 200, entirely in the semiconductor substrate 100, or partly in the epitaxial layer 200 and partly in the semiconductor substrate 100.

FIG. 6C shows the semiconductor substrate 100 after covering the oxide islands 200 by epitaxial overgrowth to complete the epitaxial layer or layer stack 102. The epitaxial overgrowth may be polished to a desired thickness.

FIG. 6D shows the semiconductor substrate 100 after a mask 204 such as an oxide mask is formed on the epitaxial layer or layer stack 102 and a dopant species 206 is implanted through an opening 208 in the mask 204 to form the drift zone 146 in the second region 106 of the epitaxial layer or layer stack 102. The drift zone 146 in the second region 106 of the epitaxial layer or layer stack 102 may be n-type or p-type, depending on the type of device to be formed in the second region 106 of the epitaxial layer or layer stack 102. For example, if the device to be formed in the second region 106 of the epitaxial layer or layer stack 102 is a p-channel device, the drift zone 146 in the second region 106 of the epitaxial layer or layer stack 102 is p-type and the dopant species 206 may be boron in the case of Si as the epitaxial layer or layer stack 102 or aluminum in the case of SiC as the epitaxial layer or layer stack 102. If the device to be formed in the second region 106 of the epitaxial layer or layer stack 102 is instead an n-channel device, the drift zone 146 in the second region 106 of the epitaxial layer or layer stack 102 is n-type and the dopant species 206 may be phosphorous or arsenic in the case of Si as the epitaxial layer or layer stack 102 or phosphorous or nitrogen in the case of SiC as the epitaxial layer or layer stack 102.

FIG. 6E shows the semiconductor substrate 100 after a second mask 210 such as an oxide mask is formed over the drift zone 146 in the second region 106 of the epitaxial layer or layer stack 102 and a dopant species 212 is implanted into the part of the epitaxial layer or layer stack 102 unprotected by the second mask 210 to form the drift zone 120 in the first region 104 of the epitaxial layer or layer stack 102. The drift zone 120 in the first region 104 of the epitaxial layer or layer stack 102 may be n-type or p-type, depending on the type of device to be formed in the first region 104 of the epitaxial layer or layer stack 102. For example, if the device to be formed in the first region 104 of the epitaxial layer or layer stack 102 is a p-channel device, the drift zone 120 in the first region 104 of the epitaxial layer or layer stack 102 is p-type and the dopant species 212 may be boron in the case of Si as the epitaxial layer or layer stack 102 or aluminum in the case of SiC as the epitaxial layer or layer stack 102. If the device to be formed in the first region 104 of the epitaxial layer or layer stack 102 is instead an n-channel device, the drift zone 120 in the first region 104 of the epitaxial layer or layer stack 102 is n-type and the dopant species 212 may be phosphorous or arsenic in the case of Si as the epitaxial layer or layer stack 102 or phosphorous or nitrogen in the case of SiC as the epitaxial layer or layer stack 102.

FIG. 6F shows the semiconductor substrate 100 after gate trenches 130 are etched into the first region 104 of the epitaxial layer or layer stack 102 via a common etching process by which the trenches 130 are also etched into the second region 104 of the epitaxial layer or layer stack 102. Backside alignment may be used to align the gate trenches 130 with respect to the oxide islands 202 in the second region 106 of the epitaxial layer or layer stack 102. In the second region 106 of the epitaxial layer or layer stack 102, a bottom part of the gate trenches 130 are laterally separated from one another by the oxide islands 202 and the outermost trench 160 surrounds the other trenches 130 and laterally delimits the second region 106 of the epitaxial layer or layer stack 102. The outermost trench 160 in the second region 106 of the epitaxial layer or layer stack 102 serves as an isolation trench, as previously explained herein.

FIG. 6G shows the semiconductor substrate 100 after an oxide layer 214 such as a field oxide is formed on the epitaxial layer or layer stack 102 and along the bottom and sidewalls of the gate trenches 130. In the second region 106 of the epitaxial layer or layer stack 102, the oxide layer 214 connects the oxide islands 202 to form the dielectric material 114 of the isolation structure 108.

FIG. 6H shows an embodiment according to which the outermost trench 160 in the second region 106 of the epitaxial layer or layer stack 102 is narrow enough such that the outermost trench 160 is completely filled by the oxide layer 214.

FIG. 6I shows the semiconductor substrate 100 of FIG. 6G after a field plate electrode 138, 156 is formed in the lower part of each gate trench 130. An electrode 162 also may be formed in the central part of the outermost trench 160 in the second region 106 of the epitaxial layer or layer stack 102, the electrode 162 being separated from the epitaxial layer or layer stack 102 by the oxide layer 214 and the oxide islands 202. The field plate electrodes 138, 156 may be formed by depositing polysilicon in the gate trenches 130, etching back the polysilicon to define the field plate electrodes 138, 156, and forming an inter-poly dielectric (IPD) 216 on the field plate electrodes 138, 156. A gate dielectric insulating material 136, 154 may then be formed on the sidewalls in the upper part of the gate trenches 130. The outermost trench 160 in the second region 106 of the epitaxial layer or layer stack 102 may be masked during the polysilicon etch back and forming of the IPD 216. The average thickness of the gate dielectric insulating material 154 in the second region 106 of the epitaxial layer or layer stack 102 may be the same or different (e.g., thinner) than the gate dielectric insulating material 136 in the first region 104 of the epitaxial layer or layer stack 102, depending on whether different threshold voltages are desired.

FIG. 6J shows an alternate embodiment according to which the electrodes 156, 162 are omitted from the second region 106 of the epitaxial layer or layer stack 102, e.g., if the breakdown voltage requirement in the second region 106 of the epitaxial layer or layer stack 102 is not too high. The trenches 130, 160 in the second region 106 of the epitaxial layer or layer stack 102 may be masked during the polysilicon deposition, etch back, and IPD forming steps to prevent forming the electrodes 156, 162 in the second region 106 of the epitaxial layer or layer stack 102.

FIG. 6K shows the semiconductor substrate 100 of FIG. 6I after forming gate electrodes 152 in the gate trenches 130 in the second region 106 of the epitaxial layer or layer stack 102 and surrounded by the outermost trench 160 in the second region 106. The gate electrodes 134 may be formed concurrently in the gate trenches 130 in the first region 104 of the epitaxial layer or layer stack 102. The gate electrodes 134, 152 may be formed by depositing polysilicon in the upper part of the gate trenches 130 and etching back the polysilicon. The upper part of the polysilicon may be oxidized followed by a mesa screen oxide process, for subsequent implants. In the second region 106 of the epitaxial layer or layer stack 102, a field electrode 156 may be below the gate electrode 152 in the trenches 130 surrounded by the outermost trench 160.

FIG. 6L shows an alternate embodiment according to which the field plate electrodes 156 are omitted from the gate trenches 130 surrounded by the outermost trench 160 in the second region 106 of the epitaxial layer or layer stack 102. The field plate electrodes 156 may be omitted from the gate trenches 130 in the second region 106 of the epitaxial layer or layer stack 102 as explained above in connection with FIG. 6J.

FIG. 6M shows the semiconductor substrate 100 of FIG. 6K after forming source regions 116 and body regions 118 of the opposite conductivity type in semiconductor mesas 112 delimited by the gate trenches 130 in the first region 104 of the epitaxial layer or layer stack 102. If the device formed in the second region 106 of the epitaxial layer or layer stack 102 has the opposite channel as the device formed in the first region 104 of the epitaxial layer or layer stack 102, a mask 218 such as an oxide mask may be formed over the second region 106 to shield the second region 106 form the dopant implants applied to the first region 104.

FIG. 6N shows the semiconductor substrate 100 of FIG. 6M after forming source regions 142 and body regions 144 of the opposite conductivity type in semiconductor mesas 150 delimited by the gate trenches 130 in the second region 106 of the epitaxial layer or layer stack 102. If the device formed in the second region 106 of the epitaxial layer or layer stack 102 has the opposite channel as the device formed in the first region 104 of the epitaxial layer or layer stack 102, a mask 220 such as an oxide mask may be formed over the first region 104 to shield the first region 104 form the dopant implants applied to the second region 106. If the devices formed in the first and second regions 104, 106 of the epitaxial layer or layer stack 102 have the same channel type (both n-channel or both p-channel), both regions 104, 106 may be concurrently implanted to form the respective source regions 116, 142 and respective body regions 118, 144.

FIG. 6O shows the semiconductor substrate 100 of FIG. 6N after forming at least part of an interlayer dielectric 128 on the epitaxial layer or layer stack 102. Vias or contacts 222 of a contact structure 126 are formed in the interlayer dielectric 128 to provide points of contact to the respective source regions 116, 142 and respective body regions 118, 144 formed in the first and second regions 104, 106 of the epitaxial layer or layer stack 102. An additional via or contact 224 of the contact structure 126 is formed in the interlayer dielectric 128 to provide a drain contact in the second region 106 of the epitaxial layer or layer stack 102. If the devices formed in the first and second regions 104, 106 of the epitaxial layer or layer stack 102 have opposite channel types, a further masking process may be used to form body contacts (not shown) of one conductivity type in the first region 104 of the epitaxial layer or layer stack 102 and of the opposite conductivity type in the second region 106 of the epitaxial layer or layer stack 102. It the devices formed in the first and second regions 104, 106 of the epitaxial layer or layer stack 102 have the same channel type (both n-channel or both p-channel), the body contacts in both regions 104, 106 are of the same conductivity type and may be formed concurrently.

FIG. 6P shows the semiconductor substrate 100 of FIG. 6O after completing the interlayer dielectric 128 and the contact structure 126. The contact structure 126 may include a source/emitter metallization 124 for the device formed in the first region 104 of the epitaxial layer or layer stack 102 and a separate source/emitter metallization structure 155 and a separate drain/collector metallization structure 157 for the device formed in the second region 106 of the epitaxial layer or layer stack 102, to ensure independent transistor control. According to this embodiment, the contact structure 126 includes a multiple layers of metallization 124, 155, 157.

FIGS. 7A through 7I illustrate cross-sectional views of another embodiment of a method of producing a semiconductor device that includes the isolation structure 108.

Figure 7A:
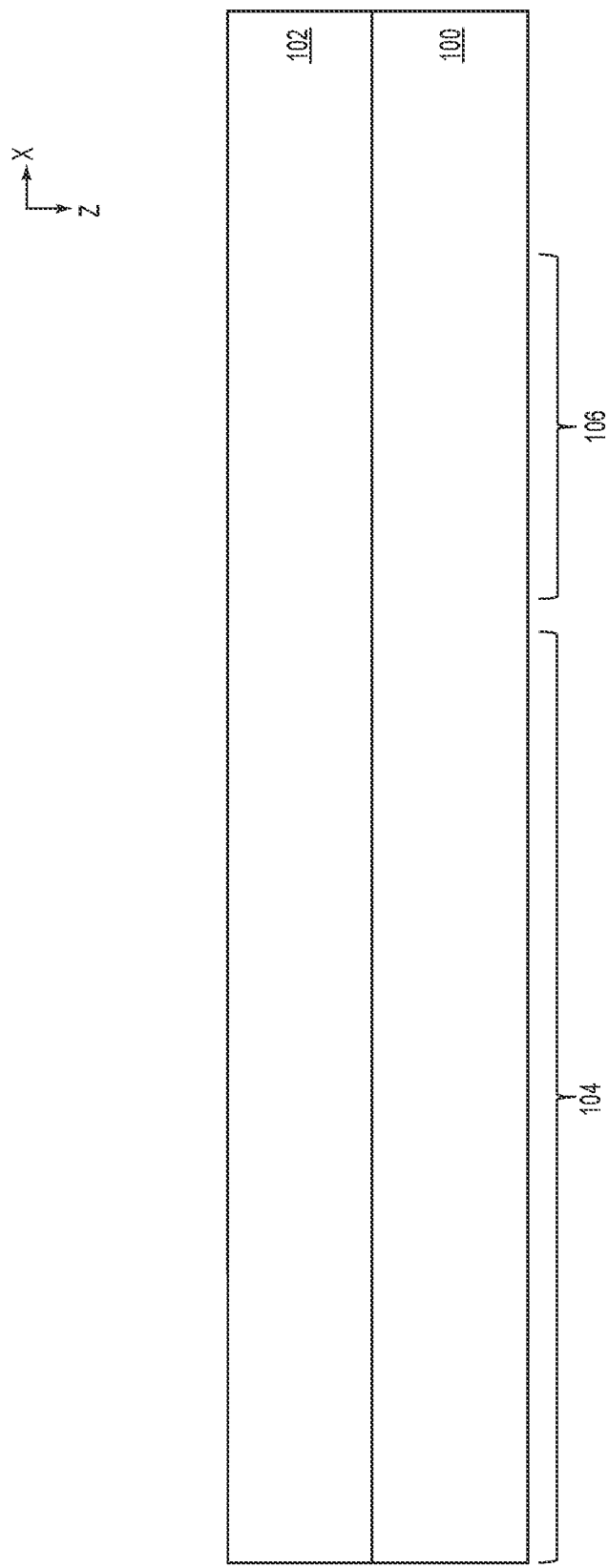
FIGS. 7A through 7I illustrate partial cross-sectional views of another embodiment of a method of producing a semiconductor device that includes the isolation structure.

FIG. 7A shows the semiconductor substrate 100 after growing the epitaxial layer or layer stack 102 on the semiconductor substrate 100. The epitaxial layer or layer stack 102 may be doped or undoped. If doped, the epitaxial layer or layer stack 102 may be doped in situ or ex situ.

Figure 7B:
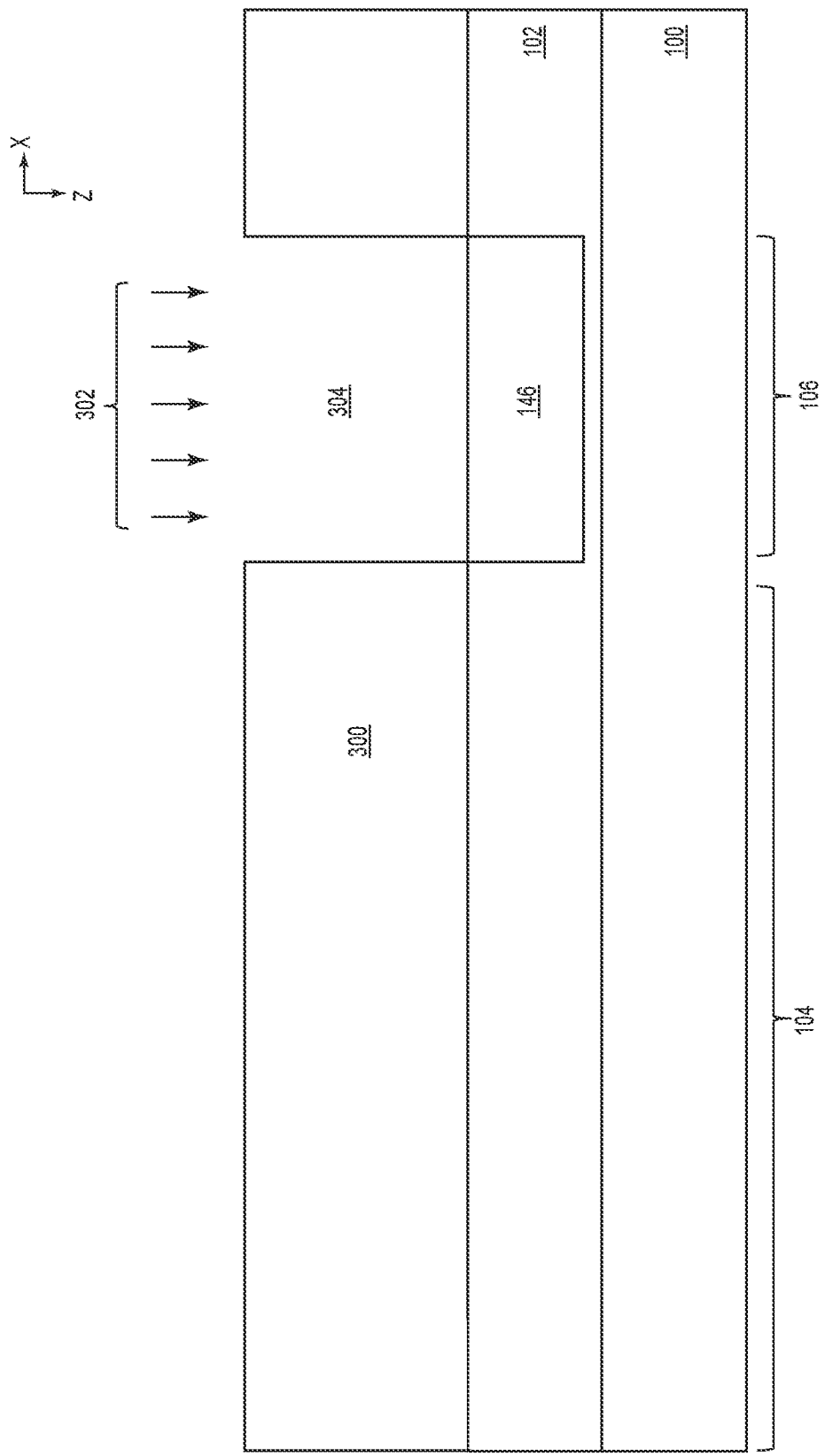

FIG. 7B shows the semiconductor substrate 100 after a mask 300 such as an oxide mask is formed on the epitaxial layer or layer stack 102 and a dopant species 302 is implanted through an opening 304 in the mask 300 to form the drift zone 146 in the second region 106 of the epitaxial layer or layer stack 102. The drift zone 146 in the second region 106 of the epitaxial layer or layer stack 102 may be n-type or p-type, depending on the type of device to be formed in the second region 106 of the epitaxial layer or layer stack 102. For example, if the device to be formed in the second region 106 of the epitaxial layer or layer stack 102 is a p-channel device, the drift zone 146 in the second region 106 of the epitaxial layer or layer stack 102 is p-type and the dopant species 302 may be boron in the case of Si as the epitaxial layer or layer stack 102 or aluminum in the case of SiC as the epitaxial layer or layer stack 102. If the device to be formed in the second region 106 of the epitaxial layer or layer stack 102 is instead an n-channel device, the drift zone 146 in the second region 106 of the epitaxial layer or layer stack 102 is n-type and the dopant species 302 may be phosphorous or arsenic in the case of Si as the epitaxial layer or layer stack 102 or phosphorous or nitrogen in the case of SiC as the epitaxial layer or layer stack 102.

Figure 7C:
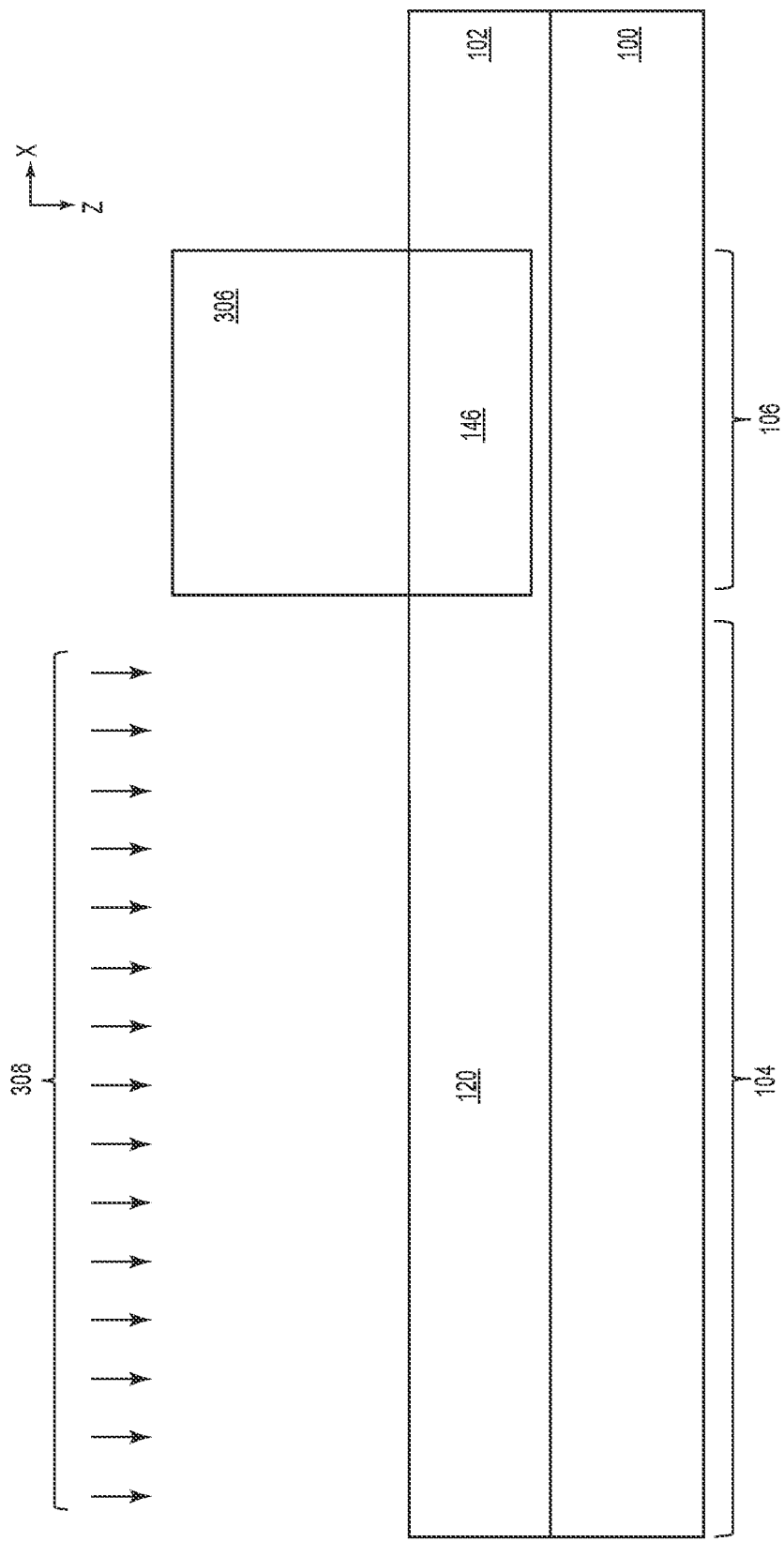

FIG. 7C shows the semiconductor substrate 100 after a second mask 306 such as an oxide mask is formed over the drift zone 146 in the second region 106 of the epitaxial layer or layer stack 102 and a dopant species 308 is implanted into the part of the epitaxial layer or layer stack 102 unprotected by the second mask 306 to form the drift zone 120 in the first region 104 of the epitaxial layer or layer stack 102. The drift zone 120 in the first region 104 of the epitaxial layer or layer stack 102 may be n-type or p-type, depending on the type of device to be formed in the first region 104 of the epitaxial layer or layer stack 102. For example, if the device to be formed in the first region 104 of the epitaxial layer or layer stack 102 is a p-channel device, the drift zone 120 in the first region 104 of the epitaxial layer or layer stack 102 is p-type and the dopant species 308 may be boron in the case of Si as the epitaxial layer or layer stack 102 or aluminum in the case of SiC as the epitaxial layer or layer stack 102. If the device to be formed in the first region 104 of the epitaxial layer or layer stack 102 is instead an n-channel device, the drift zone 120 in the first region 104 of the epitaxial layer or layer stack 102 is n-type and the dopant species 308 may be phosphorous or arsenic in the case of Si as the epitaxial layer or layer stack 102 or phosphorous or nitrogen in the case of SiC as the epitaxial layer or layer stack 102.

Figure 7D:
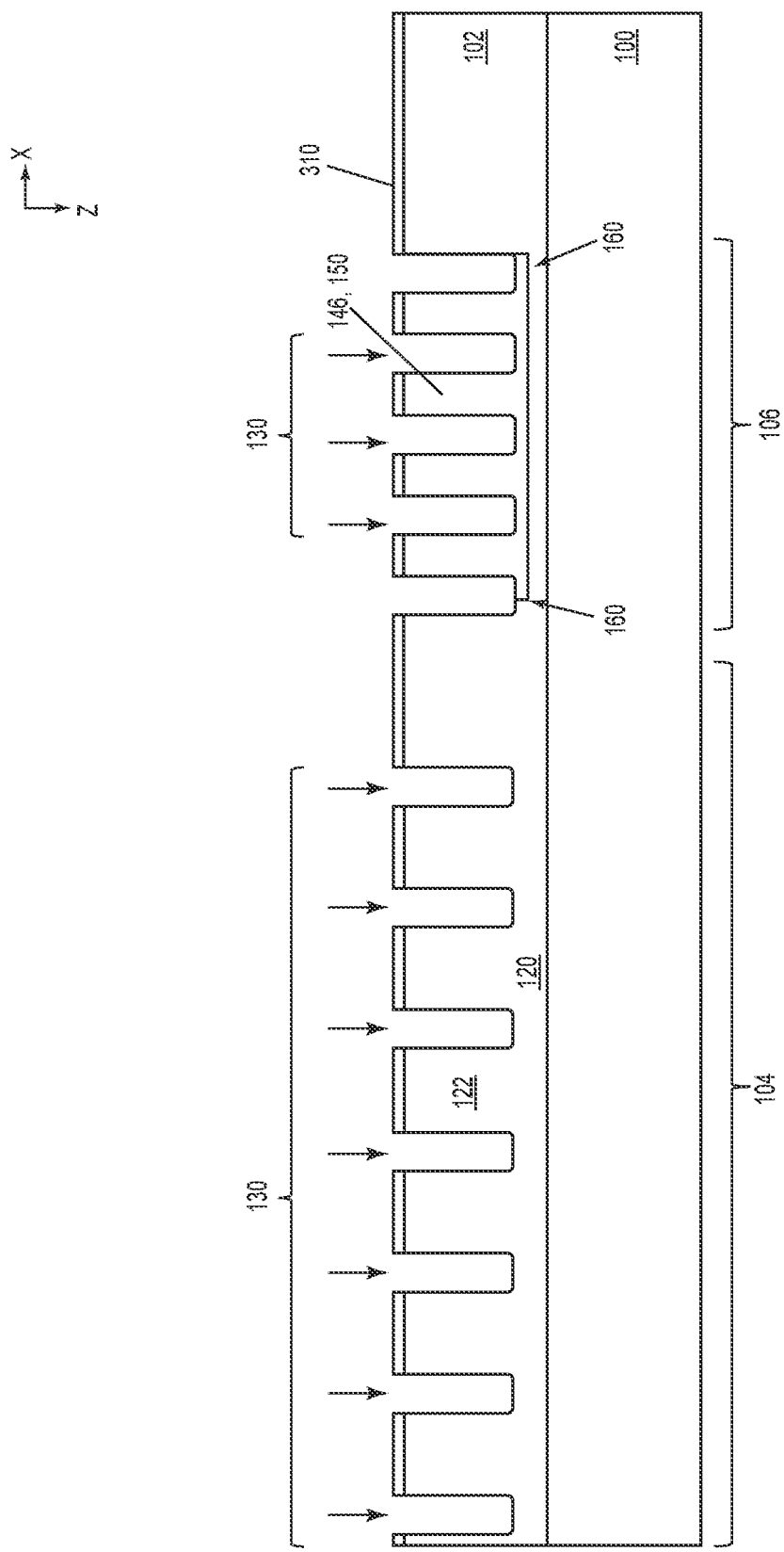

FIG. 7D shows the semiconductor substrate 100 after gate trenches 130 are etched to a first depth D1 into the first and second regions 104, 106 of the epitaxial layer or layer stack 102 via a common etching process. A hard mask 310 such as a nitride mask may be used to etch the trenches 130, 160 into the epitaxial layer or layer stack 102. The gate trenches 130 etched into the first region 104 of the epitaxial layer or layer stack 102 delimit doped semiconductor mesas 122 in the first region 104. The gate trenches 130 etched into the second region 106 of the epitaxial layer or layer stack 102 delimit doped semiconductor mesas 150 in the second region 106. The outermost trench 106 in the second region 106 of the epitaxial layer or layer stack 102 surrounds the other trenches 130 in the second region 106 and laterally delimits the second region 106 of the epitaxial layer or layer stack 102.

Figure 7E:
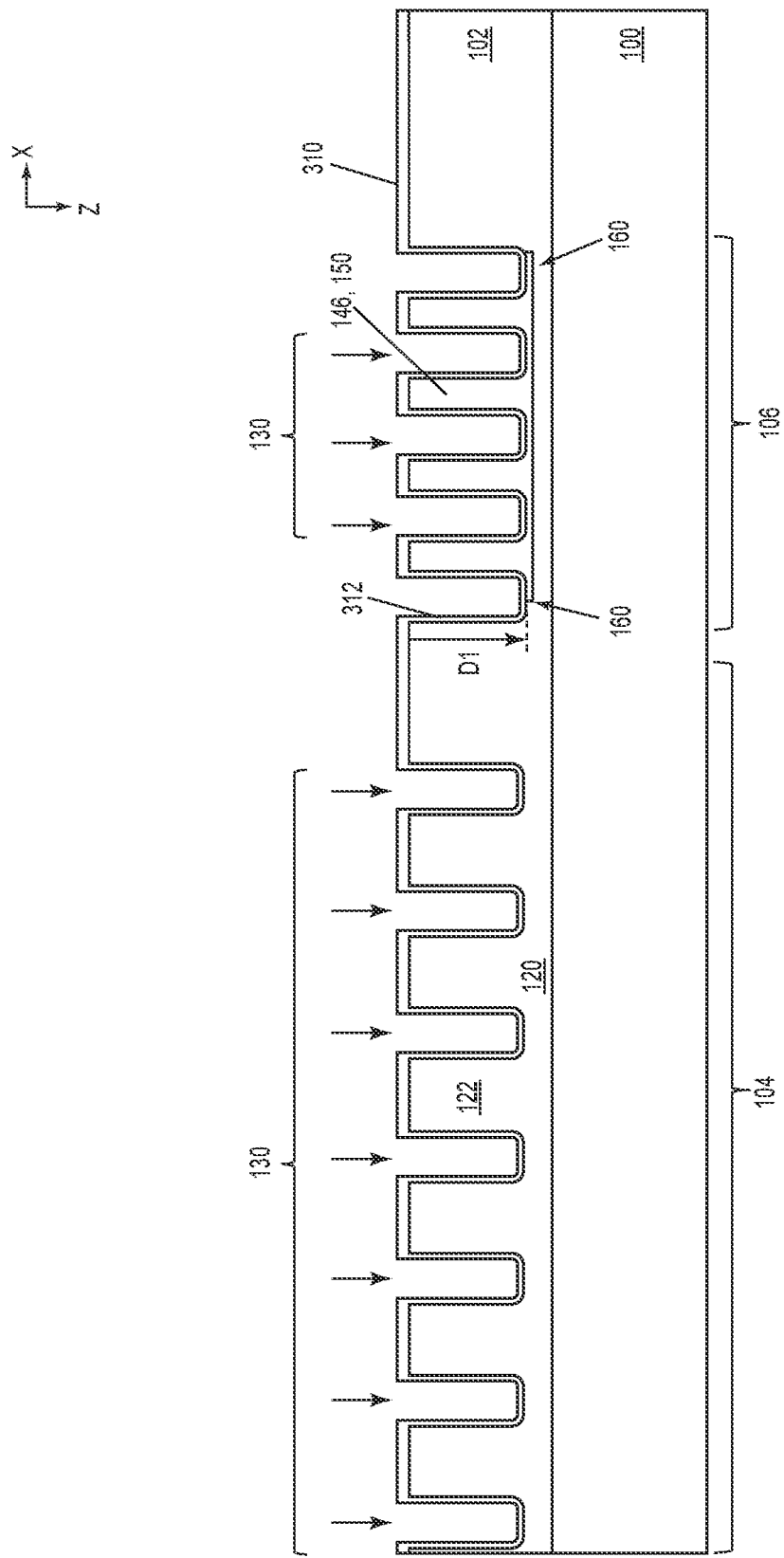

FIG. 7E shows the semiconductor substrate 100 after a nitride spacer film 312 is deposited on the sidewalls and bottom of the trenches 130, 160 previously etched into the epitaxial layer or layer stack 102. A pad oxide (not shown) may be formed under the nitride spacer film 312.

Figure 7F:
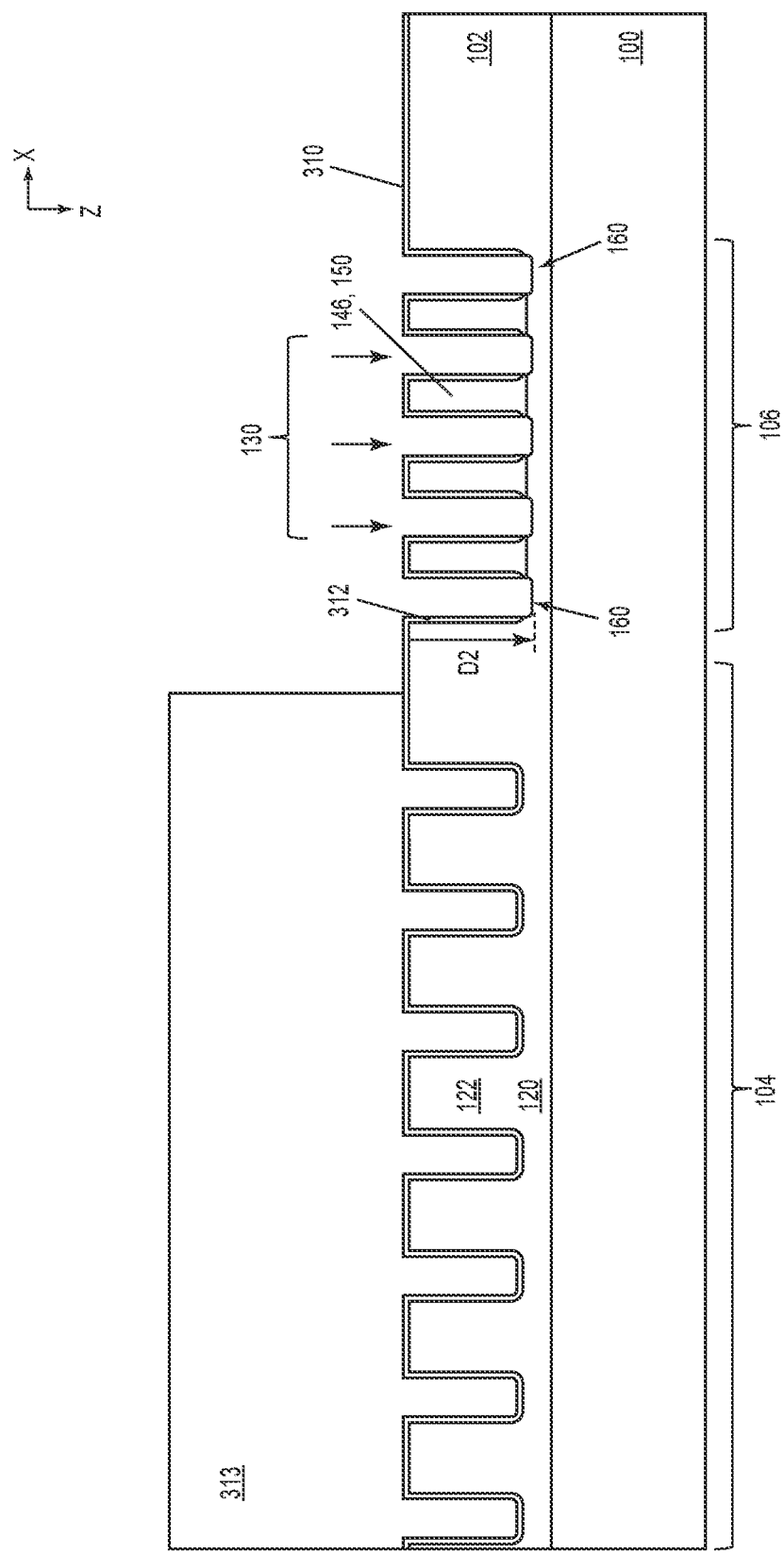

FIG. 7F shows the semiconductor substrate 100 after extending the depth (D2>D1) of the trenches 130, 160 further into the second region 106 of the epitaxial layer or layer stack 102. In one embodiment, a mask 313 such as an oxide mask protects the trenches 130 in the first region 104 of the epitaxial layer or layer stack 102 from the trench extension process. The nitride spacer film 312 is removed from the bottom of the trenches 130, 106 in the second region 106 of the epitaxial layer or layer stack 102. The exposed bottom part of the trenches 130, 106 in the second region 106 are then etched to a second depth D2 in the epitaxial layer or layer stack 102.

Figure 7G:
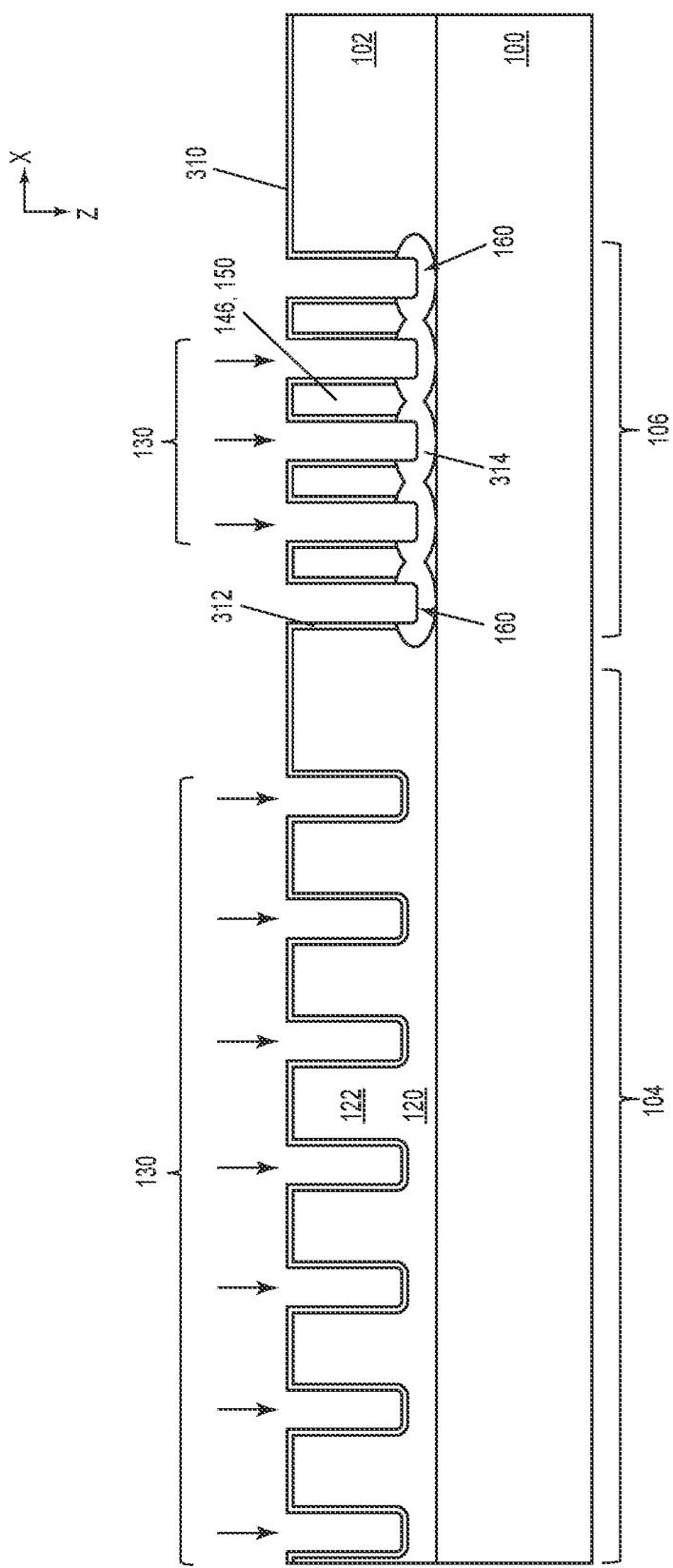

FIG. 7G shows the semiconductor substrate 100 after forming a contiguous region 314 of oxidized semiconductor material along the bottom part of the trenches 130, 160 in the second region 106 of the epitaxial layer or layer stack 102, in an area where the depth of the trenches 130, 160 was previously extended, to form the bottom dielectric part of the isolation structure 108. In the case of Si or SiC as the material of the epitaxial layer or layer stack 102, the contiguous region 314 of oxidized semiconductor material may be formed by LOCOS (LOCal Oxidation of Silicon). The mask 313 may remain in place over the first region 104 of the epitaxial layer or layer stack 102 to prevent LOCOS oxidation of the trenches 130 in the first region 130.

Figure 7H:
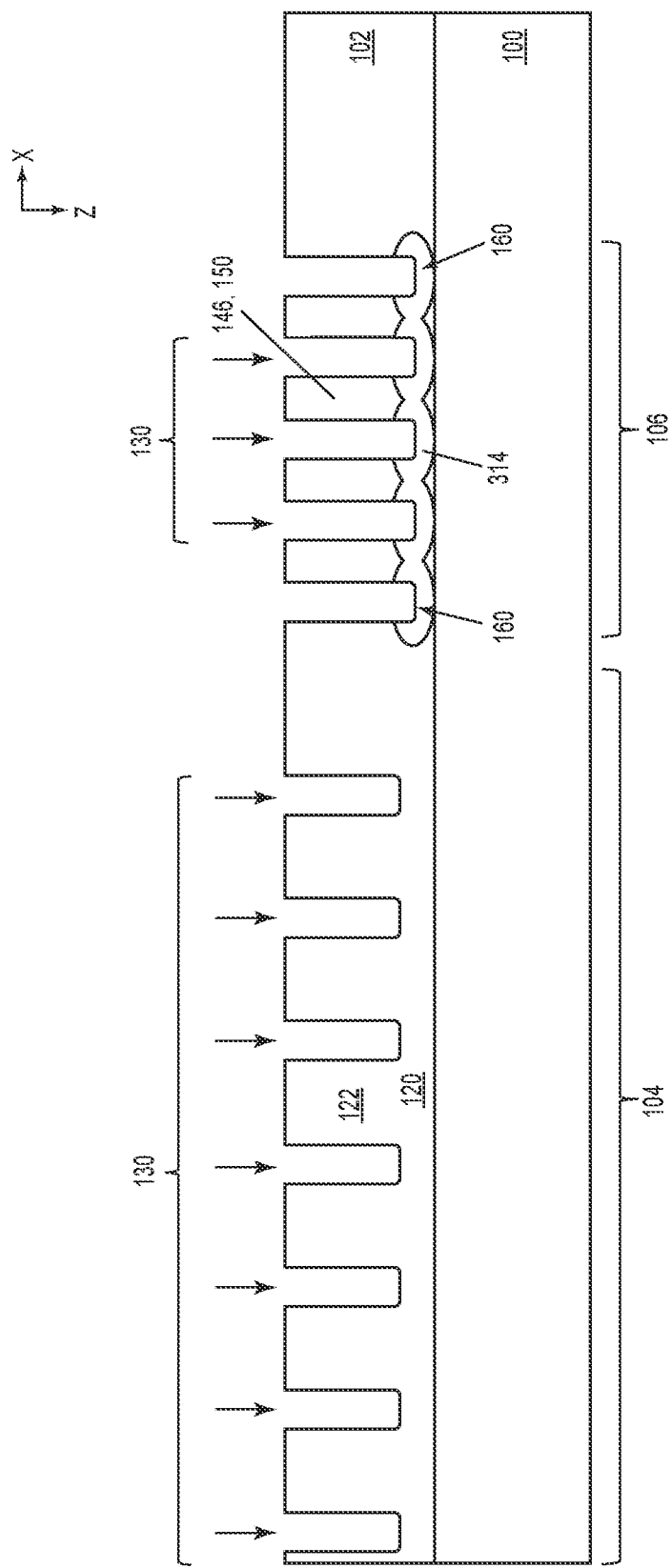

FIG. 7H shows the semiconductor substrate 100 after removal of the nitride hard mask 310 and spacer film 312. Processing may continue as shown in FIGS. 6G through 6O, to produce the device shown in FIG. 7I.

Figure 7I:
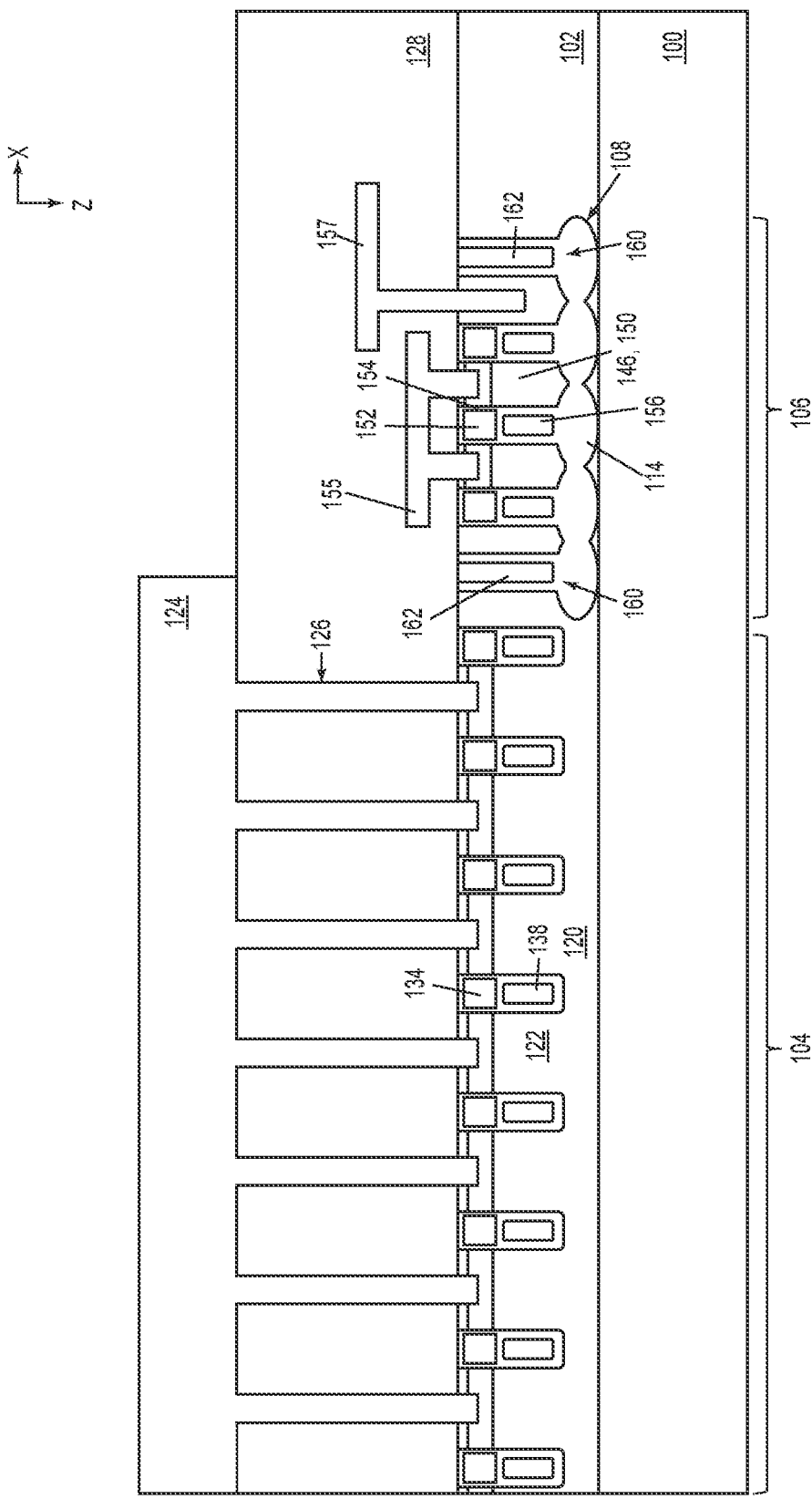

In FIG. 7I, the oxide 154, 158 formed on the sidewalls of the trenches 130, 162 in the second region 106 of the epitaxial layer or layer stack 102 connects to the contiguous region 314 of oxidized semiconductor material to complete the dielectric material 114 of the isolation structure 108. Also, the electrode 162 in the central part of the outermost trench 160 in the second region 106 of the epitaxial layer or layer stack 102 is separated from the epitaxial layer or layer stack 102 by the sidewall oxide layer 158 and the contiguous region 314 of oxidized semiconductor material.

FIGS. 8A through 8F illustrate cross-sectional views of another embodiment of a method of producing a semiconductor device that includes the isolation structure 108.

Figure 8A:
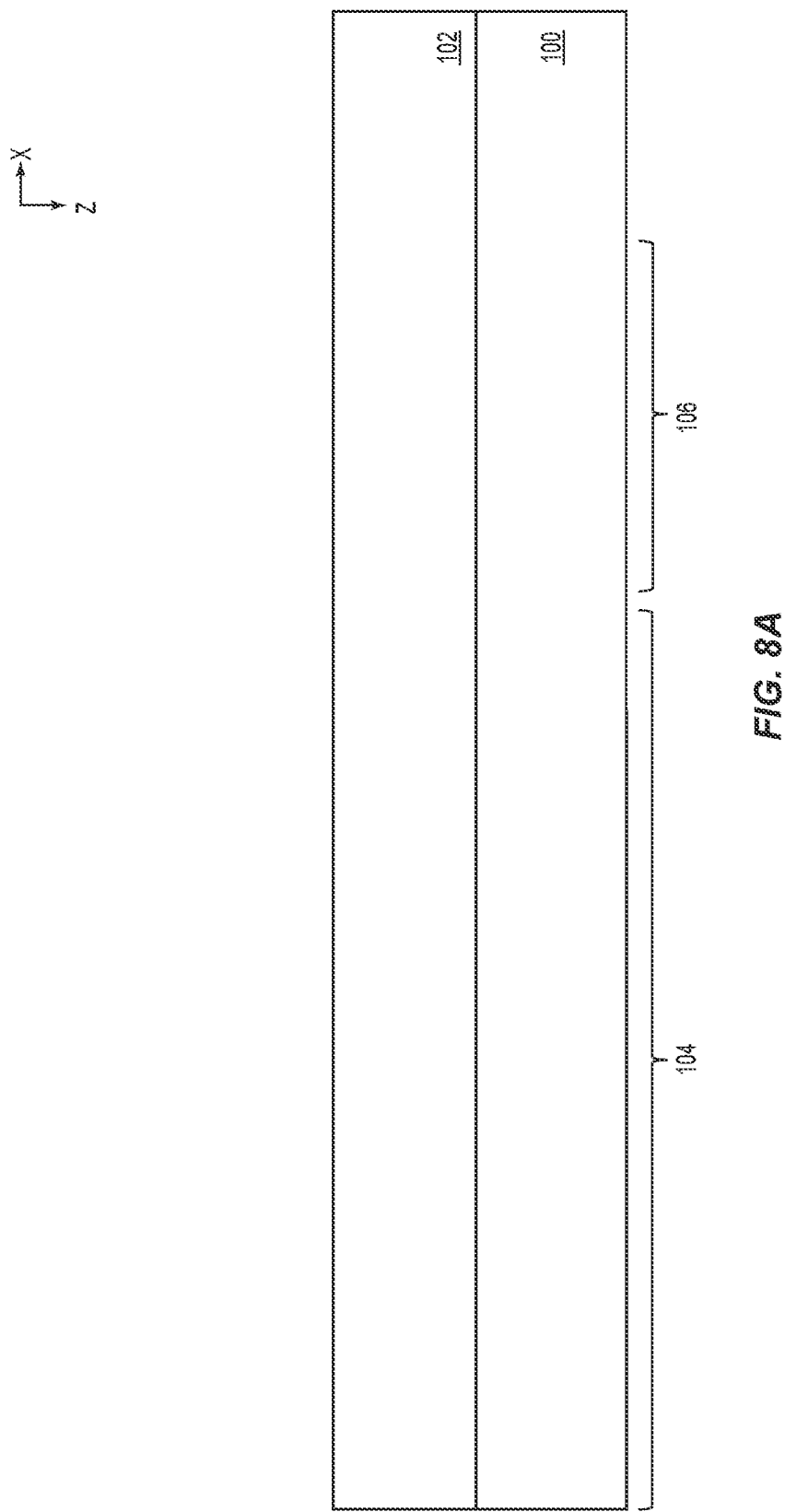
FIGS. 8A through 8F illustrate partial cross-sectional views of another embodiment of a method of producing a semiconductor device that includes the isolation structure.

FIG. 8A shows the semiconductor substrate 100 after growing the epitaxial layer or layer stack 102 on the semiconductor substrate 100. The epitaxial layer or layer stack 102 may be doped or undoped. If doped, the epitaxial layer or layer stack 102 may be doped in situ or ex situ.

Figure 8B:
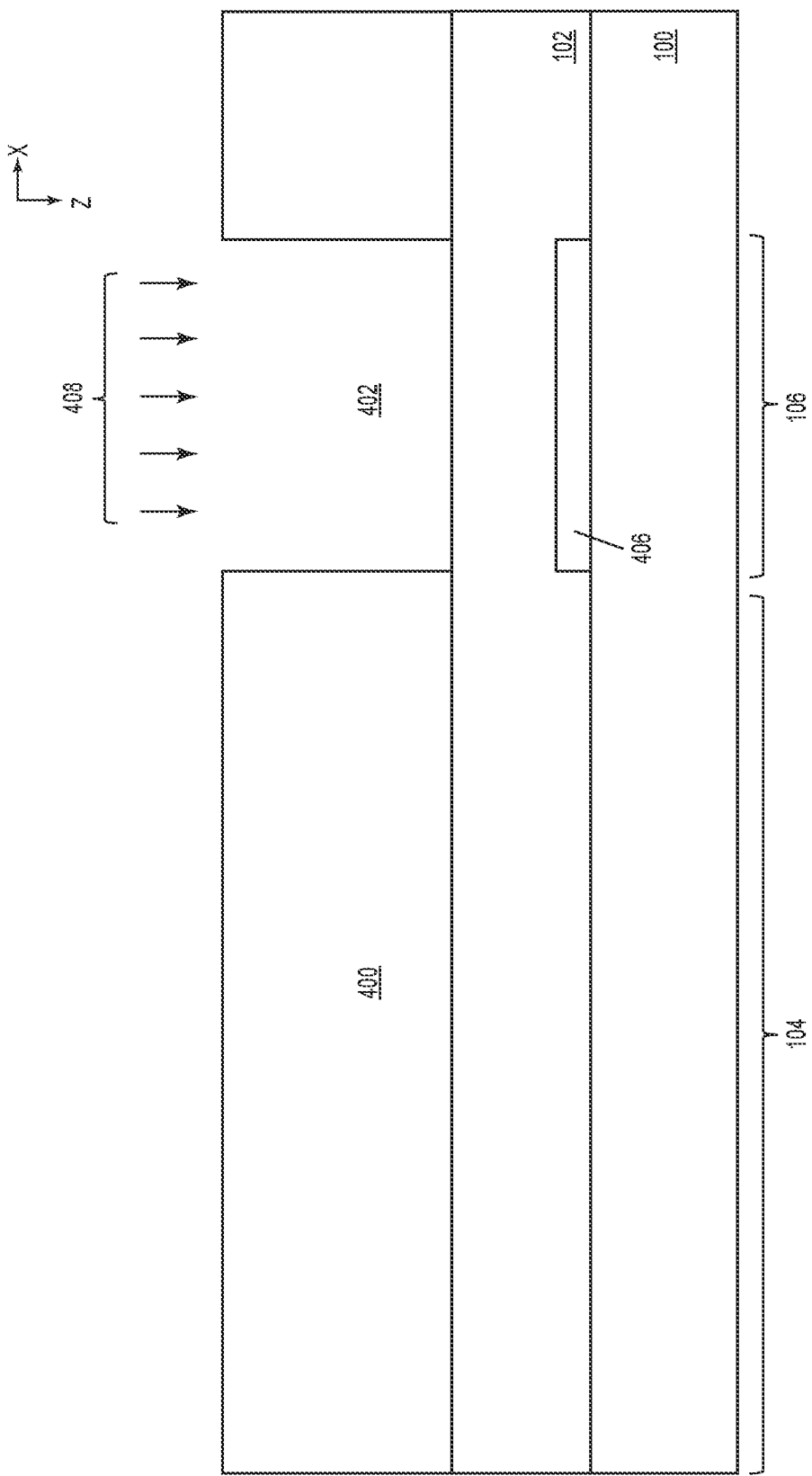

FIG. 8B shows the semiconductor substrate 100 after a mask 400 such as an oxide mask is formed on the epitaxial layer or layer stack 102. The mask 400 covers the first region 104 of the epitaxial layer or layer stack 102 and has an opening 402 that exposes the second region 106 of the epitaxial layer or layer stack 102. Oxygen atoms 404 are implanted into the second region 106 of the epitaxial layer or layer stack 102 through the opening 402 in the mask 400 to form a buried oxide layer 406 in the second region 106 of the epitaxial layer or layer stack 102.

Figure 8C:
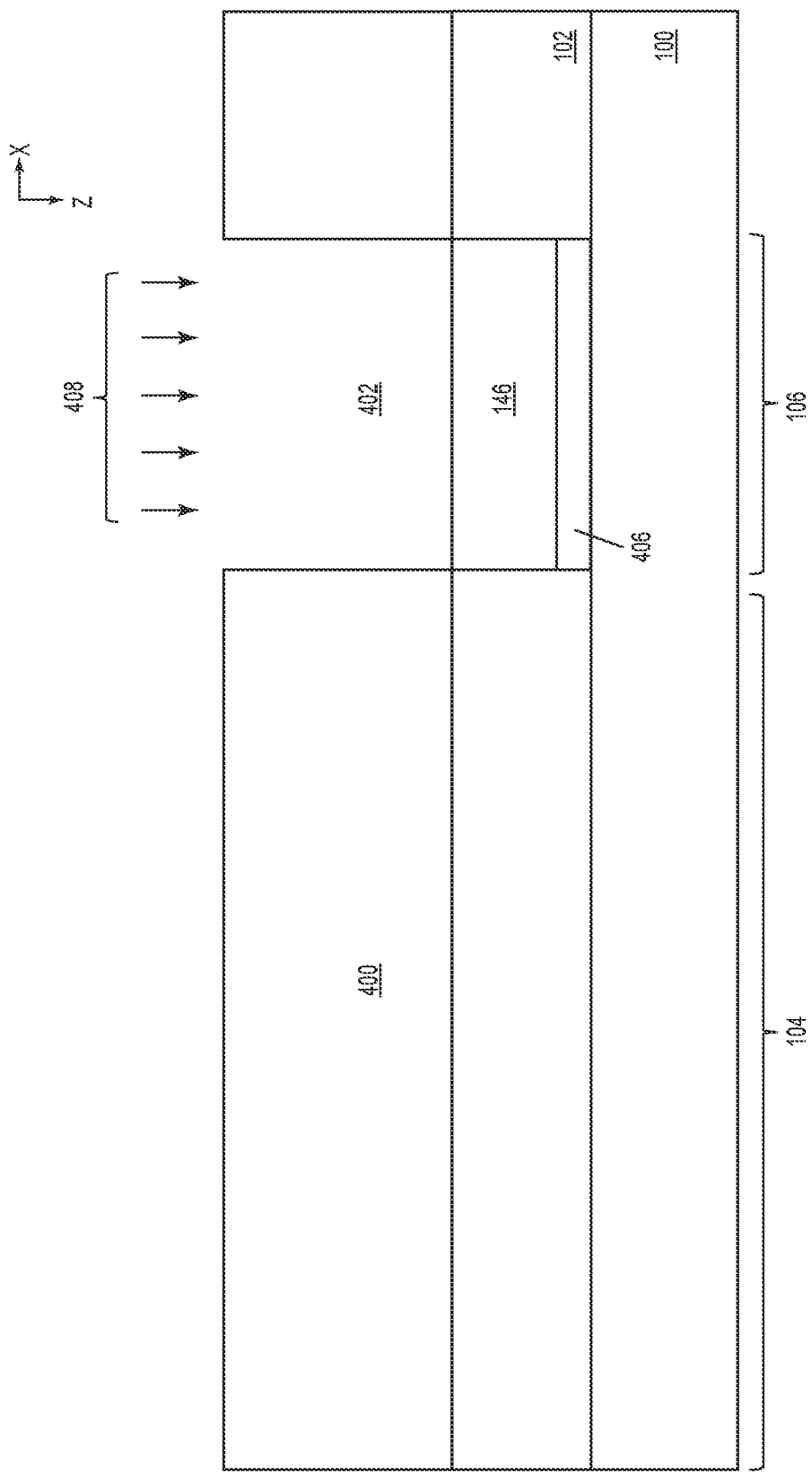

FIG. 8C shows the semiconductor substrate 100 during implantation of a dopant species 408 through the opening 402 in the mask 400 to form the drift zone 146 in the second region 106 of the epitaxial layer or layer stack 102. The drift zone 146 in the second region 106 of the epitaxial layer or layer stack 102 may be n-type or p-type, depending on the type of device to be formed in the second region 106 of the epitaxial layer or layer stack 102. For example, if the device to be formed in the second region 106 of the epitaxial layer or layer stack 102 is a p-channel device, the drift zone 146 in the second region 106 of the epitaxial layer or layer stack 102 is p-type and the dopant species 408 may be boron in the case of Si as the epitaxial layer or layer stack 102 or aluminum in the case of SiC as the epitaxial layer or layer stack 102. If the device to be formed in the second region 106 of the epitaxial layer or layer stack 102 is instead an n-channel device, the drift zone 146 in the second region 106 of the epitaxial layer or layer stack 102 is n-type and the dopant species 408 may be phosphorous or arsenic in the case of Si as the epitaxial layer or layer stack 102 or phosphorous or nitrogen in the case of SiC as the epitaxial layer or layer stack 102.

Figure 8D:
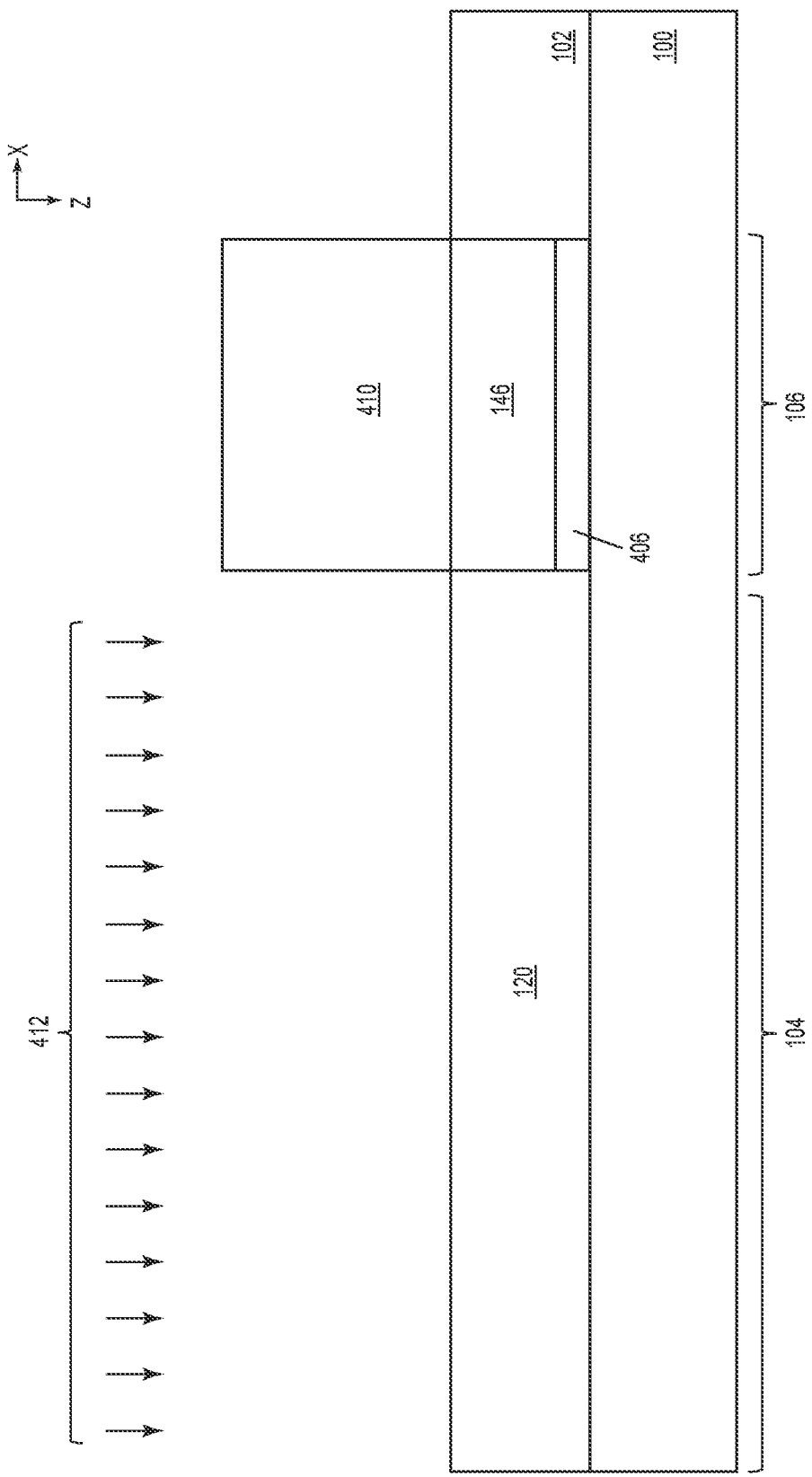

FIG. 8D shows the semiconductor substrate 100 after a second mask 410 such as an oxide mask is formed over the drift zone 146 in the second region 106 of the epitaxial layer or layer stack 102 and a dopant species 412 is implanted into the part of the epitaxial layer or layer stack 102 unprotected by the second mask 410 to form the drift zone 120 in the first region 104 of the epitaxial layer or layer stack 102. The drift zone 120 in the first region 104 of the epitaxial layer or layer stack 102 may be n-type or p-type, depending on the type of device to be formed in the first region 104 of the epitaxial layer or layer stack 102. For example, if the device to be formed in the first region 104 of the epitaxial layer or layer stack 102 is a p-channel device, the drift zone 120 in the first region 104 of the epitaxial layer or layer stack 102 is p-type and the dopant species 412 may be boron in the case of Si as the epitaxial layer or layer stack 102 or aluminum in the case of SiC as the epitaxial layer or layer stack 102. If the device to be formed in the first region 104 of the epitaxial layer or layer stack 102 is instead an n-channel device, the drift zone 120 in the first region 104 of the epitaxial layer or layer stack 102 is n-type and the dopant species 412 may be phosphorous or arsenic in the case of Si as the epitaxial layer or layer stack 102 or phosphorous or nitrogen in the case of SiC as the epitaxial layer or layer stack 102.

Figure 8E:
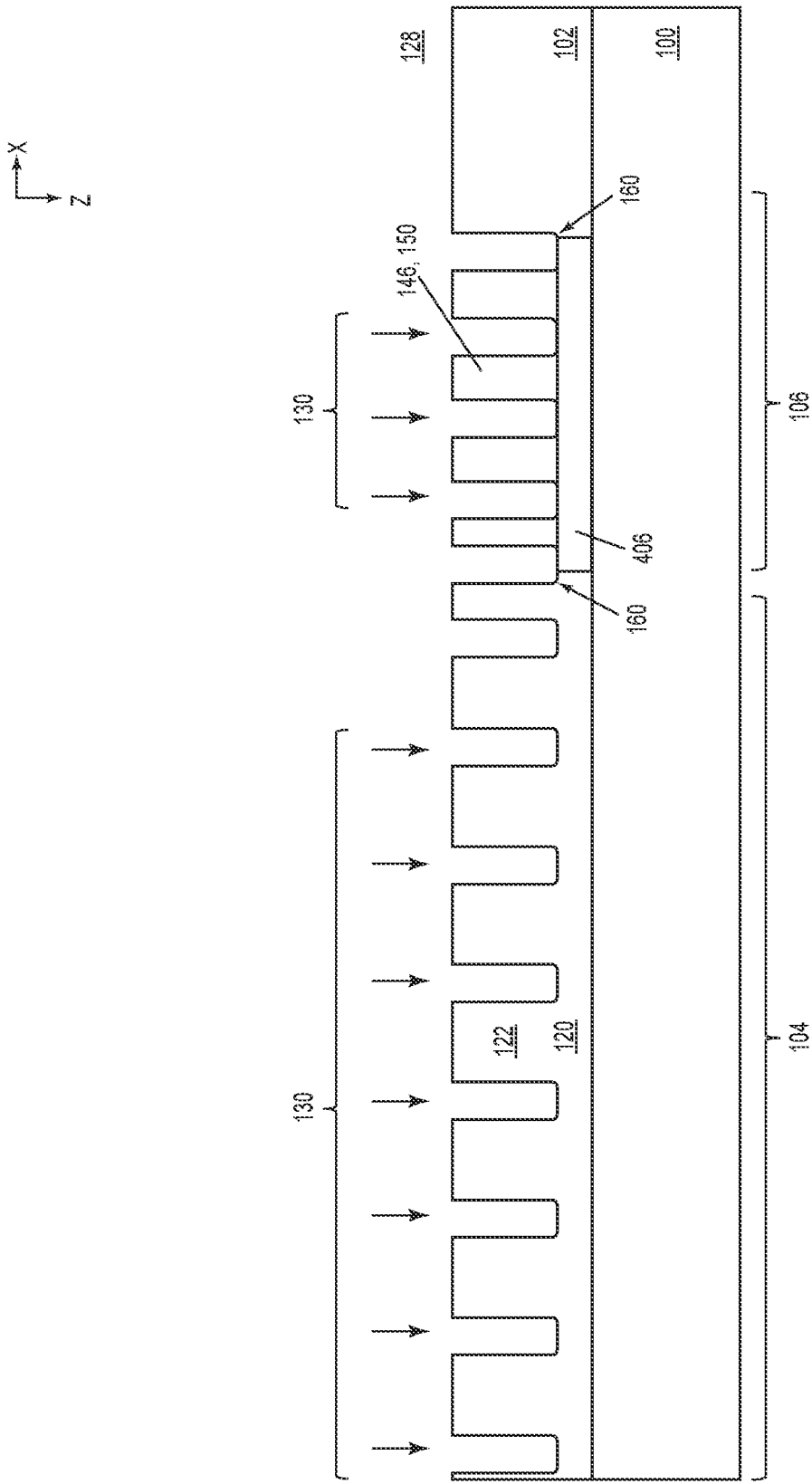

FIG. 8E shows the semiconductor substrate 100 after gate trenches 130 are etched into the first and second regions 104, 106 of the epitaxial layer or layer stack 102 via a common etching process. The gate trenches 130 etched into the first region 104 of the epitaxial layer or layer stack 102 delimit doped semiconductor mesas 122 in the first region 104. The gate trenches 130 etched into the second region 106 of the epitaxial layer or layer stack 102 delimit doped semiconductor mesas 150 in the second region 106. The outermost trench 160 in the second region 106 of the epitaxial layer or layer stack 102 surrounds the other trenches 130 in the second region 106 and laterally delimits the second region 106 of the epitaxial layer or layer stack 102. Processing may continue as shown in FIGS. 6G through 6O, to produce the device shown in FIG. 8F.

Figure 8F:
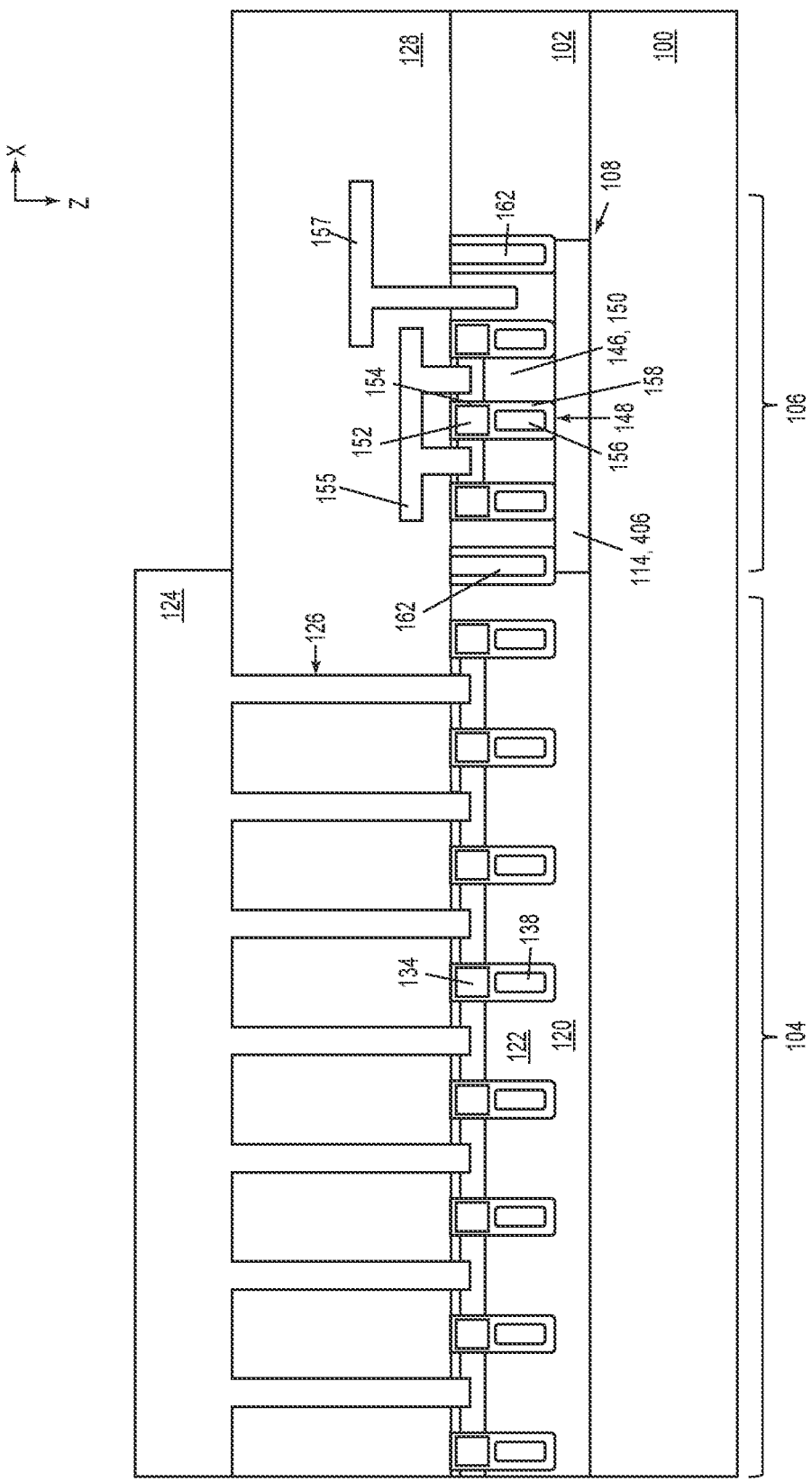

In FIG. 8F, the oxide 154, 158 formed on the sidewalls of the trenches 148, 160 in the second region 106 of the epitaxial layer or layer stack 102 connects to the buried oxide layer 406 to form the dielectric material 114 of the isolation structure 108, Also, the electrode 162 in the central part of the outermost trench 160 in the second region 106 of the epitaxial layer or layer stack 102 is separated from the epitaxial layer or layer stack 102 by the sidewall oxide layer 158 and the buried oxide layer 406.

FIGS. 9A through 9E illustrate cross-sectional views of another embodiment of a method of producing a semiconductor device that includes the isolation structure 108.

Figure 9A:
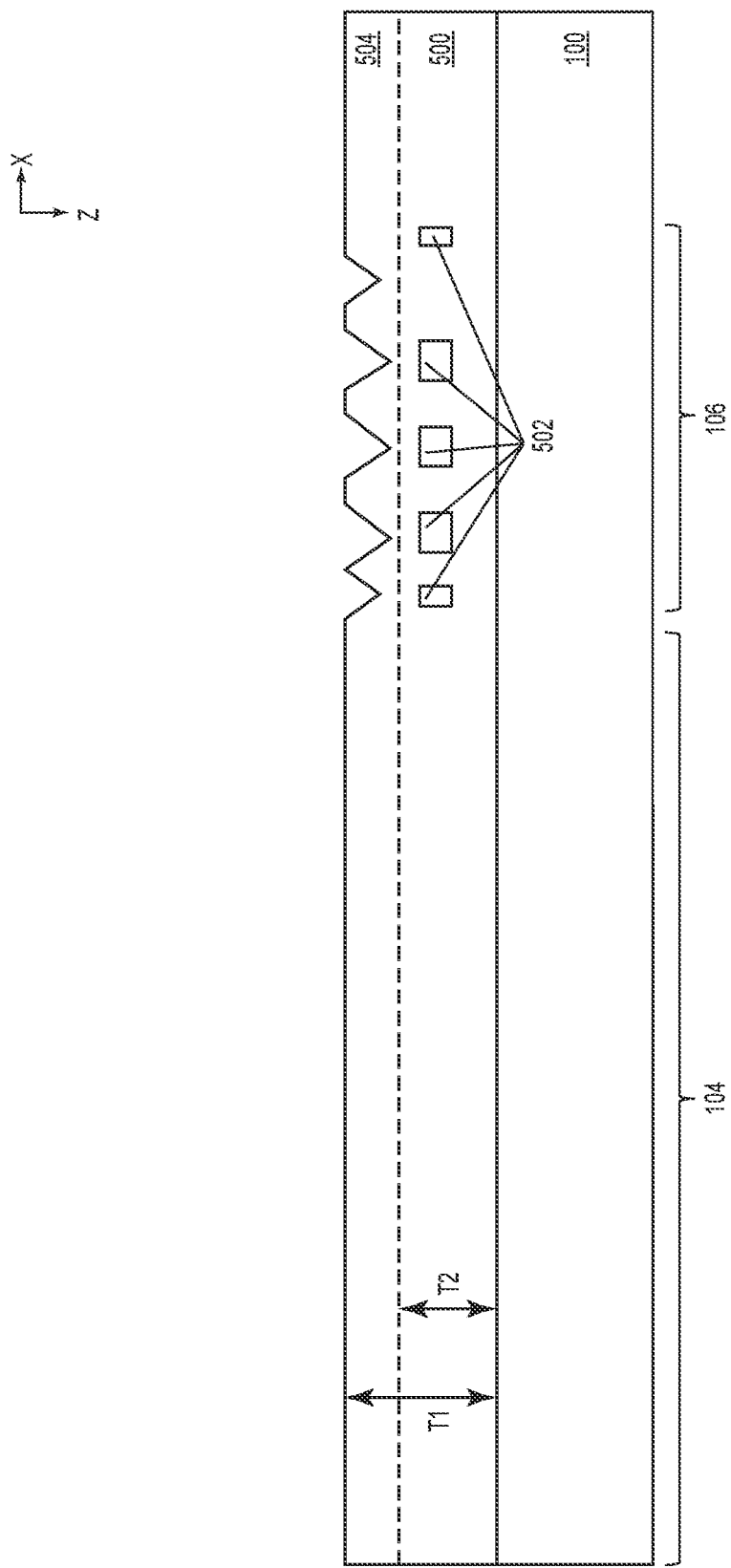
FIGS. 9A through 9E illustrate partial cross-sectional views of another embodiment of a method of producing a semiconductor device that includes the isolation structure.

FIG. 9A shows the semiconductor substrate 100 after growing a first epitaxial layer 500 of the epitaxial layer or layer stack 102 on the semiconductor substrate 100, forming oxide islands 502 in the first epitaxial layer 500, and forming a first selective epitaxial overgrowth layer 504 that covers the oxide islands 502, e.g., as described herein in connection with FIGS. 6A through 6C.

Figure 9B:
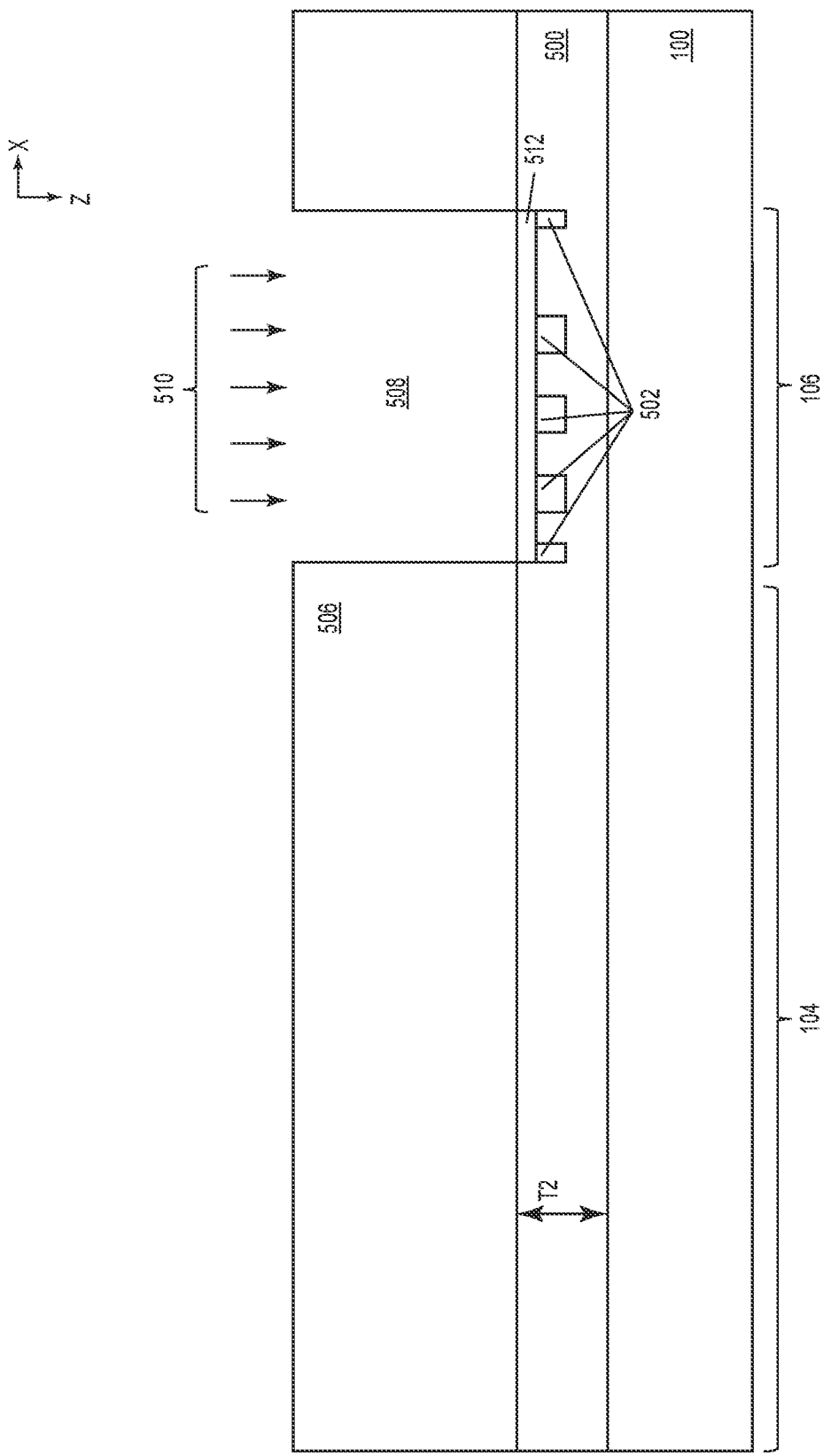

FIG. 9B shows the first selective epitaxial overgrowth layer 504 planarized from a thickness T1 to a thickness T2, e.g., by CMP and a mask 506 such as an oxide mask formed on the planarized epitaxial overgrowth layer 504. The mask 506 has an opening 508 that exposes an area of the planarized epitaxial overgrowth layer 504 vertically aligned with the oxide islands 502. Dopant atoms 510 are implanted into the planarized epitaxial overgrowth layer 504 through the opening 508 in the mask 506 to form a doped buried layer 512 above the oxide islands 502. In one embodiment, the device to be formed in the second region 106 of the epitaxial layer or layer stack 102 is a p-channel device and the implanted dopant atoms 510 are boron for a Si-based device. In the case of an n-channel device, the implanted dopant atoms 510 may be arsenic or phosphorous for a Si-based device.

Figure 9C:
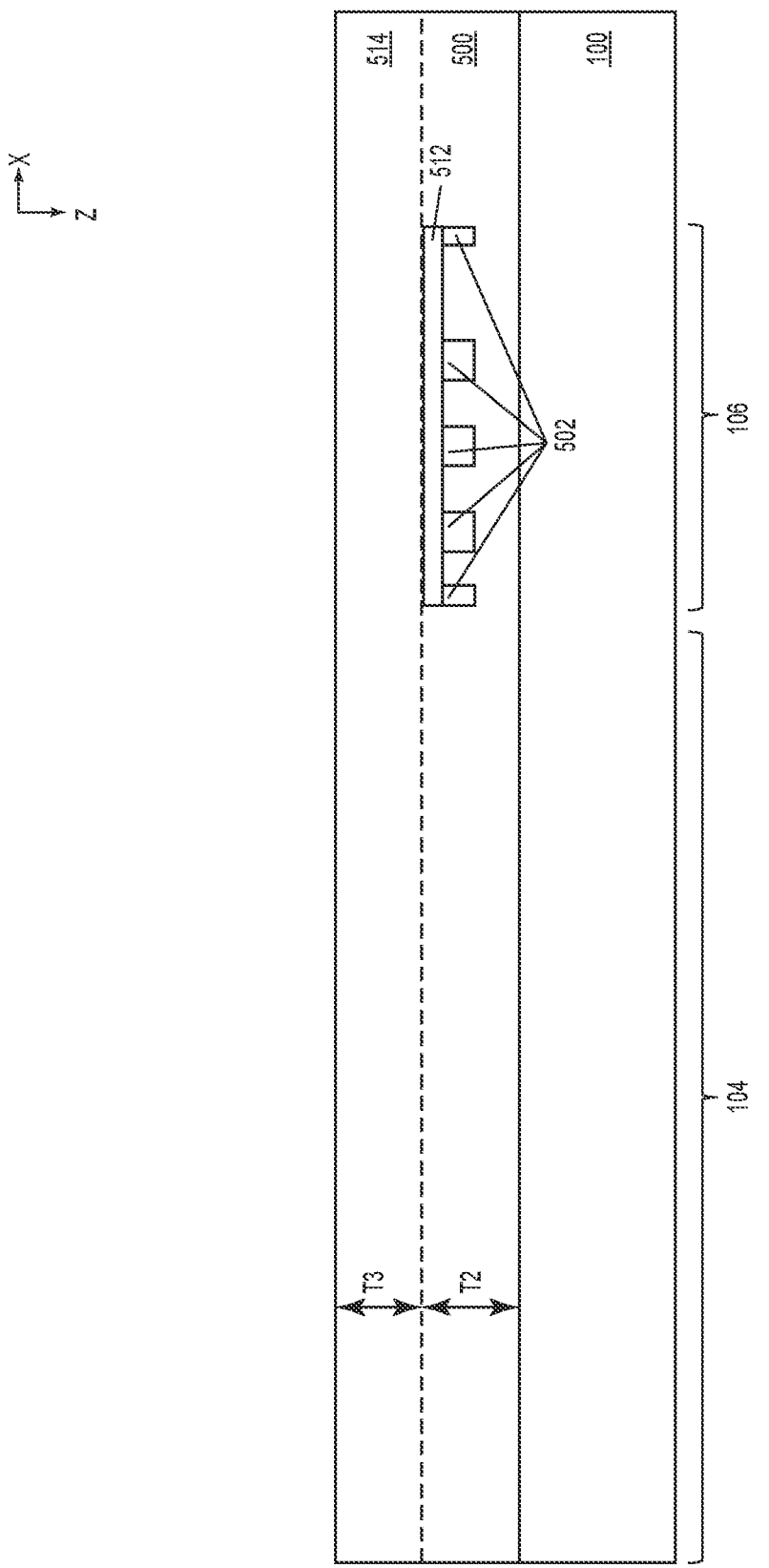

FIG. 9C shows the semiconductor substrate 100 after growing a second epitaxial layer 514 of the epitaxial layer or layer stack 102 on the planarized epitaxial overgrowth layer 504. The second epitaxial layer 514 has a thickness T3.

Figure 9D:
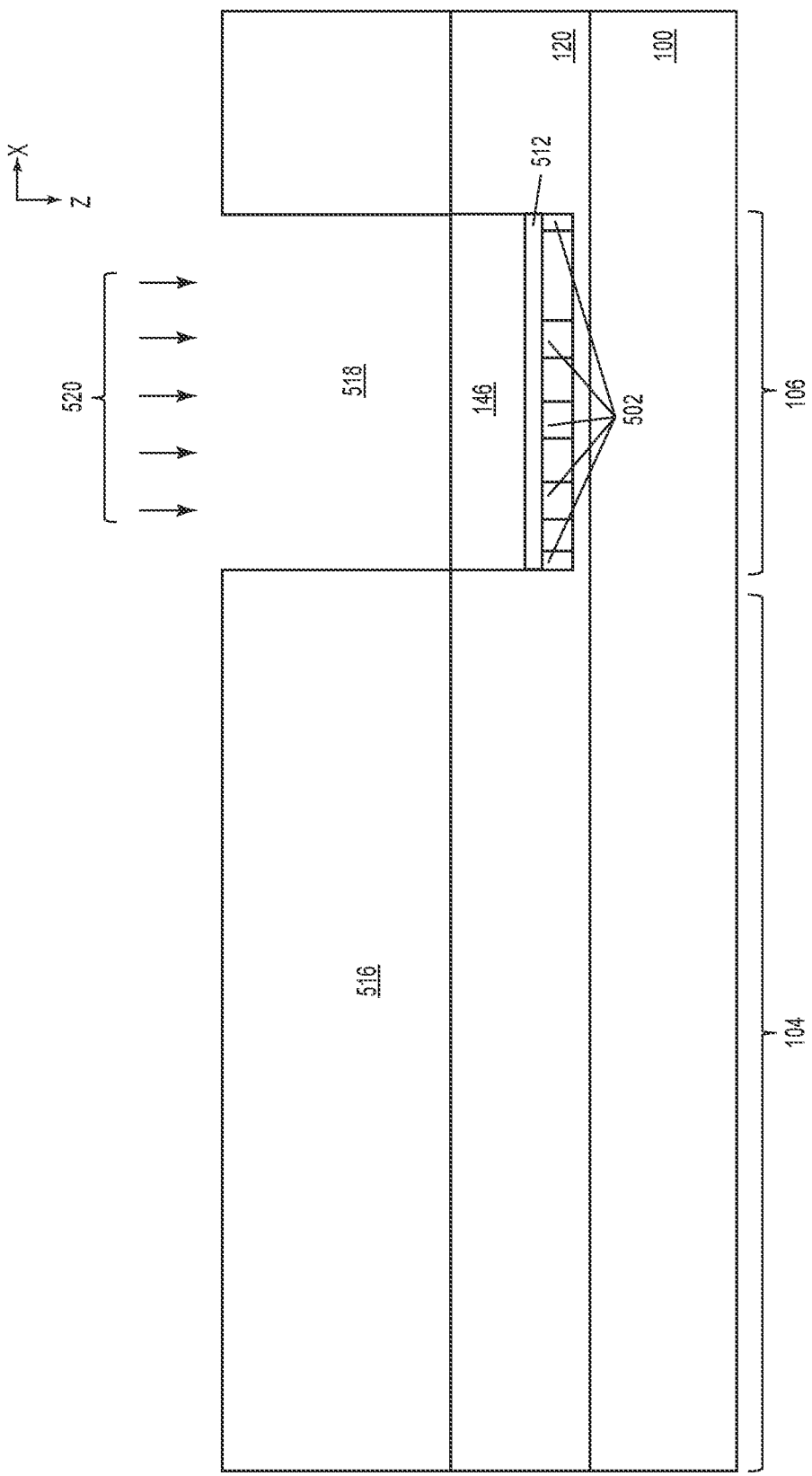

FIG. 9D shows the semiconductor substrate 100 after forming a mask 516 such as an oxide mask on the second epitaxial layer 514. The mask 516 covers the first region 104 of the epitaxial layer or layer stack 102 and has an opening 518 that exposes the second region 106 of the epitaxial layer or layer stack 102. A dopant species 520 is implanted through the opening 518 in the mask 516 to form the drift zone 146 in the second region 106 of the epitaxial layer or layer stack 102. The drift zone 146 in the second region 106 of the epitaxial layer or layer stack 102 may be n-type or p-type, depending on the type of device to be formed in the second region 106 of the epitaxial layer or layer stack 102. For example, if the device to be formed in the second region 106 of the epitaxial layer or layer stack 102 is a p-channel device, the drift zone 146 in the second region 106 of the epitaxial layer or layer stack 102 is p-type and the dopant species 520 may be boron in the case of Si as the epitaxial layer or layer stack 102 or aluminum in the case of SiC as the epitaxial layer or layer stack 102. If the device to be formed in the second region 106 of the epitaxial layer or layer stack 102 is instead an n-channel device, the drift zone 146 in the second region 106 of the epitaxial layer or layer stack 102 is n-type and the dopant species 520 may be phosphorous or arsenic in the case of Si as the epitaxial layer or layer stack 102 or phosphorous or nitrogen in the case of SiC as the epitaxial layer or layer stack 102. Processing may continue as shown in FIGS. 6E through 6O, to produce the device shown in FIG. 9E.

Figure 9E:
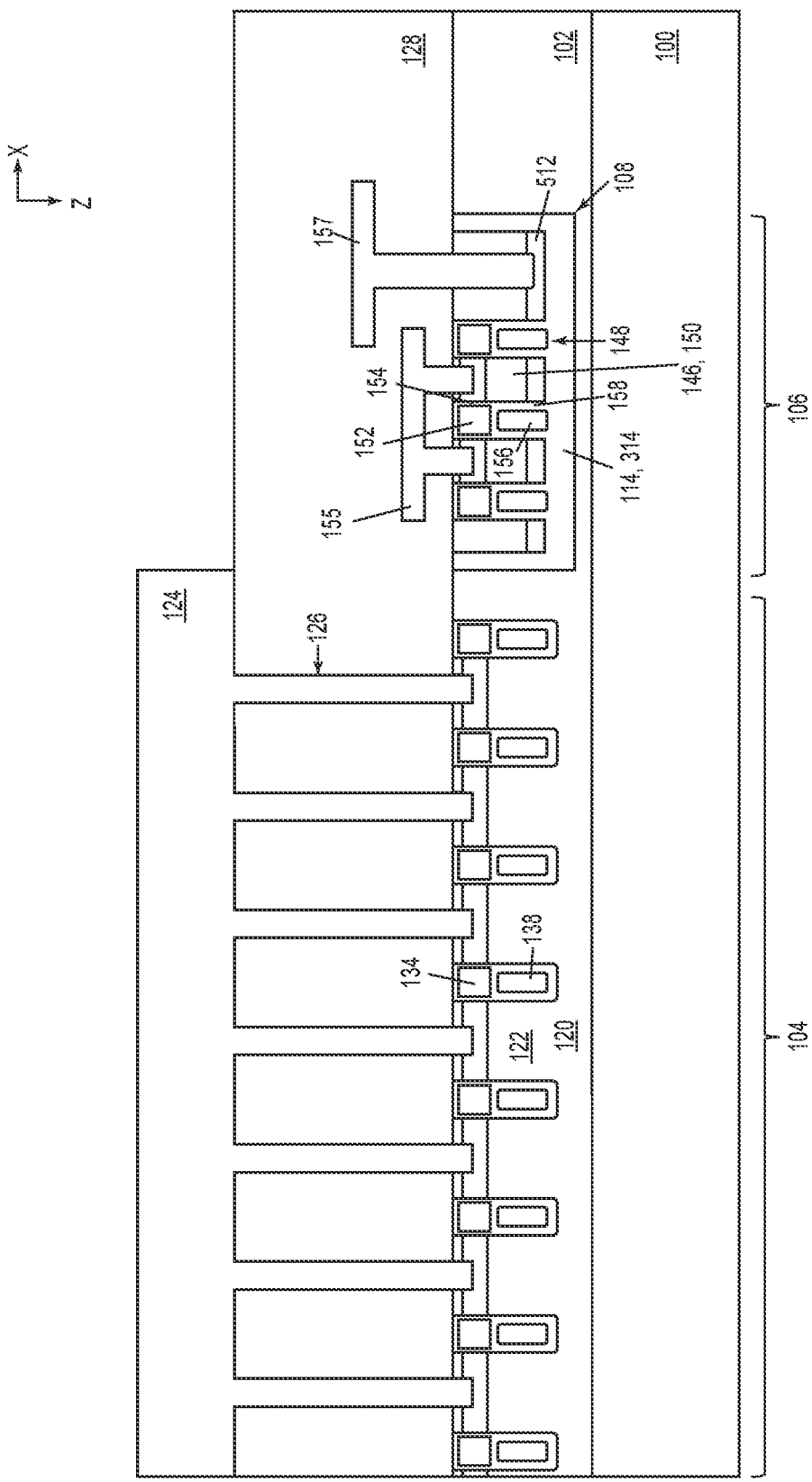

In FIG. 9E, a contiguous region 314 of oxidized semiconductor material is formed along the bottom part of the trenches 130, 160 in the second region 106 of the epitaxial layer or layer stack 102, e.g., by a LOCOS process. The oxide 154, 158 formed on the sidewalls of the trenches 148, 160 in the second region 106 of the epitaxial layer or layer stack 102 connects to the contiguous region 314 of oxidized semiconductor material to form the dielectric material 114 of the isolation structure 108. The doped buried layer 512 increases the doping concentration in the second region 106 of the epitaxial layer or layer stack 102 in an area of the second region 106 that adjoins the dielectric material 114 at the bottom of the isolation structure 108.

Figure 10A:
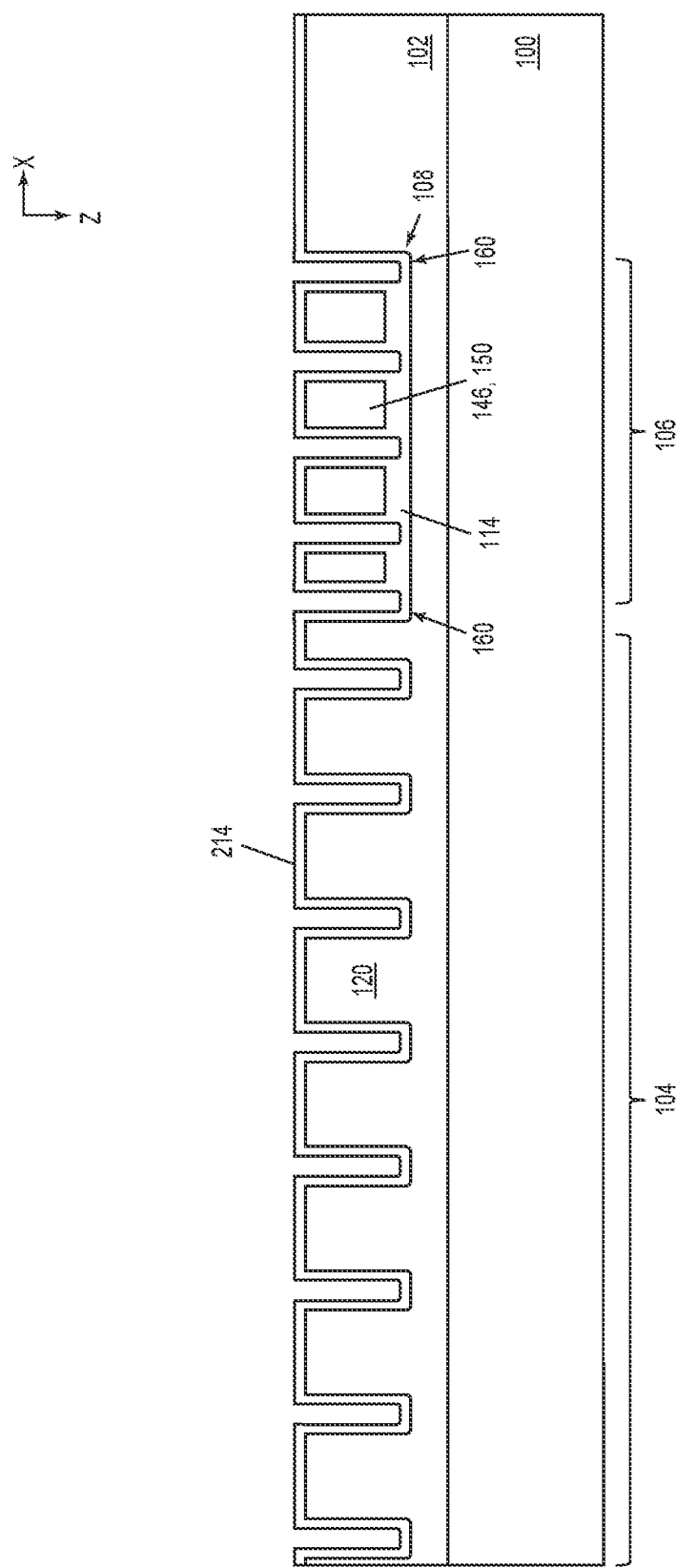
FIGS. 10A through 10C illustrate partial cross-sectional views of another embodiment of a method of producing a semiconductor device that includes the isolation structure.
Figure 10B:
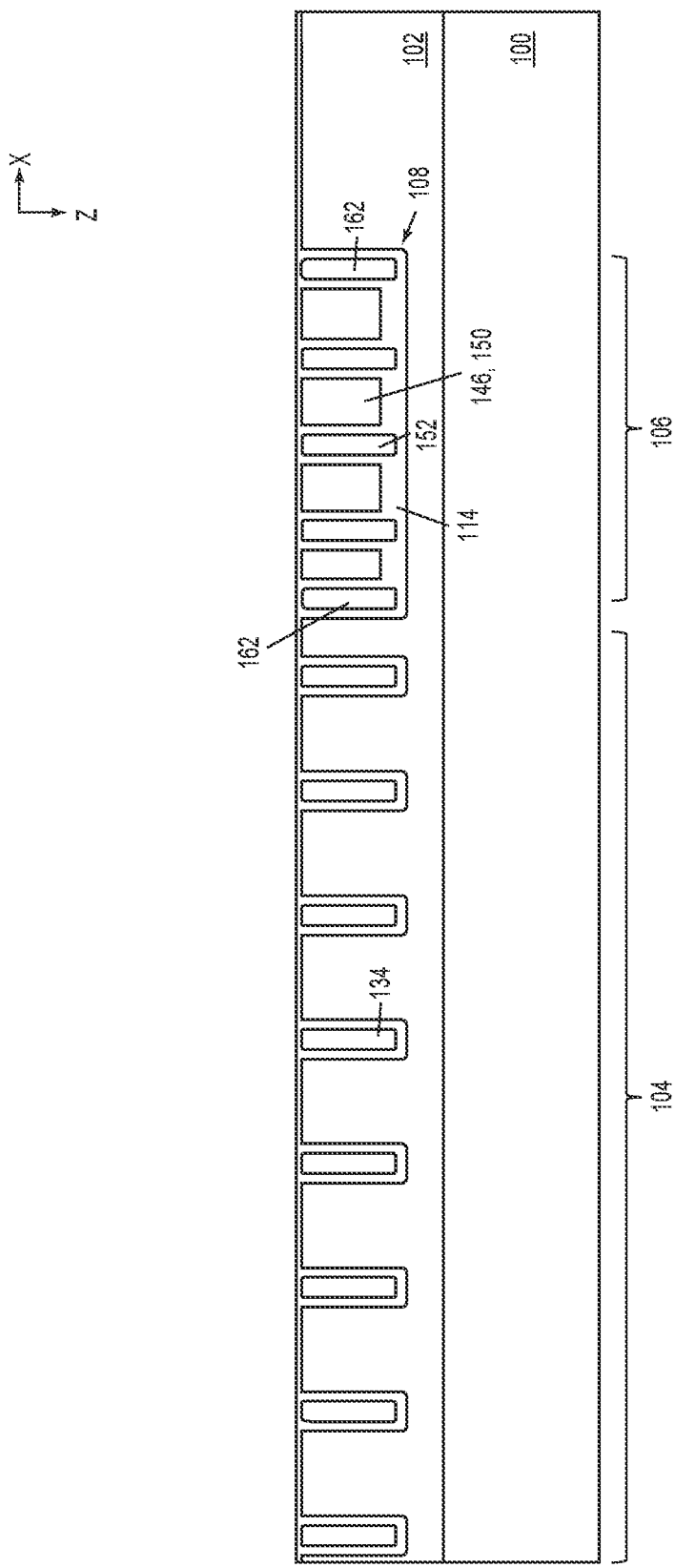
Figure 10C:
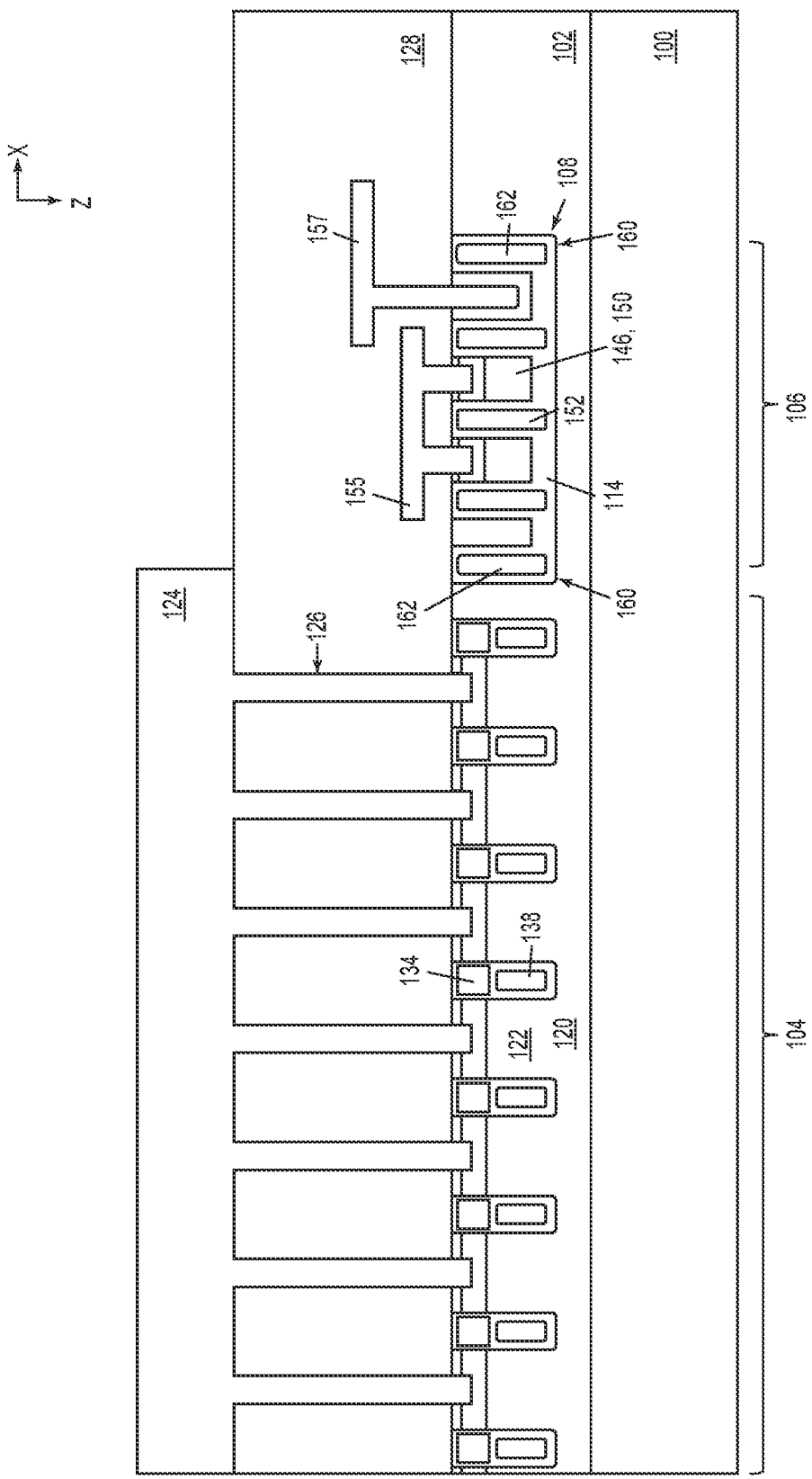

FIGS. 10A through 10C illustrate cross-sectional views of another embodiment of a method of producing a semiconductor device that includes the isolation structure 108.

FIG. 10A corresponds to FIG. 6G and the semiconductor substrate 100 may be processed according to FIGS. 6A through 6F, to arrive at the structure shown in FIG. 10A. In FIG. 10A, an oxide layer 214 such as a field oxide is formed on the epitaxial layer or layer stack 102 and along the bottom and sidewalls of the gate trenches 130. In the second region 106 of the epitaxial layer or layer stack 102, the oxide layer 214 connects the oxide islands 202 to form the dielectric material 114 of the isolation structure 108.

FIG. 10B shows the semiconductor substrate 100 after forming a single electrode 134, 152 in the gate trenches 130 formed in the epitaxial layer or layer stack 102. According to this embodiment, separate field plate electrodes are either omitted from the device or disposed in field plate trenches (not shown) which are separate from the gate trenches 130.

The outermost trench 160 that surrounds the other trenches 130 and laterally delimits the second region 106 of the epitaxial layer or layer stack 102 also includes a single electrode 162 or instead may be completely filled by oxide, e.g., as shown in FIG. 6L. Processing may continue as shown in FIGS. 6M through 6O, to produce the device shown in FIG. 10C.

FIGS. 11A through 11E illustrate cross-sectional views of another embodiment of a method of producing a semiconductor device that includes the isolation structure 108.

Figure 11A:
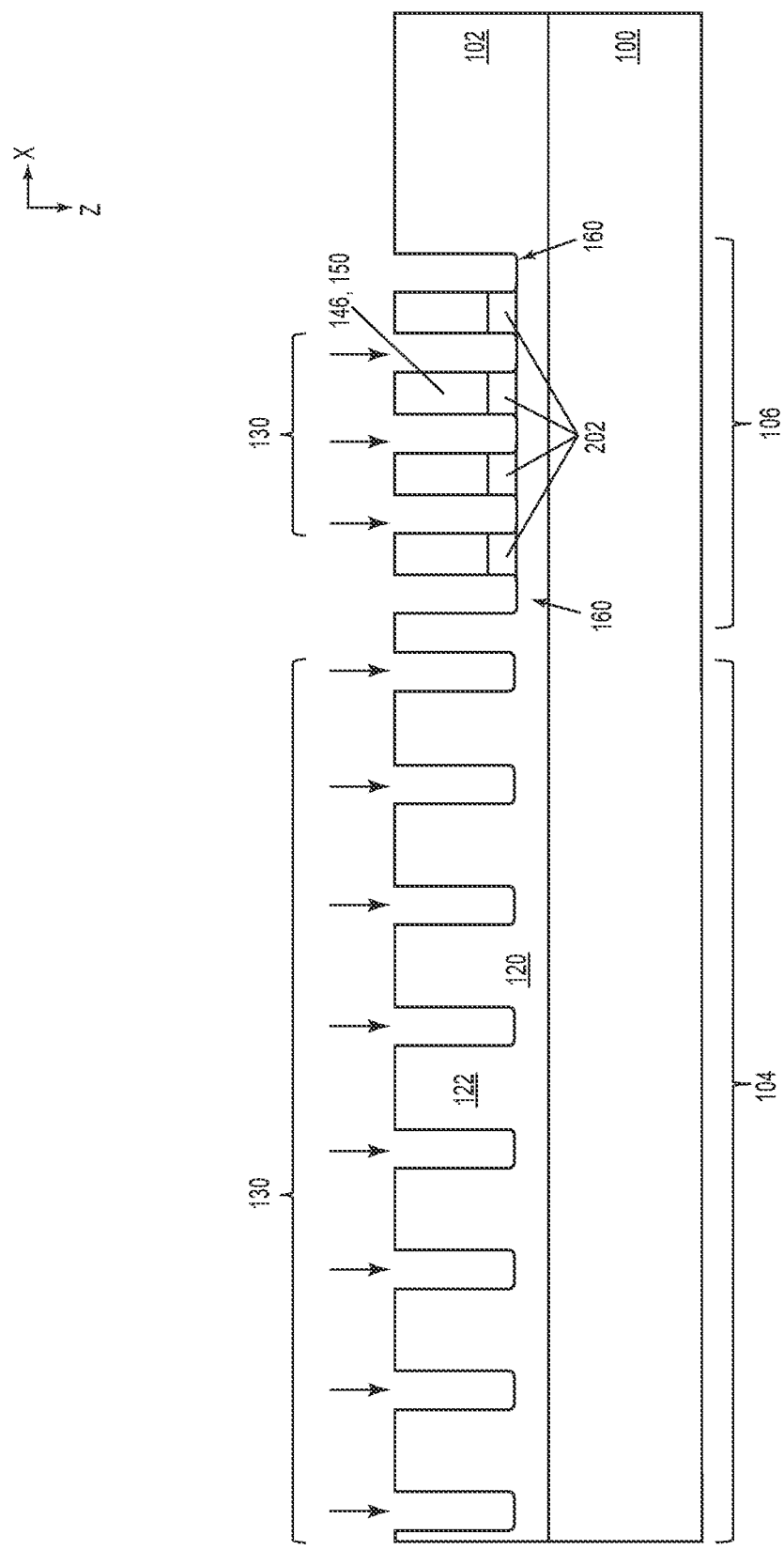
FIGS. 11A through 11E illustrate partial cross-sectional views of another embodiment of a method of producing a semiconductor device that includes the isolation structure.

FIG. 11A corresponds to FIG. 6F and the semiconductor substrate 100 may be processed according to FIGS. 6A through 6E, to arrive at the structure shown in FIG. 11A. In FIG. 11A, gate trenches 130 are etched into the first region 104 of the epitaxial layer or layer stack 102 via a common etching process by which the trenches 130 are also etched into the second region 104 of the epitaxial layer or layer stack 102. Backside alignment may be used to align the gate trenches 130 with respect to the oxide islands 202 in the second region 106 of the epitaxial layer or layer stack 102. In the second region 106 of the epitaxial layer or layer stack 102, a bottom part of the gate trenches 130 are laterally separated from one another by the oxide islands 202 and the outermost trench 160 surrounds the other trenches 130 and laterally delimits the second region 106 of the epitaxial layer or layer stack 102. The outermost trench 160 in the second region 106 of the epitaxial layer or layer stack 102 serves as an isolation trench, as previously explained herein.

Figure 11B:
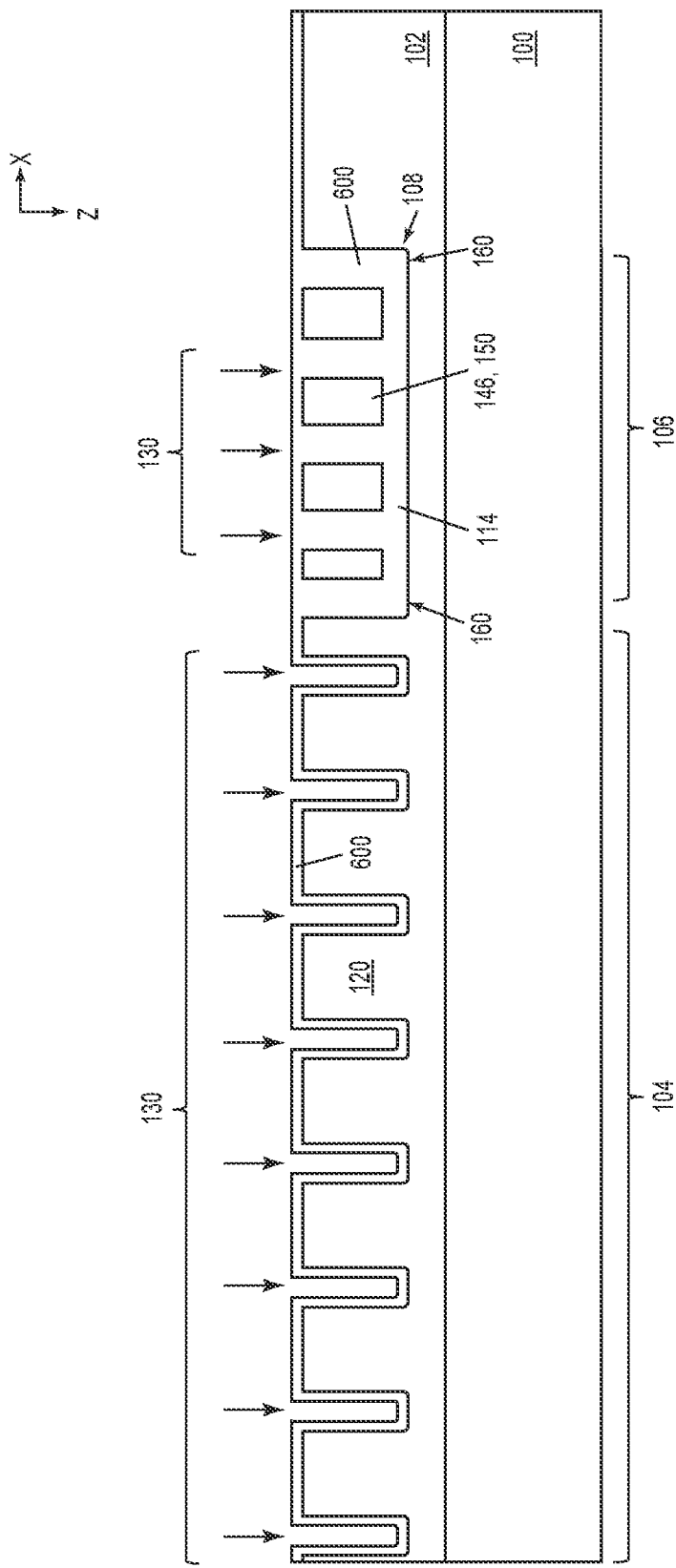

FIG. 11B shows the semiconductor substrate 100 after a field oxidation process during which the sidewalls and bottom of the gate trenches 130 are lined with a field oxide layer 600 in the first region 104 of the epitaxial layer or layer stack 102. The trenches 130, 160 in the second region 106 of the epitaxial layer or layer stack 102 may be etched narrow enough such that the field oxide completely fills these trenches 130, 160. In the second region 106 of the epitaxial layer or layer stack 102, the field oxide layer 600 connects the oxide islands 202 to form the dielectric material 114 of the isolation structure 108.

Figure 11C:
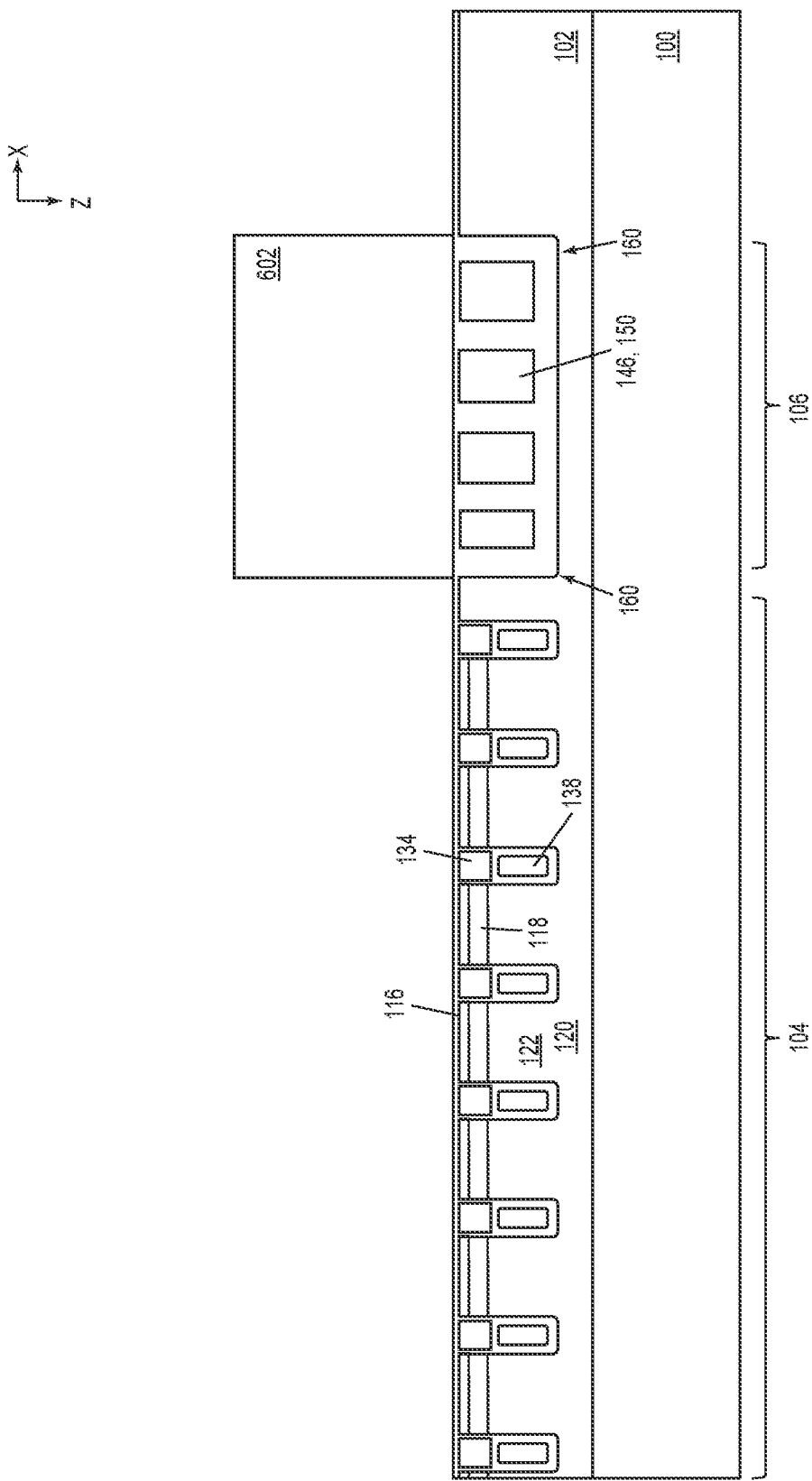

FIG. 11C shows the semiconductor substrate 100 after the processing shown in FIGS. 6I through 6M. Source regions 116 and body regions 118 of the opposite conductivity type are formed in semiconductor mesas 122 delimited by the gate trenches 130 in the first region 104 of the epitaxial layer or layer stack 102. If the device formed in the second region 106 of the epitaxial layer or layer stack 102 has the opposite channel as the device formed in the first region 104 of the epitaxial layer or layer stack 102, a mask 602 such as an oxide mask may be formed over the second region 106 to shield the second region 106 form the dopant implants applied to the first region 104.

Figure 11D:
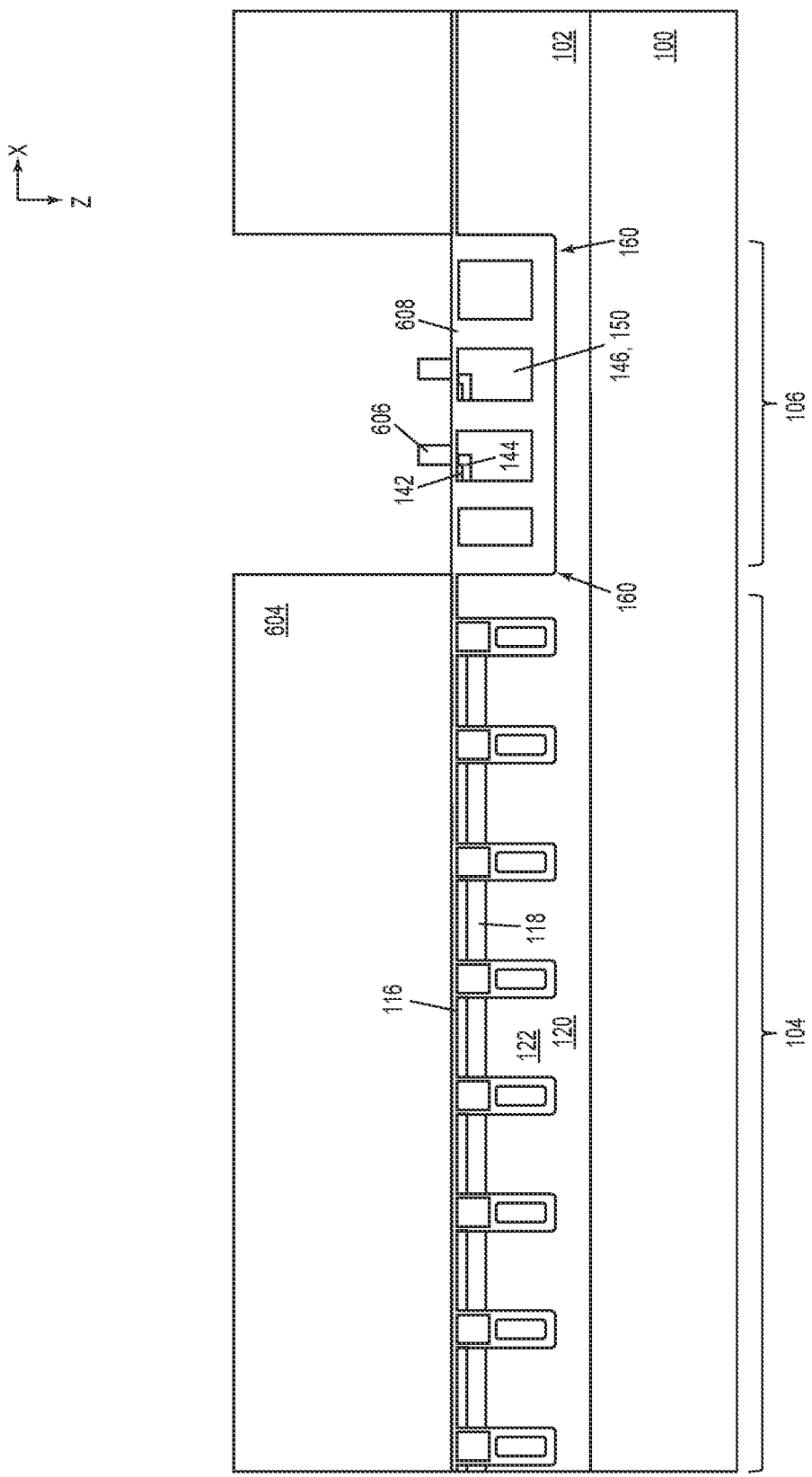

FIG. 11D shows the semiconductor substrate 100 after forming source regions 142 and body regions 144 of the opposite conductivity type in semiconductor mesas 150 delimited by the gate trenches 130 in the second region 106 of the epitaxial layer or layer stack 102. If the device formed in the second region 106 of the epitaxial layer or layer stack 102 has the opposite channel as the device formed in the first region 104 of the epitaxial layer or layer stack 102, a mask 604 such as an oxide mask may be formed over the first region 104 to shield the first region 104 form the dopant implants applied to the second region 106. If the devices formed in the first and second regions 104, 106 of the epitaxial layer or layer stack 102 have the same channel type (both n-channel or both p-channel), both regions 104, 106 may be concurrently implanted to form the respective source regions 116, 142 and respective body regions 118, 144.

Also, the device formed in the second region 106 of the epitaxial layer or layer stack 102 is a planar gate device in FIG. 11D instead of a trench gate device. Accordingly, gate electrodes 606 are formed above the epitaxial layer or layer stack 102 and electrically insulated from the epitaxial layer or layer stack 102 by a planar gate dielectric insulating material 608 formed on the front surface of the epitaxial layer or layer stack 102. Processing may continue as shown in FIG. 6O, to produce the device shown in FIG. 11E.

Figure 11E:
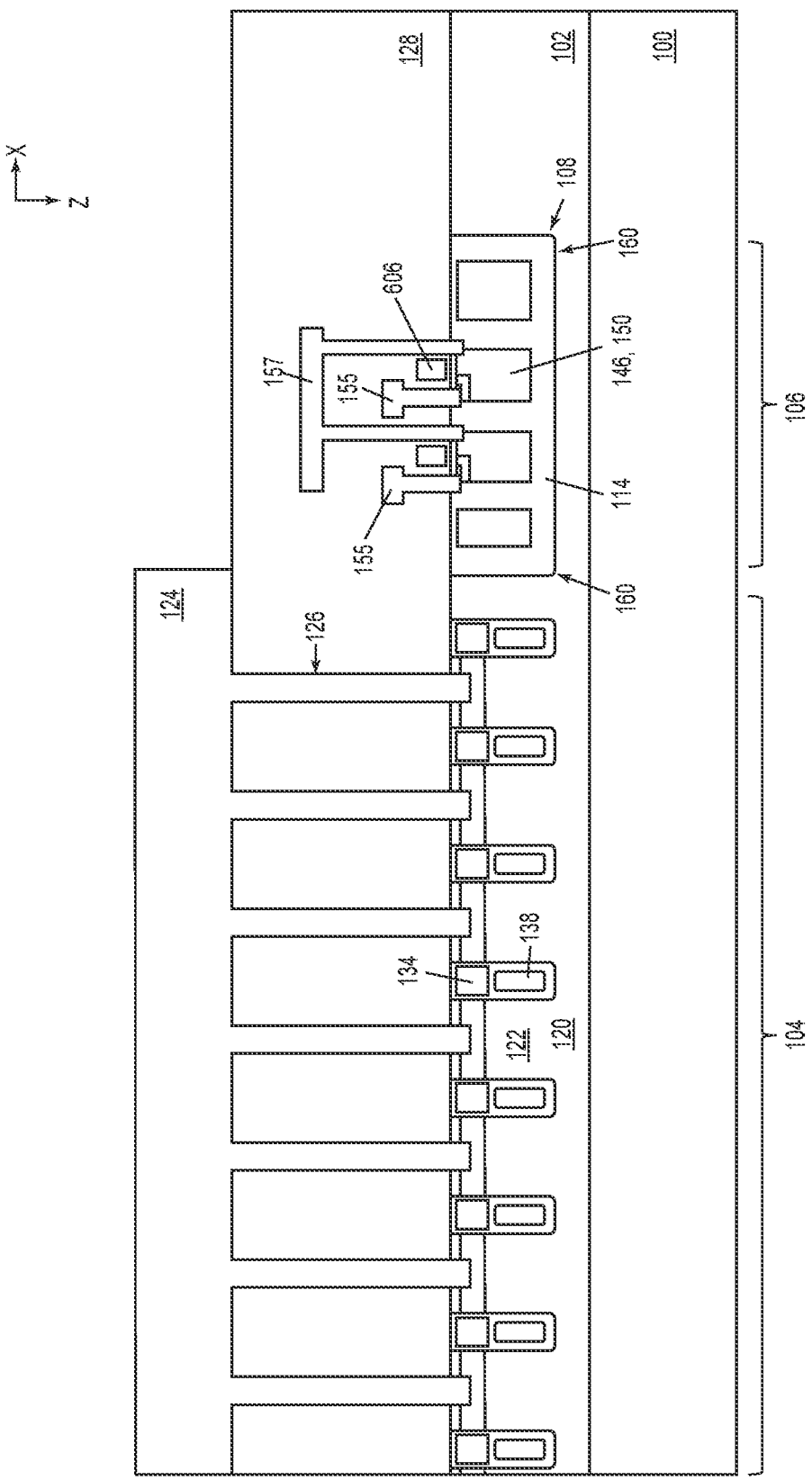

In FIG. 11E, the device formed in the first region 104 of the epitaxial layer or layer stack 102 is a trench gate device in that the gate electrodes 134 of the trench gate device are disposed in trenches 130 formed in the first region 104 of the epitaxial layer or layer stack 102. The trench gate device may have a different field plate configuration than what is shown in FIG. 11E, as previously explained herein. The device formed in the second region 106 of the epitaxial layer or layer stack 102 is a planar gate device, as explained above in connection with FIG. 11D.

Although the present disclosure is not so limited, the following numbered examples demonstrate one or more aspects of the disclosure.

Example 1. A semiconductor device, comprising: a semiconductor substrate; an epitaxial layer or layer stack on the semiconductor substrate; a plurality of transistor cells of a first type formed in a first region of the epitaxial layer or layer stack and electrically coupled in parallel to form a vertical power transistor; a plurality of transistor cells of a second type different than the first type and formed in a second region of the epitaxial layer or layer stack; and an isolation structure that laterally and vertically delimits the second region of the epitaxial layer or layer stack, wherein sidewalls and a bottom of the isolation structure comprise a dielectric material that electrically isolates the plurality of transistor cells of the second type from the plurality of transistor cells of the first type in the epitaxial layer or layer stack.

Example 2. The semiconductor device of example 1, wherein the first type of transistor cells are NMOS (n-channel metal-oxide-semiconductor) transistor cells, and wherein the second type of transistor cells are PMOS (p-channel metal-oxide-semiconductor) transistor cells.

Example 3. The semiconductor device of example 1, wherein the first type of transistor cells are n-channel transistor cells of a power transistor, and wherein the second type of transistor cells are n-channel transistor cells.

Example 4. The semiconductor device of any of examples 1 through 3, wherein the first type of transistor cells have a first average gate oxide thickness, wherein the second type of transistor cells have a second average gate oxide thickness, and wherein the first average gate oxide thickness is greater than the second average gate oxide thickness.

Example 5. The semiconductor device of any of examples 1 through 4, wherein the first type of transistor cells and the second type of transistor cells have a same average gate oxide thickness.

Example 6. The semiconductor device of any of examples 1 through 5, wherein the plurality of transistor cells of the second type forms all or part of a gate driver integrated circuit for the vertical power transistor.

Example 7. The semiconductor device of any of examples 1 through 6, wherein the plurality of transistor cells of the first type comprises first semiconductor mesas delimited by first gate trenches in the first region of the epitaxial layer or layer stack, and wherein the plurality of transistor cells of the second type comprises second semiconductor mesas delimited by second gate trenches in the second region of the epitaxial layer or layer stack.

Example 8. The semiconductor device of example 7, wherein a main current flow path of the plurality of transistor cells of the second type includes a vertical component along the second gate trenches to a drift region of the second semiconductor mesas, and a lateral component along the drift region to a drain region in the second region of the epitaxial layer or layer stack.

Example 9. The semiconductor device of any of examples 1 through 8, wherein the semiconductor substrate forms a drain or a collector of the vertical power transistor, and wherein the dielectric material of the isolation structure electrically isolates the plurality of transistor cells of the second type from the drain or collector of the vertical power transistor.

Example 10. A method of producing a semiconductor device, the method comprising: growing an epitaxial layer or layer stack on a semiconductor substrate; forming a plurality of transistor cells of a first type in a first region of the epitaxial layer or layer stack and electrically coupled in parallel to form a vertical power transistor; forming a plurality of transistor cells of a second type different than the first type in a second region of the epitaxial layer or layer stack; and forming an isolation structure that laterally and vertically delimits the second region of the epitaxial layer or layer stack, wherein sidewalls and a bottom of the isolation structure comprise a dielectric material that electrically isolates the plurality of transistor cells of the second type from the plurality of transistor cells of the first type in the epitaxial layer or layer stack.

Example 11. The method of example 10, wherein forming the isolation structure comprises: forming oxide islands in a first epitaxial layer of the epitaxial layer or layer stack or in the semiconductor substrate; after covering the oxide islands by epitaxial overgrowth and completing the epitaxial layer or layer stack, etching a plurality of trenches into the second region of the epitaxial layer or layer stack such that a bottom part of the trenches are laterally separated from one another by the oxide islands, wherein an outermost trench of the plurality of trenches surrounds the other trenches and laterally delimits the second region of the epitaxial layer or layer stack; and forming an oxide layer on sidewalls and a bottom of the trenches such that the oxide layer connects the oxide islands.

Example 12. The method of example 11, wherein the outermost trench is completely filled by the oxide layer.

Example 13. The method of example 11, wherein a central part of the outermost trench is devoid of the oxide layer, and wherein forming the isolation structure comprises: forming an electrode in the central part of the outermost trench, the electrode being separated from the epitaxial layer or layer stack by the oxide layer and the oxide islands.

Example 14. The method of any of examples 11 through 13, wherein forming the plurality of transistor cells of the second type in the second region of the epitaxial layer or layer stack comprises: forming doped transistor regions in semiconductor mesas delimited by the trenches.

Example 15. The method of any of examples 11 through 14, wherein forming the plurality of transistor cells of the second type in the second region of the epitaxial layer or layer stack comprises: forming a gate electrode in the trenches surrounded by the outermost trench.

Example 16. The method of example 15, wherein forming the plurality of transistor cells of the second type in the second region of the epitaxial layer or layer stack comprises: forming a field electrode below the gate electrode in the trenches surrounded by the outermost trench.

Example 17. The method of any of examples 11 through 16, wherein forming the plurality of transistor cells of the first type in the first region of the epitaxial layer or layer stack comprises: etching a plurality of gate trenches into the first region of the epitaxial layer or layer stack via a common etching process by which the plurality of trenches are etched into the second region of the epitaxial layer or layer stack.

Example 18. The method of any of examples 11 through 17, further comprising: after covering the oxide islands by the epitaxial overgrowth but before etching the plurality of trenches, planarizing the epitaxial overgrowth; forming a mask on the planarized epitaxial overgrowth, the mask having an opening that exposes an area of the planarized epitaxial overgrowth vertically aligned with the oxide islands; and implanting dopant atoms into the planarized epitaxial overgrowth through the opening in the mask to form a doped buried layer above the oxide islands.

Example 19. The method of any of examples 10 through 18, further comprising: increasing a doping concentration in the second region of the epitaxial layer or layer stack, in a first area of the second region that adjoins the dielectric material at the bottom of the isolation structure.

Example 20. The method of example 19, further comprising: increasing a doping concentration in the second region of the epitaxial layer or layer stack, in a second area of the second region interposed between the first area of the second region and a contact that is recessed into the second region of the epitaxial layer or layer stack between the outermost trench and an end of the trenches surrounded by the outermost trench.

Example 21. The method of example 20, further comprising: forming a contact n the second region of the epitaxial layer or layer stack and that extends to the second area of the second region in an area between the outermost trench and an end of the trenches surrounded by the outermost trench.

Example 22. The method of example 10, wherein forming the isolation structure comprises: etching a plurality of trenches into the second region of the epitaxial layer or layer stack, wherein the trenches delimit doped semiconductor mesas in the second region of the epitaxial layer or layer stack, wherein an outermost trench of the plurality of trenches surrounds the other trenches and laterally delimits the second region of the epitaxial layer or layer stack; extending a depth of the plurality of trenches further into the second region of the epitaxial layer or layer stack; forming a contiguous region of oxidized semiconductor material along a bottom part of the trenches in an area where the depth of the plurality of trenches was extended; and forming an oxide layer on sidewalls of the trenches and that connects to the contiguous region of oxidized semiconductor material.

Example 23. The method of example 22, wherein the outermost trench is completely filled by the oxide layer.

Example 24. The method of example 22, wherein a central part of the outermost trench is devoid of the oxide layer, and wherein forming the isolation structure comprises: forming an electrode in the central part of the outermost trench, the electrode being separated from the epitaxial layer or layer stack by the oxide layer and the contiguous region of oxidized semiconductor material.

Example 25. The method of any of example 10, wherein forming the isolation structure comprises: forming a mask on the epitaxial layer or layer stack, the mask covering the first region of the epitaxial layer or layer stack and having an opening that exposes the second region of the epitaxial layer or layer stack; implanting oxygen atoms into the second region of the epitaxial layer or layer stack through the opening in the mask to form a buried oxide layer in the second region of the epitaxial layer or layer stack; etching a plurality of trenches into the second region of the epitaxial layer or layer stack, wherein an outermost trench of the plurality of trenches surrounds the other trenches and laterally delimits the second region of the epitaxial layer or layer stack; and forming an oxide layer on sidewalls of the trenches and that connects to the buried oxide layer.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a semiconductor device, the method comprising:
    growing an epitaxial layer or layer stack on a semiconductor substrate;
    forming a plurality of transistor cells of a first type in a first region of the epitaxial layer or layer stack and electrically coupled in parallel to form a vertical power transistor;
    forming a plurality of transistor cells of a second type different than the first type in a second region of the epitaxial layer or layer stack; and
    forming an isolation structure that laterally and vertically delimits the second region of the epitaxial layer or layer stack,
    wherein sidewalls and a bottom of the isolation structure comprise a dielectric material that electrically isolates the plurality of transistor cells of the second type from the plurality of transistor cells of the first type in the epitaxial layer or layer stack.

2. The method of claim 1, wherein forming the isolation structure comprises:
    forming oxide islands in a first epitaxial layer of the epitaxial layer or layer stack or in the semiconductor substrate;
    after covering the oxide islands by epitaxial overgrowth and completing the epitaxial layer or layer stack, etching a plurality of trenches into the second region of the epitaxial layer or layer stack such that a bottom part of the trenches are laterally separated from one another by the oxide islands, wherein an outermost trench of the plurality of trenches surrounds the other trenches and laterally delimits the second region of the epitaxial layer or layer stack; and
    forming an oxide layer on sidewalls and a bottom of the trenches such that the oxide layer connects the oxide islands.

3. The method of claim 2, wherein the outermost trench is completely filled by the oxide layer.

4. The method of claim 2, wherein a central part of the outermost trench is devoid of the oxide layer, and wherein forming the isolation structure comprises:
    forming an electrode in the central part of the outermost trench, the electrode being separated from the epitaxial layer or layer stack by the oxide layer and the oxide islands.

5. The method of claim 2, wherein forming the plurality of transistor cells of the second type in the second region of the epitaxial layer or layer stack comprises:
    forming doped transistor regions in semiconductor mesas delimited by the trenches.

6. The method of claim 2, wherein forming the plurality of transistor cells of the second type in the second region of the epitaxial layer or layer stack comprises:
    forming a gate electrode in the trenches surrounded by the outermost trench.

7. The method of claim 6, wherein forming the plurality of transistor cells of the second type in the second region of the epitaxial layer or layer stack comprises:
    forming a field electrode below the gate electrode in the trenches surrounded by the outermost trench.

8. The method of claim 2, wherein forming the plurality of transistor cells of the first type in the first region of the epitaxial layer or layer stack comprises:
    etching a plurality of gate trenches into the first region of the epitaxial layer or layer stack via a common etching process by which the plurality of trenches are etched into the second region of the epitaxial layer or layer stack.

9. The method of claim 2, further comprising:
    after covering the oxide islands by the epitaxial overgrowth but before etching the plurality of trenches, planarizing the epitaxial overgrowth;
    forming a mask on the planarized epitaxial overgrowth, the mask having an opening that exposes an area of the planarized epitaxial overgrowth vertically aligned with the oxide islands; and
    implanting dopant atoms into the planarized epitaxial overgrowth through the opening in the mask to form a doped buried layer above the oxide islands.

10. The method of claim 1, further comprising:
    increasing a doping concentration in the second region of the epitaxial layer or layer stack, in a first area of the second region that adjoins the dielectric material at the bottom of the isolation structure.

11. The method of claim 10, further comprising:
    increasing a doping concentration in the second region of the epitaxial layer or layer stack, in a second area of the second region interposed between the first area of the second region and a contact that is recessed into the second region of the epitaxial layer or layer stack between the outermost trench and an end of the trenches surrounded by the outermost trench.

12. The method of claim 11, further comprising:
    forming a contact in the second region of the epitaxial layer or layer stack and that extends to the second area of the second region in an area between the outermost trench and an end of the trenches surrounded by the outermost trench.

13. The method of claim 1, wherein forming the isolation structure comprises:
   etching a plurality of trenches into the second region of the epitaxial layer or layer stack, wherein the trenches delimit doped semiconductor mesas in the second region of the epitaxial layer or layer stack, wherein an outermost trench of the plurality of trenches surrounds the other trenches and laterally delimits the second region of the epitaxial layer or layer stack;
   extending a depth of the plurality of trenches further into the second region of the epitaxial layer or layer stack;
   forming a contiguous region of oxidized semiconductor material along a bottom part of the trenches in an area where the depth of the plurality of trenches was extended; and
   forming an oxide layer on sidewalls of the trenches and that connects to the contiguous region of oxidized semiconductor material.

14. The method of claim 13, wherein the outermost trench is completely filled by the oxide layer.

15. The method of claim 13, wherein a central part of the outermost trench is devoid of the oxide layer, and wherein forming the isolation structure comprises:
   forming an electrode in the central part of the outermost trench, the electrode being separated from the epitaxial layer or layer stack by the oxide layer and the contiguous region of oxidized semiconductor material.

16. The method of claim 1, wherein forming the isolation structure comprises:
   forming a mask on the epitaxial layer or layer stack, the mask covering the first region of the epitaxial layer or layer stack and having an opening that exposes the second region of the epitaxial layer or layer stack;
   implanting oxygen atoms into the second region of the epitaxial layer or layer stack through the opening in the mask to form a buried oxide layer in the second region of the epitaxial layer or layer stack;
   etching a plurality of trenches into the second region of the epitaxial layer or layer stack, wherein an outermost trench of the plurality of trenches surrounds the other trenches and laterally delimits the second region of the epitaxial layer or layer stack; and
   forming an oxide layer on sidewalls of the trenches and that connects to the buried oxide layer.

* * * * *